United States Patent [19]
Asai et al.

[11] Patent Number: 6,047,874
[45] Date of Patent: Apr. 11, 2000

[54] METHOD AND SYSTEM FOR SUPPLYING CIRCUIT COMPONENTS

[75] Inventors: Koichi Asai, Nagoya; Shinsuke Suhara, Kariya, both of Japan

[73] Assignee: Fuji Machine Mfg. Co., Ltd., Chiryu, Japan

[21] Appl. No.: 09/099,460

[22] Filed: Jun. 18, 1998

[30] Foreign Application Priority Data

Jul. 9, 1997 [JP] Japan ..................... 9-183375

[51] Int. Cl.⁷ ............. B65H 20/24; B23P 19/00; G03B 1/42
[52] U.S. Cl. ............. 226/110; 29/740; 242/594.2; 242/615.21
[58] Field of Search ............. 226/4, 110; 242/550, 242/560, 594.2, 594.3, 615.21; 414/403; 29/739, 740, 741

[56] References Cited

U.S. PATENT DOCUMENTS

| | | | |
|---|---|---|---|
| 4,612,700 | 9/1986 | Loomis et al. | 29/741 X |
| 5,035,047 | 7/1991 | Harigane et al. | 29/740 |
| 5,299,902 | 4/1994 | Fujiwara et al. | 29/740 X |
| 5,315,461 | 5/1994 | Todd | 242/615.21 X |
| 5,456,001 | 10/1995 | Mori et al. | 29/739 |
| 5,658,122 | 8/1997 | Ohashi et al. | |
| 5,873,691 | 2/1999 | Asai et al. | 29/740 X |
| 5,926,950 | 7/1999 | Asai et al. | 29/740 X |
| 5,933,942 | 8/1999 | Kitamura et al. | 29/740 |

FOREIGN PATENT DOCUMENTS

| | | |
|---|---|---|
| 5-38641 | 2/1993 | Japan . |
| 7-101487 | 4/1995 | Japan . |

*Primary Examiner*—Michael R. Mansen
*Attorney, Agent, or Firm*—Oliff & Berridge, PLC

[57] ABSTRACT

A system is provided for supplying circuit components, including tape holding devices which hold carrier tapes, respectively. Each of the tape holding devices carries circuit components at a predetermined pitch in a lengthwise direction thereof. Tape feeding devices each of which includes a component-supply portion and each of which draws a corresponding one of the carrier tapes from a corresponding one of the tape holding devices, feeds the one carrier tape at the same pitch as the predetermined pitch, and supplies each of the circuit components of the one carrier tape from the component-supply portion thereof. A first support member which supports the tape feeding devices such that the respective component-supply portions thereof, are located along a reference line. A second support member which is separate from the first support member supports the tape holding devices such that the each tape feeding device can draw the one carrier tape from the one tape holding device. A first-support-member moving device moves and stops the first support member along the reference line, independent of the second support member. Thereby, each of the respective component-supply portions of the tape feeding devices supported by the first support member are positioned at a predetermined component supplying position where a circuit component, is supplied from the each component-supply portion.

28 Claims, 24 Drawing Sheets

METHOD AND SYSTEM FOR SUPPLYING CIRCUIT COMPONENTS

BACKGROUND OF THE INVENTION

1. Field of the Invention

The present invention relates to a method and a system for supplying circuit components, such as electric-circuit or electronic-circuit components, and particularly to the art of improving the efficiency and/or accuracy of supplying of circuit components.

2. Related Art Statement

Japanese Patent Application laid open for inspection purposes under Publication No. 7(1995)-101487 discloses a circuit-component ("CC") supplying system which supplies a CC carrier tape which carries many CCs. The disclosed system includes a plurality of CC feeders each of which includes an elongate main body and a reel holder which is provided at one of lengthwise opposite end portions of the main body and holds a tape reel around which a CC carrier tape is wound such that the tape reel is rotatable about an axis line parallel to a widthwise direction of the main body. Each CC feeder further includes a tape feeding device which is provided at the other end portion of the main body and feeds the carrier tape at a regular pitch which is equal to a regular distance at which the CCs are arranged on the tape so that the leading one of the CCs carried on the carrier tape is moved to a CC-supply portion of the main body. The CC feeders are attached to a support table such that the respective CC-supply portions thereof are arranged along a straight line, and the support table is moved in a direction parallel to the straight line so that each of the respective CC-supply portions of the CC feeders can selectively be positioned at a CC supplying position.

The above CC supplying system can supply many sorts of CCs to a CC mounting device, such as one which includes an intermittently rotatable body which is intermittently rotatable about a vertical axis line at a first regular angular pitch, and a plurality of CC holding heads which are provided on the rotatable body such that the CC holding heads are angularly spaced from each other at a second regular angular pitch equal to the first angular pitch, or one which includes at least one CC holding head and is movable, in a horizontal plane, in a direction perpendicular to the direction of movement of the support table.

However, in the above CC supplying system, when the support table is moved and stopped to position the CC-supply portion of each CC feeder at the CC supplying position, the tape feeding device, the reel holder, and the tape reel of the each CC feeder are moved as well. That is, the total mass of the movable elements is great. Therefore, if the acceleration and deceleration at which the CC-supply portions are moved are increased to decrease the time needed for each CC-supply portion to be positioned at the CC supplying position, i.e., time needed for the each CC-supply portion to be moved to, and stopped at, the CC supplying position, the each CC-supply portion will vibrate, which results in lowering the accuracy of positioning thereof and the accuracy of supplying of CCs. If the acceleration and deceleration are decreased, the vibration will be decreased. In the latter case, however, the time needed for positioning each CC-supply portion will be increased, which results in lowering the efficiency of supplying of CCs. In particular, since recently there has been a tendency toward using large-diameter tape reels for reducing the number of replacing of tape reels per unit time and therefore the mass of each tape reel is great, it is difficult to improve the efficiency of supplying of the CCs and/or the accuracy of positioning of the CC-supply portions. When the CCs have been consumed on each CC feeder, the current CC supplying operation of the CC supplying system must be interrupted to replace the CC feeder having the consumed tape reel with a new CC feeder. This leads to lowering the efficiency of supplying of CCs. In order to minimize the lowering of the efficiency, the large-diameter tape reels are employed to maximize the number of CCs that are held by each CC feeder and minimize the number of replacing of feeders. Hence, there occurs the problem that the total mass of the movable elements is great.

In addition, if the width of the reel holder of each CC feeder is greater than that of the main body thereof including the tape feeding device, the width of the each CC feeder depends on the width of the reel holder thereof and, even if the width of the main body may be small, the width of the each CC feeder may be great. Accordingly, the support table for supporting the CC feeders needs a great dimension, which leads to increasing the total mass of the movable elements and thereby lowering the accuracy and efficiency of supplying of CCs.

In the above case, the distance between the respective CC-supply portions of each pair of adjacent CC feeders is great. If each CC-supply portion is moved at increased acceleration and deceleration to be positioned at the CC supplying position in a reduced time, the accuracy of supplying of CCs are lowered; on the other hand, if each CC-supply portion is moved at decreased acceleration and deceleration to prevent the lowering of the accuracy of supplying of CCs, the efficiency of supplying of CCs is lowered.

When the CCs have consumed on each CC feeder, new CCs must be supplied. To this end, the current movement of the support table must be stopped for replacing the each CC feeder with a new CC feeder, or the tape reel thereof with a new tape reel. Since the supplying of CCs is interrupted, the efficiency of supplying of CCs is lowered.

Since the tape reels are formed of a soft material such as paper or plastics and accordingly the dimensions thereof include some deviations, there may be left a small space between each tape reel and the reel holder of each CC feeder. Hence, if the each CC feeder vibrates when the support table is moved, the each tape reel will collide with the reel holder, which leads to generating noise.

SUMMARY OF THE INVENTION

It is therefore an object of the present invention to provide a circuit-component supplying method which enjoys the improved efficiency and/or accuracy of supplying of circuit components.

It is another object of the present invention to provide a circuit-component supplying system which enjoys the improved efficiency and/or accuracy of supplying of circuit components.

The present invention provides a circuit-component supplying method and a circuit-component supplying system which have one or more of the technical features which are described below in respective paragraphs given parenthesized sequential numbers (1) to (24). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a method of supplying a plurality of circuit components from a plurality of circuit-component supplying units each of which includes (A) a tape holding device which holds a carrier tape which carries a plurality of circuit components at a predetermined pitch in a lengthwise direction thereof and (B) a tape feeding device which is separate from the tape holding device and which draws the carrier tape from the tape holding device, feeds the tape at the same pitch as the predetermined pitch, and supplies each of the circuit components of the tape from a component-supply portion thereof, the supplying units being arranged such that the respective component-supply portions of the tape feeding devices thereof are located along a reference line, the method comprising the step of moving and stopping a group of the tape feeding devices along the reference line, independent of a group of the tape holding devices, thereby positioning each of the respective component-supply portions of the tape feeding devices at a predetermined component supplying position where at least one circuit component is supplied from the each component-supply portion. In the present method, since the group of tape feeding devices is moved and stopped independent of the group of tape holding devices, it is only the group of tape feeding devices that needs to be moved and stopped quickly. Accordingly, the mass to be accelerated and decelerated abruptly is small. Therefore, in the case where it is not required to reduce the vibration produced when each of the component-supply portions is positioned in the present method, as compared with that produced in a conventional method, it is possible to increase the acceleration and deceleration at which each component-supply portion is moved and stopped, and thereby reduce the time needed to position the each component-supply portion. Thus, the efficiency of supplying of circuit components ("CCs") can be improved without lowering the accuracy of supplying of the same. Alternatively, in the case where it is not required to improve the efficiency of supplying of CCs as compared with that of a conventional method, it is possible to reduce the vibration, without increasing the acceleration and deceleration of each component-supply portion. In this case, the CC-supply accuracy can be improved without lowering the CC-supply efficiency. Meanwhile, the group of tape holding devices may be kept still or otherwise may be moved. In the latter case, the acceleration and deceleration of the group of tape holding devices may be lower than those of the group of tape feeding devices. Therefore, the present method is free from the problem that the vibration produced is great, or the problem that the time needed to position each component-supply portion is long, as compared with the case where the group of tape holding devices is accelerated and decelerated abruptly with the group of tape feeding devices. Thus, even in the case where the group of tape holding devices is moved, the CC-supply efficiency or accuracy is improved. In the case where the width of each tape feeding device is smaller than that of each tape holding device, the time needed to position each tape feeding device can be reduced without increasing the acceleration and deceleration thereof. Thus, the CC-supply efficiency is still improved. In addition, the length or dimension of the group of tape feeding devices in the direction in which the respective component-supply portions thereof are arranged, can be reduced, which leads to reducing the size of a support member which supports the group of tape feeding devices. Thus, the mass to be moved and stopped is reduced, which leads to improving the CC-supply efficiency or accuracy. Meanwhile, regarding a CC supplying system wherein a plurality of integral units each of which includes a tape feeding device and a tape holding device (e.g., the reel holder provided on the main member of each of the above-described conventional CC feeders) are moved and stopped abruptly, it has been proposed to employ a plurality of support tables which support a plurality of groups of the integral units, respectively, and move each one support table independent of the other table or tables. In this case, too, the mass to be moved and stopped at one time can be reduced and accordingly the CC-supply efficiency can be improved. In contrast, the present method can reduce the mass to be moved and stopped, without needing the plurality of support tables. That is, the present method can improve the CC-supply efficiency or accuracy, without having to complicate the construction of the CC supplying system. However, the present method may be applied, with a considerable advantage, to those cases where a plurality of support tables are employed to support a plurality of groups of CC supplying units, respectively, and each one support table is moved independent of the other table or tables to supply CCs.

(2) According to a second feature of the present invention which includes the first feature (1), the supplying method further comprises a step of keeping the group of tape holding devices still while the group of tape feeding devices is moved and stopped along the reference line. In the present method, since only the group of tape feeding devices are moved, the CC-supply efficiency or accuracy can be improved very much. In the case where the width of each tape feeding device is smaller than that of each tape holding device, a support member which supports the group of tape feeding devices can have a small length or dimension, and only the support member supporting the group of tape feeding devices is moved and stopped. Thus, the present method needs a small space for the group of tape feeding devices to be moved and stopped, as compared with the case where the width of each tape feeding device is equal to, or greater than, that of each tape holding device. This leads to reducing the overall space needed for carrying out the present method, thereby increasing the degree of freedom of designing of the peripheral devices of the CC supplying units. Moreover, since the group of tape holding devices is kept still, an operator can supply one or more new CC carrier tapes to one or more tape holding devices, even during the CC supplying operation. That is, new tapes can be supplied to the tape holding devices, without stopping the tape feeding devices. Thus, new tapes can be supplied without lowering the CC-supply efficiency. In addition, in the case where each tape holding device is of a type which holds a tape reel around which a CC carrier tape is wound, if the group of tape holding devices is kept still, the each tape holding device is free from the problem that the constituent elements thereof collide with the tape reel and thereby produce noise.

(3) According to a third feature of the present invention which includes the first or second feature (1) or (2), the supplying method further comprises a step of moving the group of tape holding devices at an acceleration and a deceleration lower than an acceleration and a deceleration at which the group of tape feeding devices is moved and stopped along the reference line. Since the group of tape feeding devices must be kept stopped while the CCs are taken out therefrom, those devices must be moved and stopped at high acceleration and deceleration. On the other hand, since the group of tape holding devices do not have to be kept still irrespective of whether the CCs are being taken out, those devices may be moved and stopped at lower acceleration and deceleration than those of the group of tape feeding devices. For example, in the case where each CC supplying unit supplies one CC at one time, the group of tape feeding devices is intermittently moved, i.e., is periodically moved and stopped, whereas the group of tape holding devices may be continuously moved at a constant speed. In this case, the acceleration and deceleration of the group of tape holding devices are zero. Alternatively, the group of tape holding device may be moved according to a velocity pattern or map which is more moderate or flatter than that according to which the group of tape feeding devices is moved. In either case, no such vibration as produced when the group of tape holding device is moved abruptly together with the group of tape feeding devices is produced, which contributes to improving the CC-supply efficiency and/or accuracy. In the case where the present method is not required to improve the conventional CC-supply accuracy, it is possible to increase the number of CCs held by each tape holding device. This leads to reducing the number of operator's supplying of new CC carrier tapes, thereby improving the conventional CC-supply efficiency. In the case where the group of tape holding devices is moved such that the amount of change of the relative position between each tape feeding device and a corresponding tape holding device is as small as possible, the amount of change of the length of a transferring portion of each carrier tape from a corresponding tape holding device to a corresponding tape feeding device can be made as small as possible.

It is noted that each of the first to third features (1) to (3) described above regarding the CC supplying method of the present invention may include one or more of the fourth to twenty-fourth features (4) to (24) described below regarding the CC supplying system of the present invention.

(4) According to a fourth feature of the present invention, there is provided a system for supplying a plurality of circuit components, comprising a plurality of tape holding devices which hold a plurality of carrier tapes, respectively, each of which carries a plurality of circuit components at a predetermined pitch in a lengthwise direction thereof; a plurality of tape feeding devices each of which includes a component-supply portion and each of which draws a corresponding one of the carrier tapes from a corresponding one of the tape holding devices, feeds the one carrier tape at a same pitch as the predetermined pitch, and supplies each of the circuit components of the one carrier tape from the component-supply portion thereof; a first support member which supports the tape feeding devices such that the respective component-supply portions thereof are located along a reference line; a second support member which is separate from the first support member and which supports the tape holding devices such that the each tape feeding device can draw the one carrier tape from the one tape holding device; and a first-support-member moving device which moves and stops the first support member along the reference line, independent of the second support member, thereby positioning each of the respective component-supply portions of the tape feeding devices supported by the first support member, at a predetermined component supplying position where at least one circuit component is supplied from the each component-supply portion. Each carrier tape may be one which includes (a) a CC accommodating tape having a number of CC accommodating pockets at a regular pitch in a lengthwise direction thereof (each CC accommodating pocket accommodates one CC therein) and (b) a cover tape covering or closing respective openings of the CC accommodating pockets; or one which includes a pair of elongate holding portions which cooperate with each other to hold CCs each having one or more lead wires, such that the holding portions hold the one or more lead wires of each CC. The reference line may be a straight line, a full-circular line, a part-circular (i.e., arcuate) line, a curved line other than the full- or part-circular line, or a combination of two or more of those lines. Each tape holding device may be one which includes at least one reel support member, such as a plurality of support rollers, or a single support shaft, which supports a tape reel around which a carrier tape is wound such that the tape reel is rotatable; or one which includes a holder-case support member to which a holder case which holds a carrier tape and allows the tape to be drawn out of the case in the lengthwise direction of the tape is detachably attached. Each tape holding device may be one which is provided as an integral portion of the second support member, as will be described by reference to the preferred embodiments, or one which is independent of the second support member and is detachably attached to the same, like each tape feeding device as employed in the preferred embodiments. In either case, the respective widths of the tape holding devices may be equal to each other, or may be different from each other to comply with the different widths of the carrier tapes held thereby. Even in the case where the respective widths of all the tape holding devices are equal to each other, each tape holding device can hold a plurality of sorts of carrier tapes having different widths, if the each tape holding device is adapted to the sort of carrier tape having the greatest width. In the case where the tape holding devices are ones which are detachably attachable to the second support member, those tape holding devices may be attached to the second support member at a regular pitch, or at an irregular pitch. In the former case, if the respective widths of all the tape holding devices are equal to each other, the holding devices may be attached at a regular pitch slightly greater than the width of each holding device. If the width of each holding device is so determined as to correspond to the respective widths of different sorts of carrier tape held thereby, the holding devices may be attached at a regular pitch slightly greater than the greatest width of the respective widths of all the sorts of carrier tape held thereby. In the latter case, it is preferred that the second support member support the tape holding devices having the different widths such that the holding devices are arranged as close as possible to each other in an arbitrary order. In the last case, the second support member must be one which can support the tape holding devices which are arranged as close as possible to each other in an arbitrary order, and which is provided with a plurality of tape-holding-device holding devices which hold the tape holding devices, respectively, such that the tape holding devices are arranged as close as possible to each other in an arbitrary order and with a plurality of positioning devices which position the tape holding devices, respectively, in the direction in which the first and second support members are arranged, i.e., the direction perpendicular to the direction in which the tape holding devices are arranged in the arbitrary order. The present CC supplying system can improve the CC-supply efficiency without lowering the CC-supply accuracy, or can improve the CC-supply accuracy without lowering the CC-supply efficiency, like the CC supplying method according to the above-described first feature (1). In the case where the width of each tape feeding device is smaller than that of each tape holding device, the CC-supply efficiency can be improved by reducing the time needed to position each CC-supply portion at the CC supplying position. In addition, since the first support member may have a small size, the first-support-member moving device may employ a drive source having a small capability, which contributes to reducing the production cost of the present system.

(5) According to a fifth feature of the present invention which includes the fourth feature (4), the second support member is immovable. The present system enjoys not only the advantage of improved CC-supply efficiency or accuracy but also the advantage, described above regarding the method according to the second feature (2), that the size of the first support member can be small. That is, the present system needs only a small space in which the first support member is moved, and accordingly the system as a whole occupies only a small space. In addition, this advantage contributes to improving the degree of freedom of designing of the peripheral devices of the system. Moreover, the present system enjoys the advantage that the CC-supply efficiency is improved because an operator can supply one or more new carrier tapes to one or more tape holding devices, without having to stop any tape feeding devices from supplying CCs; and the advantage that noise is prevented from being generated in the case where each tape holding device is of a type which holds a tape reel around which a carrier tape is wound. More specifically, if the group of tape feeding devices and the group of tape holding devices were moved as a unit and a plurality of relative-movement preventing devices were employed to prevent respective relative movements between the tape holding devices and the corresponding tape reels, the total number of parts of the system and the production cost of the same would be increased. In contrast, the present system does not need any of those preventing devices and accordingly can be produced easily and at low cost.

(6) According to a sixth feature of the present invention which includes the fourth or fifth feature (4) or (5), the supplying system further comprises a second-support-member moving device which moves the second support member in a direction parallel to the reference line. The second-support-member moving device may be one which is not operated while the present CC supplying system supplies CCs, and is operated, when the system does not supply CCs, to adjust the position of the second support member relative to the first support member; or one which is operated, while the system supplies CCs, to move the second support at lower acceleration and deceleration than those of the first support member. In the former case, for example, the position of the second support member relative to the first support member is adjusted, before the supplying of a series of CCs is started, such that the middle one of a group of tape holding devices used for supplying the series of CCs is aligned with the middle one of a group of tape feeding devices used for supplying the series of CCs. In the latter case, for example, the second-support-member moving device may be one which moves the second support member at velocities lower than those at which the first-support-member moving device moves the first support member; or one which continuously moves, when the amount of misalignment between the first and second support members exceeds a reference distance, the second support member by a distance equal to the reference distance. In either case, the amount of change of the relative position between each tape feeding device on the first support member and a corresponding tape holding device on the second support member can be limited in contrast to the case where the second-support-member moving device is not employed. Therefore, the amount of change of the length of the transferring portion of each carrier tape from each tape holding device to a corresponding tape feeding device can be limited. In the case where the second support member is moved while the system is not operated to supply CCs, the present system enjoys the same advantages as those with the case where the second support member is immovable. In addition, in the case where the second support member is moved while the system is operated to supply CCs, the second support member may be moved at lower acceleration and deceleration than those of the first support member, or may be moved during only a short time period of the entire CC supplying operation of the system. Thus, the present system does not produce any such vibration as produced when the tape feeding devices and the tape holding devices are moved as a unit. This leads to improving the CC-supply efficiency or accuracy. Since the amount of change of the relative position between the first and second support members can be effectively limited by the movement of the second support member, the present system may not necessarily need the tape-curve keeping device according to the seventh feature (7) described below.

(7) According to a seventh feature of the present invention which includes any one of the fourth to sixth features (4) to (6), the carrier tapes include respective transferring portions which transfer from the corresponding tape holding devices supported by the second support member, to the corresponding tape feeding devices supported by the first support member, and the system further comprises a tape-curve keeping device which keeps the transferring portions curved in a direction perpendicular to the reference line. In the case where the reference line is a horizontal (straight or curved) line, the direction perpendicular to the reference line may be a vertically upward or downward direction. In the case where each carrier tape linearly transfers from a corresponding tape holding device to a corresponding tape feeding device, the length of the transferring portion of the each carrier tape largely changes as the first support member is moved relative to the second support member in the direction parallel to the reference line. In contrast, in the case where each transferring portion is curved in the direction perpendicular to the reference line, the rate of change of the length of the each transferring portion when the first support member is moved, is small or even substantially zero. For example, in the case where each transferring portion includes a naturally S-shaped curved portion, the change of the length of the each transferring portion is absorbed by the deformation of the S-shaped curved portion thereof, and in many cases it can be said that the each transferring portion has substantially no change. In the case where each transferring portion transfers in a state in which the direction of width thereof is parallel to the reference line, the each transferring portion is forcedly subjected to cubic deformation as the first support member is moved relative to the second support member and accordingly the corresponding tape feeding device is moved relative to the corresponding tape holding device. That is, if the tape feeding and holding devices are moved away from each other, the linear transferring portion is deformed into a S-shaped curve in a plane parallel to the direction of width thereof. Thus, tensile stress is produced in the outer portion of the curve, and compressive stress is produced in the inner portion of the same. However, generally, the carrier tapes have a low elasticity and accordingly cannot be expanded nor compressed to a satisfactory degree. Consequently the inner portion of the curve is buckled and slacked, and the transferring portion is forced to subjected to cubic deformation. The shorter or the more linear the length or shape of the transferring portion is, the more serious the forced cubic deformation is. Thus, each carrier tape cannot be fed toward smoothly. In contrast, if the transferring portion is curved in the direction perpendicular to the reference line, the length of the transferring portion increases as the shape thereof becomes less linear, and accordingly the transferring portion is subjected to only moderate cubic deformation. In particular, since the movement of each pair of tape feeding and holding devices away from each other is allowed by the twisting of two portions of the curved transferring portion which extend in the direction perpendicular to the reference line, the transferring portion is subjected to only moderate cubic deformation. In the present system, the transferring portion of each carrier tape is always kept curved by the tape-curve keeping device, and accordingly the curved portion is prevented from being shortened even if the carrier tape is fed forward by the corresponding tape feeding device. In the case where each carrier tape is twisted by 90 degrees after being drawn from the corresponding tape holding device, subsequently is transferred in a state in which the widthwise direction thereof is perpendicular to the reference line, then is twisted back by 90 degrees, and finally is engaged with the corresponding tape feeding device, the each carrier tape is prevented from being subjected to cubic deformation when the first support member is moved relative to the second support member. Thus, one of the above-indicated two problems is solved. However, the other problem that the length of the transferring portion changes remains unsolved. Hence, it is preferred to employ the tape-curve keeping device.

(8) According to an eighth feature of the present invention which includes the seventh feature (7), the tape-curve keeping device comprises at least one of (a) a tape hold-down member which holds down the transferring portions of the carrier tapes, thereby curving the transferring portions in a downward direction; and (b) a tape support member which supports the transferring portions curved in a downward direction, thereby preventing the transferring portions from being excessively slacked in the downward direction. The tape hold-down member curves downward the transferring portion of each carrier tape that is transferred from a corresponding tape holding device to a corresponding tape feeding device. Thus, the hold-down member prevents the transferring portion from being made linear as the each carrier tape is fed forward by the tape feeding device. In the case where the feeding device can feed the tape more easily by drawing up the downwards curved, transferring portion than by drawing the carrier tape from the holding device, if the hold-down member were not employed, the downwards curved portion would be drawn up little by little each time one CC is supplied and would be made linear. This problem can be avoided by the hold-down member employed in the present system. Meanwhile, the tape support member prevents the downwards curved, transferring portion of each carrier tape from being excessively slacked in the downward direction because the each carrier tape is endlessly drawn from the corresponding tape holding device due to the self weight of the downwards curved portion. If the downwards curved portion were not supported by the tape support member, half the weight of the curved portion would act on the carrier tape held by the holding device and, if this action would apply a force greater than that needed to draw the carrier tape from the holding device, the tape would endlessly be drawn from the holding device and the curved portion would be increased more and more. If, however, the present system employs the tape support member which supports a portion or an entirety of the weight of the downwards curved portion (the percentage of that portion depends on the amount of clacked portion of the carrier tape, the weight of unit length of the tape, the buckling resistance of the tape, etc.), only a small force acts on the carrier tape held by the tape holding device. Since this force is smaller than that needed to draw the tape from the holding device, the length of the downwards curved portion of the tape is prevented from being excessively increased. In many cases, the force needed to draw the carrier tape from the tape holding device is unstable. Therefore, whether the length of the downward curved portion is decreased, or is excessively increased because of its self weight, when the carrier tape is fed forward by the tape feeding device, depends on each case. If the present system employs both the tape hold-down member and the tape support member, the downwards curved portion is prevented from being shortened and lengthened, that is, the transferring portion is stably kept curved downward by a predetermined length. However, the present system may employ on the tape hold-down member, e.g., in the case where the resistance against the drawing of the carrier tape from the tape holding device is sufficiently high, or the length of the downwards curved portion is sufficiently small; or the present system may employ on the tape support member, e.g., in the case where the length of the downwards curved portion is great enough for the carrier tape to be drawn because of the weight of the curved portion from the tape holding device. That is, the present system may not employ both of the two members.

(9) According to a ninth feature of the present invention which includes the eighth feature (8), the tape-curve keeping device comprises the tape hold-down member and the tape support member, wherein the reference line comprises a straight line, and wherein each of the tape hold-down member and the tape support member comprises an elongate member which extends substantially horizontally along a vertical plane parallel to the straight line.

(10) According to a tenth feature of the present invention which includes the ninth feature (9), the tape support member comprises a member having a downwards convex, part-cylindrical upper surface, and the tape hold-down member comprises a member having a downwards convex, part-cylindrical lower surface. In this case, each carrier tape can smoothly be moved through a curved space provided between the downwards convex, part-cylindrical lower surface and the downwards convex, i.e., upwards concave part-cylindrical upper surface.

(11) According to an eleventh feature of the present invention which includes any one of the eighth to tenth features (8) to (10), the tape-curve keeping device comprises the tape hold-down member, wherein the tape holding devices have respective tape outlets and the tape feeding devices have respective tape inlets, and wherein the system further comprises an elevating and lowering device which elevates and lowers the tape hold-down member to an upper position thereof higher than respective straight lines which connect between the respective tape outlets and the respective tape inlets, and to a lower position thereof lower than the straight lines. If the tape hold-down member being positioned at its upper position is lowered in the state in which the carrier tapes are linearly stretched from the tape outlets to the tape inlets, those tapes are curved along the lower surface of the hold-down member while being drawn from the tape holding devices. Thus, the downwards curved, transferring portions of the tapes are easily formed.

(12) According to a twelfth feature of the present invention which includes any one of the seventh to eleventh features (7) to (11), the tape holding devices have respective tape outlets and the tape feeding devices have respective tape inlets level with the tape outlets. In this case, the transferring portion of each carrier tape can be curved symmetrically with respect to a vertical plane parallel to the reference line along which the CC-supply portions are arranged. Thus, the influence resulting from the misalignment of the relative position between each pair of tape feeding and holding devices can be equally absorbed by one half portion of the transferring portion on the side of the feeding device and the other half portion on the side of the holding device.

(13) According to a thirteenth feature of the present invention which includes any one of the eighth to twelfth features (8) to (12), the tape-curve keeping device comprises the tape hold-down member and the tape support member, and wherein the tape-curve keeping device further comprises a plurality of tape-hold-down-member support members which are provided on the tape support member and which support a plurality of portions of the tape hold-down member, respectively, thereby providing a space between the tape hold-down member and the tape support member. The tape-hold-down-member support members which may be provided by simple members surely provide, between the tape hold-down member and the tape support member, a space suitable for the carrier tapes to pass therethrough. For example, the space has a thickness which is greater than that of one carrier tape and smaller than double the latter thickness. In this case, the carrier tapes can easily move in the space without receiving the weight of the tape hold-down member, and each pair of adjacent tapes cannot pass or cross each other in the space. Otherwise, if the space would allow each pair of adjacent tapes to pass each other, the tapes might be tangled with one another. This problem can easily and surely be avoided by providing an appropriate space between the tape hold-down and support members. In the case where the present system supplies carrier tapes having a greater thickness, it is preferred to provide, between the tape hold-down member and the tape-hold-down member support members, a space adjusting means (member or device) which can adjust the space formed between the tape hold-down and support members. It is preferred, but not essentially required that the tape-hold-down member support members be provided by ones which support the opposite end portions of the tape hold-down member.

(14) According to a fourteenth feature of the present invention which includes any one of the eleventh to thirteenth features (11) to (13), the elevating and lowering device comprises a pair of elevator members each of which supports a lower portion of a corresponding one of opposite end portions of the tape hold-down member and allows the one end portion to be moved upward relative thereto; and a synchronism elevating and lowering device which elevates and lowers the two elevator members in synchronism with each other. When the pair of elevator members are lowered while supporting the respective lower portions of the opposite end portions of the tape hold-down member, the hold-down member may eventually be supported by the tape-support-member support members. The elevator members may further be lowered by a small distance before being stopped. In this case, when the elevator members are elevated, the elevator members will support, midway, the hold-down member being supported by the tape-support-member support members. Thus, the hold-down member can easily be transferred from the elevator members to the tape-support-member support members and vice versa.

(15) According to a fifteenth feature of the present invention which includes the fourteenth feature (14), the synchronism elevating and lowering device comprises a pair of strings, such as wires, ropes, or chains, which have respective one end portions which are connected to the two elevator members, respectively; a pair of first directing rotatable members on which the two strings are wound such that the two strings which run in a vertical direction are directed to opposite horizontal directions, respectively; a second directing rotatable member on which one of the two strings which runs in one of the opposite horizontal directions is wound such that the one string running in the one horizontal direction is directed to the other horizontal direction and accordingly the respective other end portions of the two strings run in the other horizontal direction; and a drive device which moves the other end portions of the two strings, together with each other, in each of the opposite horizontal directions.

(16) According to a sixteenth feature of the present invention which includes any one of the fourth to fifteenth features (4) to (14), the supplying system further comprises at least one tape control member which is provided in respective tape feeding paths from the tape holding devices to the corresponding tape feeding devices, which is immovable relative to the tape holding devices while the system supplies the circuit components, and which controls a movement of each of the carrier tapes in a direction parallel to the reference line when the first support member is moved relative to the second support member. In the case where the second support member is immovable, and when an operator supplies a new carrier tape by connecting the new tape to the prior carrier tape which is being fed by one tape feeding device during the CC supplying operation of the present system, the tape control member can minimize or zero the movement of a portion of the prior carrier tape on the side of the corresponding tape holding device, though another portion of the same tape on the side of the feeding device is largely moved in the direction parallel to the reference line when the first support member is moved relative to the second support member. Thus, the operator can easily connect the new tape to the prior tape. In the case where the second support member is movable, it is not kept moving and is stopped during a predetermined time duration. If this time duration is long enough for the operator to connect the new tape, he or she can complete his or her connecting operation without interrupting the CC supplying operation of the present system. In this case, too, the tape control device can help the operator perform his or her tape-connecting work. In either case, the movement of each carrier tape is influenced by the tape control device and the corresponding tape holding device. The carrier tape is drawn from the tape holding device in a direction toward the tape control member. Thus, if the tape control member is one which does not allow the carrier tape to be moved in the direction parallel to the direction in which the first support member is moved relative to the second support member, the direction of drawing of the tape from the holding device is not changed with respect to the widthwise direction of the tape. On the other hand, if the tape control member is one which allow the above-indicated movement of the tape, the change of the direction of drawing of the tape is controlled or reduced.

(17) According to a seventeenth feature of the present invention which includes the sixteenth feature (16), the tape holding devices include respective tape holding members which hold the carrier tapes, respectively, and wherein the at least one tape control member is located above the tape holding members and defines respective tape outlets of the tape holding devices. Each tape holding member may be provided by a support roller which supports a tape reel around which one carrier tape is wound. In this case, the support shafts may be located at low positions while the tape outlets are located at high positions. Thus, each tape reel can easily be replaced by a new tape reel. In view of this, it is preferred that the tape control member be located at a position corresponding to ascending portions of the carrier tapes drawn from the tape holding members, such as tape reels or tape storing cases, which hold the carrier tapes such that the tapes can be drawn therefrom, and it is most preferred that the tape control member be located at a position corresponding to the highest portions of the tape holding devices.

(18) According to an eighth feature of the present invention which includes the sixteenth or seventeenth feature (16) or (17), the at least one tape control member comprises at least one guide roller which is rotatable about an axis line parallel to the reference line. In this case, when the tape feeding device whose CC-supply portion is positioned at the CC supplying position feeds one carrier tape, the guide roller or rollers guides or guide the carrier tape so that the tape is easily fed forward. The at least one tape control member may be provided by a single guide roller which is long in a direction parallel to the reference line and is common to all the carrier tapes; or may be provided by a plurality of guide rollers which are short, and are arranged, in the direction parallel to the reference line. In the latter case, each of the short guide rollers may have respective flange-like control portions which extend radially outwardly from axially opposite ends thereof, so that one carrier tape may be moved while the tape is fitted in a space formed between the two flange-like portions; or the short guide rollers each of which has no such flange-like portions may be arranged close to each other in the direction parallel to the reference line. In the case where the single long guide roller is employed, or the plurality of short guide rollers each without any flange-like portions are employed, the carrier tapes are just engaged with the guide roller or roller such that the tapes are not prevented from being moved. However, the friction between each carrier tape and the guide roller or rollers controls or restricts, to some extent, the movement of the carrier tape in the direction parallel to the reference line. The tape control members having respective control portions, such as the guide rollers having the respective flange-like control portions, are very effective in controlling the movements of the carrier tapes which are of an embossed type. Each embossed-type carrier tape may be one which includes a pair of elongate side portions and a number of container-like CC-accommodating central portions which project at a regular interval from the two side portions and each of which has a CC accommodating pocket therein in which one CC is accommodated; or one which includes a pair of elongate side portions and a single belt-like CC-accommodating central portion which project from the two side portions and which has, at a regular interval, a number of CC accommodating pockets therein in each of which one CC is accommodated. In either case, each embossed-type carrier tape is fed by the tape feeding device such that the two side portions of the tape are supported by a pair of tape-support surfaces of the feeding device. The side portions of each embossed-type carrier tape have a small thickness and accordingly the respective one side portions of each pair of adjacent carrier tapes are likely to overlap each other. This problem is easily avoided by employing the tape control members having the respective control portions.

(19) According to a nineteenth feature of the present invention which includes any one of the eighth to eighteenth features (8) to (18), the tape-curve keeping device comprises the tape support member, and wherein the system further comprises a tape-support-member moving device which moves, in a direction which is parallel to the reference line and is same as a direction of movement of the first support member relative to the second support member, the tape support member by a distance smaller than a distance of movement of the first support member relative to the second support member. For example, in the case where the tape outlets of the tape holding devices are level with the tape inlets of the tape feeding devices, the central portion of each U-shaped transferring portion that is pendent from the corresponding tape outlet and inlet is located at a position equally distant from the outlet and the inlet in a direction perpendicular to the direction of movement of the first support member relative to the second support member, i.e., in the direction in which the first and second support members are arranged. Therefore, when the first support member is moved relative to the second support member, the each transferring portion is moved at an average of the respective velocities of the first and second support members. For example, in the case where the second support member is immovable, each transferring portion is moved at half the velocity of the first support member. Accordingly, if the tape support member is provided at the position equally distant from the outlet and the inlet and is moved at the average of the respective velocities of the first and second support members, the central portion of each transferring portion is not moved relative to the tape support member, if the first support member is moved relative to the second support member. In this case, the entirety of a portion of each transferring portion that portion is supported by the tape support member and includes the central portion of the each transferring portion, is moved only a small amount relative to the tape support member in the lengthwise direction thereof. Thus, each pair of carrier tapes are effectively prevented from being entangled with each other if the respective transferring portions of the two carrier tapes would largely be moved relative to the tape support member. On the other hand, if the tape outlets are not level with the tape inlets, the turning portion (the lowest or highest portion) of each (U-shaped or inverted-U-shaped) transferring portion is moved at a velocity between the average of the respective velocities of the first and second support members and the velocity of one of the two support members that is lower than the other support member. In this case, too, the tape support member which supports the turning portion of each transferring portion can be moved at the same velocity of the turning portion so as to minimize the amount of relative movement between the entirety of a portion of each transferring portion that portion is supported by the tape support member, and the tape support member, in the lengthwise direction of the support member. Thus, the carrier tapes are prevented from being entangled with each other. However, it is not essentially required to minimize the amount of relative movement between the tape support member and the portion of each transferring portion that is supported by the support member. So long as the tape support member is moved at a velocity between respective velocities of the tape outlets and the tape inlets, the amount of relative movement between the tape support member and the portion of each transferring portion that is supported by the support member can be reduced with some advantage.

(20) According to a twentieth feature of the present invention which includes the nineteenth feature (19), the tape-support-member moving device comprises a plurality of first hanging members which hang the tape support member from the first support member and allow the tape support member to be moved relative to the first support member in the direction parallel to the reference line, and a plurality of second hanging members which hang the tape support member from the second support member and allow the tape support member to be moved relative to the second support member in the direction parallel to the reference line. When the first support member is moved, the first and second hanging members moves the tape support member. Each of the hanging members may be a flexible string-like member such as a belt, a wire, or a chain, or a bar-like member which is pivotably connected to the first and second support members and the tape support member via respective ball joints.

(21) According to a twenty-first feature of the present invention which includes the twentieth feature (20), the plurality of first hanging members comprise two first hanging members which hang the tape support member from the first support member such that in a state in which respective middle portions of the first and second support members in the direction parallel to the reference line are opposed to each other, the two first hanging members extend downward from the first support member in respective oblique directions away from the middle portions, and the plurality of second hanging members comprise two second hanging members which hang the tape support member from the second support member such that in the state the two second hanging members extend downward from the second support member in respective oblique directions toward the middle portions. In this case, the height position of the tape support member can be changed depending on the change of the length of a portion of each carrier tape that portion is supported by the tape support portion. More specifically described, as the misalignment of the relative position between each pair of tape feeding and holding devices increases, the central portion of the transferring portion of the corresponding carrier tape moves upward, if no new portion of the tape is drawn from the holding device. Conversely, as the misalignment decreases, the central portion moves downward. However, since the present system employs the first and second hanging members which obliquely extend in the above-described manners, a downstream-side end and an upstream-side end of the tape support member as seen in the direction of movement of the first support member is moved downward and is moved upward, respectively, as the first support member is moved relative to the second support member starting from the state in which the respective middle portions of the first and second support members are opposed to each other. Thus, the tape support member supports the transferring portions of the carrier tapes while substantially following the upward and downward movement of the transferring portions. Consequently the transferring portions are prevented from being excessively slacked or excessively drawn fro the tape holding devices.

(22) According to a twenty-second feature of the present invention which includes any one of the fourth to twenty-first features (4) to (21), each of the tape holding devices comprises a first twisting device which twists the carrier tape by about 90 degrees so that a direction of width of the tape is substantially perpendicular to the reference line, and each of the tape feeding devices comprises a second twisting device which twists the twisted tape by about 90 degrees so that the direction of width of the tape is substantially parallel to the reference line. The second twisting device may be one which twists back the twisted tape by about 90 degrees, or one which twists the twisted tape by about 90 degrees in the same direction as that in which the first twisting device twists the tape. In either case, the direction of thickness of the transferring portion of each carrier tape fed from the corresponding tape feeding device to the corresponding tape holding device is substantially parallel to the direction of movement of the first support member. Thus, the transferring portion is easily bent depending on the amount of misalignment of the relative position of the first and second support members. Therefore, a large misalignment of the relative position of the first and second support members is easily allowed.

(23) According to a twenty-third feature of the present invention which includes any one of the fourth to twenty-second features (4) to (22), the first and second support members support, in a state in which the first and second support members take a reference position relative to each other, the tape feeding devices and the tape holding devices, respectively, such that a widthwise center line of each of the tape feeding devices and a widthwise center line of a corresponding one of the tape holding devices are positioned on a single plane. In this case, the first and second support members may have substantially the same width. If this feature (23) is combined with the feature that the second support member is moved to follow the first support member, at an acceleration and a deceleration lower than those at which the first support member is moved, the transferring portion of each carrier tape can be kept substantially linear, and accordingly the each carrier tape can easily be dealt with, with an excellent advantage.

(24) According to a twenty-fourth feature of the present invention which includes any one of the fourth to twenty-third features (4) to (23), the supplying system further comprises a plurality of connecting devices each of which connects a corresponding one of the tape feeding devices and a corresponding one of the tape holding devices, to each other, such that the one tape feeding device and the one tape holding device are disconnectable from each other. In this case, in the state in which each pair of tape feeding and holding devices are detached from the first and second support members, respectively, the each pair of tape feeding and holding devices may be connected to each other by a corresponding one of the connecting devices such that the relative position of the feeding and holding devices cannot be changed. Thus, each pair of tape feeding and holding devices and the corresponding carrier tape can easily be carried to, and kept at, a distant place, in the state in which a portion of the carrier tape drawn from tape holding device remains set in the tape feeding device.

BRIEF DESCRIPTION OF THE DRAWINGS

The above and optional objects, features, and advantages of the present invention will better be understood by reading the following detailed description of the preferred embodiments of the invention when considered in conjunction with the accompanying drawings, in which.

DETAILED DESCRIPTION OF THE PREFERRED EMBODIMENTS

Referring first to FIGS. 1 to 17, there will be described a circuit-component ("CC") mounting system 8 including a CC supplying system 12 which embodies a CC supplying system of the present invention. The CC supplying system 12 carries out a CC supplying method of the present invention.

Figure 1:
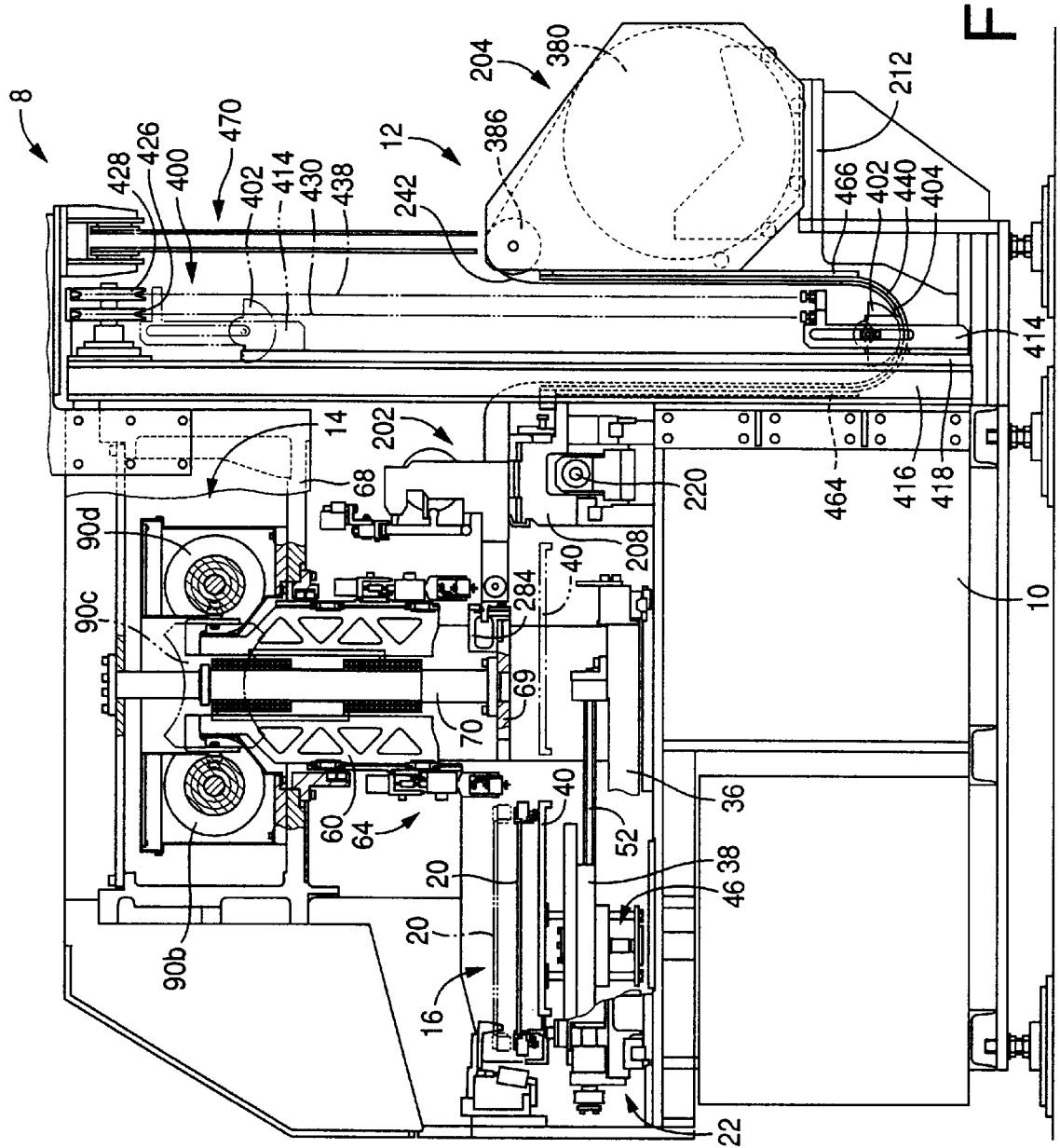
FIG. 1 is a side elevation view of a circuit-component ("CC") mounting system including a CC supplying system which embodies a CC supplying system of the present invention and carries out a CC supplying method of the present invention.
Figure 2:
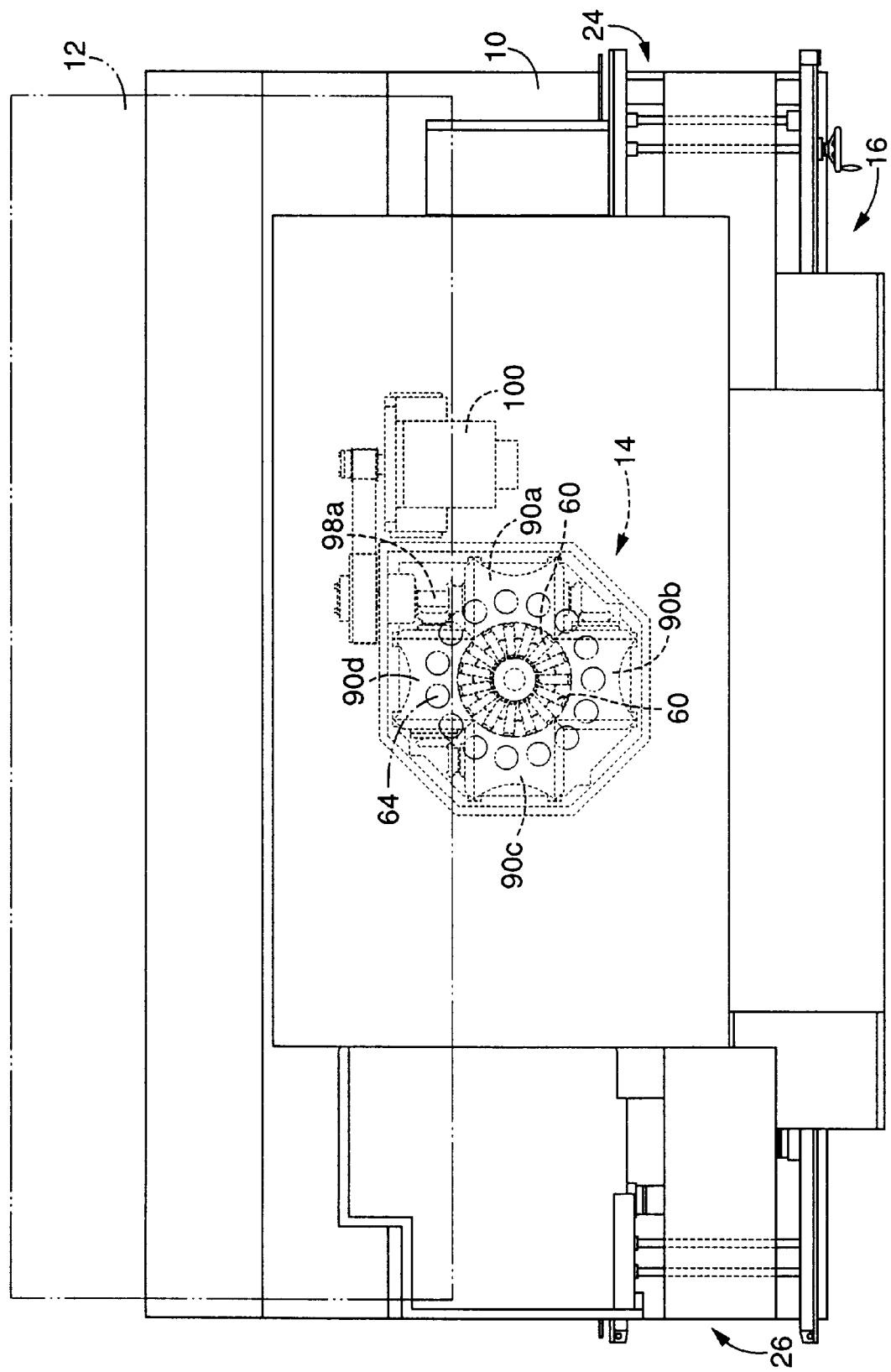
FIG. 2 is a plan view of the CC mounting system of FIG. 1.

As shown in FIGS. 1 and 2, the present CC mounting system 8 includes, in addition to the CC supplying system 12 provided on a base member 10, a CC mounting device 14 and a printed-circuit-board ("PCB") carrying device 16 both of which are also provided on the base member 10.

The PCB carrying device 16 includes a PCB positioning and supporting ("position-support") device 22 which positions and supports a PCB 20 as a sort of circuit substrate; a PCB carry-in device 24 which carries in the PCB 20 and transfers it to the PCB position-support device 22; and a PCB carry-out device 26 which carries out the PCB 20 from the device 22. The PCB carrying device 16 is substantially entirely provided below the CC mounting device 14.

Each of the PCB carry-in and carry-out devices 24, 26 includes a pair of endless conveyor belts (not shown) each as a PCB carrying member, and a drive device which includes a belt-driving motor 28 (FIG. 14) as its drive source and which drives the conveyor belts for carrying the PCB 20 placed thereon. The PCB 20 is carried in a direction from the right-hand carry-in device 24 to the left-hand carry-out device 26 in FIG. 2. Hereinafter, this direction is referred to as the "PCB-carrying direction", or the "X-axis direction", if appropriate.

The PCB position-support device 22 includes an X table 36 which is provided on the base member 10 such that the X table 36 is movable to and fro in the X-axis direction; a Y table 38 which is provided on the X table 36 such that the Y table 38 is movable to and fro in a Y-axis direction perpendicular to the X-axis direction in a horizontal plane; and a PCB support table 40 which is provided on the Y table 38 such that the PCB support table 40 is movable up and down.

On the PCB support table 40, there are provided a PCB carry-in and carry-out device and a PCB holding device (not shown) of the PCB position-support device 22. The PCB carry-in and carry-out device includes a pair of endless conveyor belts each as a PCB carrying member, and a drive device which includes a belt-driving motor 44 (FIG. 14) as its drive source and which drives the conveyor belts for carrying the PCB 20 in the X-axis direction.

The PCB position-support device 22 additionally includes an elevating and lowering device 46 which elevates and lowers the PCB support table 40 between its uppermost position indicated in two-dot chain line in FIG. 1 and its lowermost position indicated in solid line. In the state in which the table 40 is positioned at its uppermost position, a PCB-carrying plane defined by respective upper surfaces of the respective upper half portions of the two endless belts of the PCB carry-in and carry-out device provided on the table 40 is flush with a PCB-carrying plane defined by respective upper surfaces of the respective upper half portions of the two endless belts of each of the PCB carry-in and carry-out devices 24, 26. In the state in which the table 40 is positioned at its lowermost position, the PCB 20 placed on the PCB-carrying plane is positioned below the CC mounting device 14.

The PCB 20 is transferred from the PCB carry-in device 24 to the PCB position-support device 22, or from the device 22 to the PCB carry-out device 26, in the state in which the PCB support table 40 is positioned at its uppermost position. The PCB 20 transferred to the table 40 is held by the PCB holding device. When circuit components (CCs) are mounted on the PCB 20 by the CC mounting device 14, the table 40 is lowered to its lowermost position.

Two nuts (not shown) are fixed to the X and Y tables 36, 38, respectively, and are engaged with two feeding screws 52, respectively. However, FIG. 1 shows only one feeding screw 52 for moving the Y table 38 in the Y-axis direction. The two feeding screws 52 are rotated by two table-driving servomotors 54, 56 (FIG. 14), respectively. Thus, the X and Y tables 36, 38 are moved in the X-axis and Y-axis directions, respectively, while being guided by respective linear guide members (not shown). Accordingly, the PCB support table 40 can be moved to any position in a horizontal plane. A portion of the X table 36 extends below the CC mounting device 14 and, as shown in FIG. 1, the support table 40 can be moved to an area below the CC mounting device 14. That is, a portion of the range within which the table 40 is movable overlaps the CC mounting device 14 in a horizontal direction. Hereinafter, the position where the table 40 is present between the PCB carry-in and carry-out devices 24, 26 in the X-axis direction and is aligned with the two devices 24, 26 in the Y-axis direction will be referred to as the original position (i.e., origin) of the table 40 in the horizontal plane.

Next, the CC mounting device 14 will be described.

The CC mounting device 14 is similar to a CC mounting device disclosed in U.S. Patent Application Ser. No. 08/907,882 assigned to the Assignee of the present U.S. application. Hence, the device 14 is described briefly.

The CC mounting device 14 includes fifteen rotary plates 60 which are rotatable about a vertical common axis line, independent of one another; fifteen CC-holding heads 64 which are supported by the fifteen rotary plates 60, respectively, and each of which can hold a CC 150 (FIG. 8); and a rotary-motion applying device 66 which applies, to each of the rotary plates 60, a rotary motion which causes each rotary plate 60 to rotate fully about the common axis line while stopping the same three times during each full rotation and keeping a predetermined time difference between the each plate 60 and each of its adjacent two rotary plates 60, i.e., its preceding and following rotary plates 60.

Figure 3:
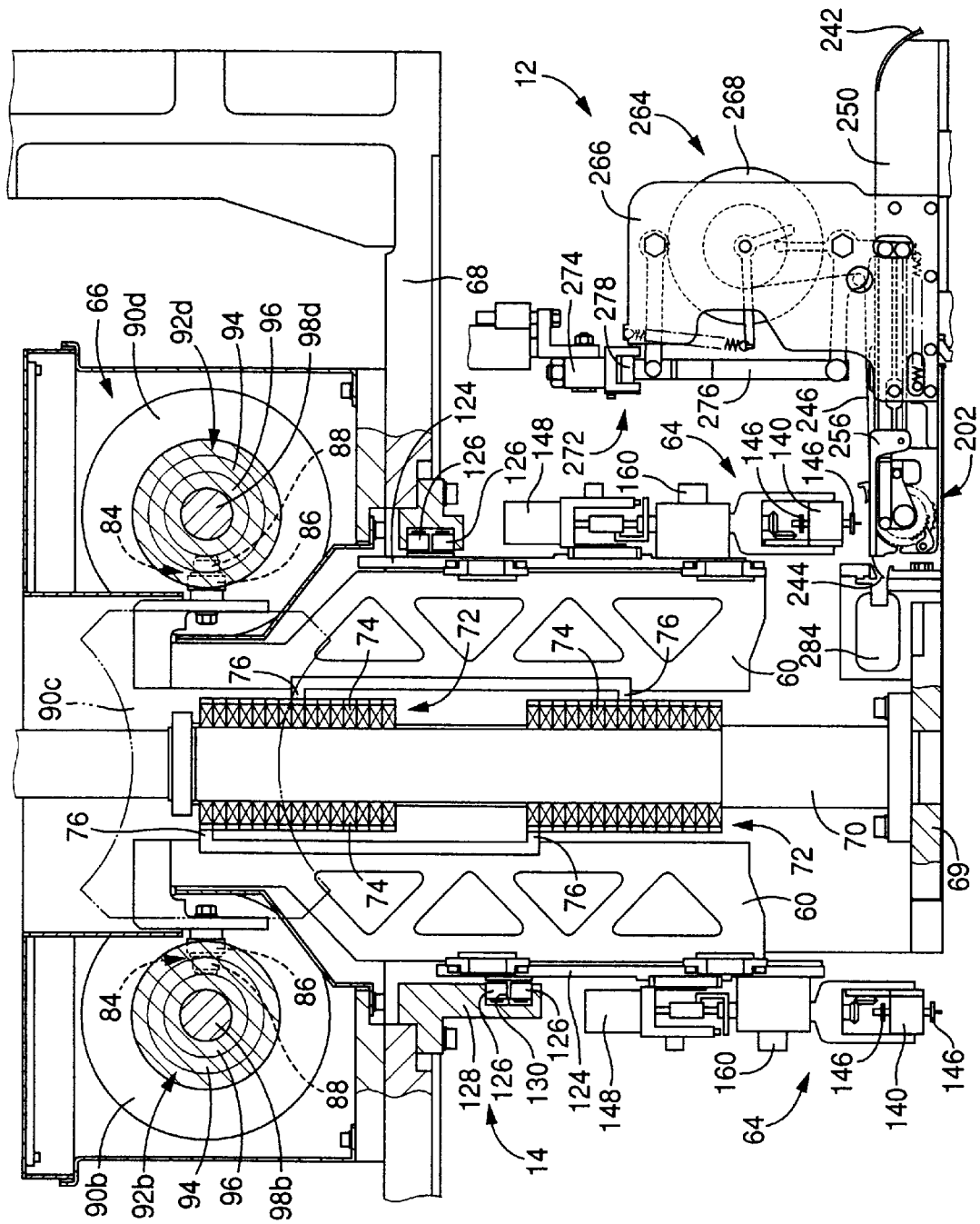
FIG. 3 is a side elevation view of a CC mounting device of the CC mounting system of FIG. 1.

The CC mounting device 14 includes, as its main members, a frame member 68 which is provided above the base member 10, and a support plate 69 which is provided below the frame member 68 and is fixed to the base member 10. As shown in FIG. 3, a vertical support shaft 70 is fixed to the frame member 68 and the support plate 69. Two groups of bearings 72 are attached to two portions of the support shaft 70, respectively, which are distant from each other in an axial direction of the shaft 70. Each group of bearings 72 consists of fifteen bearings 74 which have different axial positions, respectively. As shown in FIG. 3, the fifteen rotary plates 60 are associated with respective pairs of support arms 76 fixed thereto. Each pair of support arms 76 are fixed to, and supported by, the corresponding pair of bearings 74 which belong to the two bearing groups 72, respectively, so that each rotary plate 60 is rotatable about the support shaft 70 whose center axis line coincides with the common axis line of the rotary plates 60. All the pairs of bearings 74 corresponding to the respective pairs of support arms 76 of the fifteen rotary plates 60 have the same distance therebetween in the axial direction of the support shaft 70. However, the fifteen pairs of support arms 76 have different axial positions at which the arms 76 are fixed to the respective rotary plates 60. Accordingly, the fifteen pairs of support arms 76 do not interfere with one another, even though the rotary plates 60 are supported by the support shaft 70 such that the rotary plates 60 are rotatable at the same position with respect to the axial direction of the support shaft 70.

The fifteen rotary plates 60 have respective cam followers 84 at the same position with respect to the axial direction of the support shaft 70. Accordingly, the fifteen cam followers 84 are moved on a circle whose center rides on the common axis line of the rotary plates 60. Each cam follower 84 includes a large-diameter roller 86 and a small-diameter roller 88 which are attached to the corresponding rotary plate 60 such that the two rollers 86, 88 are rotatable, independent of each other, about a common axis line perpendicular to the common axis line of the rotary plates 60. The two rollers 86, 88 of each cam follower 84 are held in rolling engagement with respective cam grooves formed in each of four concave globoidal cams 90a, 90b, 90c, 90d (FIG. 2) which are rotatably attached to the frame member 68. The drawings show the respective cam grooves 92b, 92d of the two globoidal cams 90b, 90d but do not show the respective cam grooves of the two globoidal cams 90a, 90c. FIG. 2 shows the fifteen rotary plates 60 as positioned relative to one another such that the rotary plates 60 are evenly or equi-angularly spaced apart from each other about the support shaft 70, for only the interest of simplicity. In fact, the angular or phase difference of one pair of adjacent rotary plates 60 may differ from that of another pair of adjacent rotary plates 60 for the reasons which will be described later by reference to FIG. 4.

Each of the four concave globoidal cams 90a–90d has an outer circumferential surface defined by a locus which is described by a circular arc whose center rides on the center axis line of the support shaft 70 when the circular arc is rotated about an axis line which is located such that the circular arc is interposed between this axis line and the center axis line of the support shaft 70 and which is perpendicular to the axis line of the shaft 70. The axis line about which the circular arc is rotated to describe the above-indicated locus is an axis line of a rotary shaft 98*a*, 98*b*, 98*d* of each globoidal cam 90*a*–90*d* (the rotary shaft of the cam 90*c* is not shown). The four concave globoidal cams 90*a*–90*d* are disposed symmetrically with respect to the center axis line of the support shaft 70, such that respective inner lines of intersection of the outer circumferential surfaces of the cams 90*a*–90*d* with a plane including the axis lines of the cams 90*a*–90*d* and perpendicular to the center axis line of the support shaft 70 cooperate with one another to define a substantially continuous circle whose center rides on the axis line of the center support shaft 70. The four cam grooves 92 formed in the outer circumferential surfaces of the four cams 90*a*–90*d* are substantially connected to each other.

Each of the respective cam grooves 92 (92*b*, 92*d*) of the four globoidal cams 90*a*–90*d* is a stepped cam groove including a wide groove 94, and a narrow groove 96 which opens in the bottom of the wide groove 94. The large-diameter and small-diameter rollers 86, 88 of the cam follower 84 of each rotary plate 60 are held in rolling engagement with the wide and narrow grooves 94, 96 of the cam groove 92 of each of the cams 90*a*–90*d*, respectively.

FIGS. 2 and 3 show that each of the respective rotary shafts 98*a*, 98*d* of the globoidal cams 90*a*, 90*d* has two bevel gears fixed thereto and each of the respective rotary shafts 98*b* of the globoidal cams 90*b*, 90*c* (the rotary shaft of the cam 90*c* is not shown) has a single bevel gear fixed to one end thereof. Each pair of adjacent bevel gears (three pairs in total) are held in meshing engagement with each other. When the rotary shaft 98*a* of the globoidal cam 90*a* is rotated by a main servomotor 100 (FIG. 2), the four globoidal cams 90*a*–90*d* are contemporaneously rotated in synchronism with each other, so that the fifteen rotary plates 60 are rotated about the support shaft 70, and are sequentially stopped, as described below.

Each rotary plate 60 is stopped at a CC sucking position, a CC-image taking position, and a CC mounting position. The CC sucking position is prescribed adjacent to the CC supplying system 12, and the globoidal cam 90*d* is provided, on the frame member 68, at a position corresponding to the CC sucking position. The CC mounting position is prescribed adjacent to the PCB carrying device 16, and the globoidal cam 90*b* is provided, on the frame member 68, at a position corresponding to the CC mounting position. The CC-image taking position is prescribed midway on a route from the CC sucking position to the CC mounting position, and the globoidal cam 90*a* is provided, on the frame member 68, at a position corresponding to the CC-image taking position. A CC-image taking device 102 (FIG. 14) including a lighting device and a CCD (charge-coupled device) camera is provided, on the main members 68, 69 of the CC mounting device 14, at a position corresponding to the CC-image taking position.

The cam groove 92 of each of the globoidal cams 90*a*, 90*b*, 90*d* includes an inclined portion having a lead angle with respect to a plane perpendicular to the axis line of the rotary shaft 98 of the each cam 90*a*, 90*b*, 90*d*, and additionally includes a non-lead portion perpendicular to that axis line so that each of the rotary plates 60 (or each of the cam followers 84) is held stopped at the CC-image taking position, the CC mounting position, and the CC sucking position. The inclined portion of the groove 92 of each cam 90*a*, 90*b*, 90*d* includes straight and curved sections which are so shaped as to first rotate each rotary plate 60 at a predetermined constant angular velocity, then accelerate the same 60 for moving it over more distance or angle, decelerate it, stop it at one of the three stop positions, resume the rotation of each plate 60, accelerate it for moving it over more angle, decelerate it, and then move it at the constant velocity. The cam groove of the globoidal cam 90*c* has only a straight inclined portion having a lead angle with respect to a plane perpendicular to the axis line of the rotary shaft of the cam 90*c*. This lead angle is predetermined to permit each rotary plate 60 to be rotated at the above-indicated constant angular velocity.

The respective cam grooves 92 of the globoidal cams 90*a*, 90*b*, 90*d* are formed so that three of the fifteen rotary plates 60 are stopped at the three stop positions, respectively, at different timings which differ from one another by about one third of a time pitch at which the fifteen rotary plates 60 (or the fifteen CC-holding heads 64) reach one after another at each of the three stop positions. The respective inclined portions (both the straight and curved sections) of the respective cam grooves 92 of the globoidal cams 90*a*, 90*b*, 90*d* have the same degree of inclination, so that each rotary plate 60 is rotated at the same constant angular velocity, and accelerated and decelerated at the same values by the three cams 90*a*, 90*b*, 90*d*. However, the respective lengths of the two straight sections (which respectively precede and follow the curved section) of the inclined portion of each one of the cam grooves 92 of the three cams 90*a*, 90*b*, 90*d* differ from those of each of the other two cam grooves 92. Therefore, the time needed for each rotary plate 60 to move from the CC sucking position to the CC-image taking position differs from that for the same 60 to move from the CC-image taking position to the CC mounting position. The degree of inclination of the straight inclined portion of the cam groove 92 of the globoidal cam 92*c* is equal to that of the straight sections of the inclined portion of the cam groove 92 of each of the other three cams 90*a*, 90*b*, 90*d*, so that each rotary plate 60 is rotated by the cam 90*c* at the same constant angular velocity as that at which the same 60 is rotated by the cams 90*a*, 90*b*, 90*d*.

Figure 4:
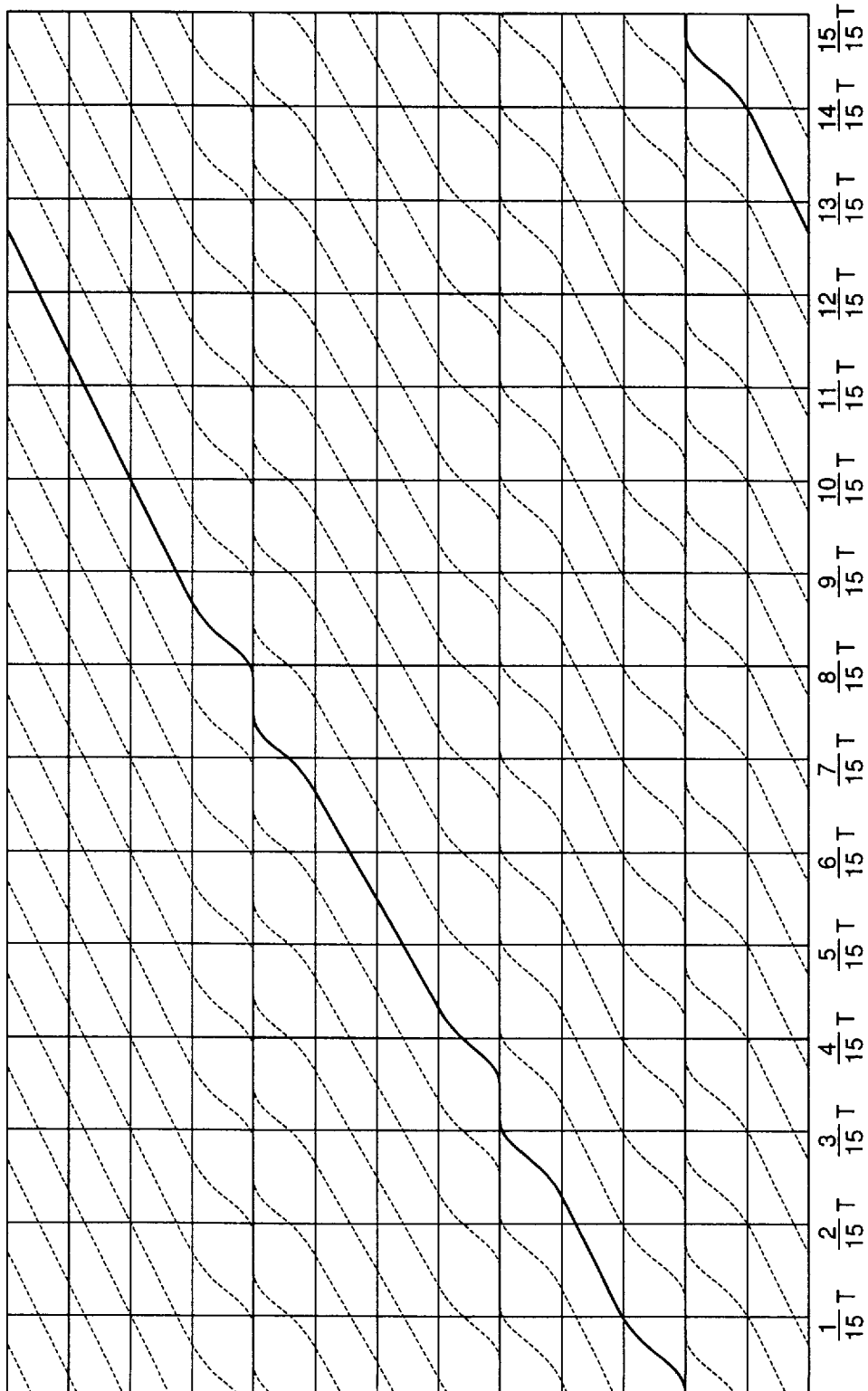
FIG. 4 is a time chart representing a relationship between time, T, and the angle of rotation of each of fifteen rotary plates of the CC mounting device of FIG. 3.

FIG. 4 shows a timing chart which represents a relationship between time and the angle of rotation of each of the fifteen rotary plates 60. In FIG. 4, the symbol "T" indicates the time needed for each rotary plate 60 to be rotated through 360 degrees, and this time is taken along the axis of abscissa, with a graduation unit being equal to T/15 in view of the fifteen rotary plates 60 in total. On the other hand, the angle of rotation of each rotary plate 60 is taken along the axis of ordinate, with a graduation unit being equal to 360/13 in view of designed thirteen stations including three stations corresponding to the three stop positions. In the present embodiment, each rotary plate 60 stops at the three stations but passes through the other ten stations. The time-angle relationship of each rotary plate 60 is expressed by a line including a straight portion, an upwards curved or convex portion, and a downwards curved or concave portion. The straight portion indicates the constant-velocity movement of the rotary plate 60; the convex portion indicates the deceleration of the rotary plate 60; and the concave portion indicates the acceleration of the rotary plate 60.

The timing chart of FIG. 4 shows that arbitrary three plates 60 of the fifteen rotary plates 60 are stopped at the CC sucking position, the CC-image taking position, and the CC mounting position, respectively, at respective different timings which differ from one another by about one third of the time pitch at which the fifteen rotary plates 60 arrive one after another at each of the three stop positions. Therefore, arbitrary three plates 60 of the fifteen rotary plates 60 are accelerated or decelerated at respective different timings before, and after, being stopped at the three stop positions, respectively. Accordingly, the total load or torque applied to the main servomotor 100 is reduced, and the four globoidal cams 90a–90d may be driven by the motor 100 which has a small capacity or low performance.

The respective cam grooves 92 of each pair of adjacent globoidal cams 90 (90a, 90b, 90c, 90d) are connected to each other at respective predetermined angular phases of the two cams 90, so that the cam follower 84 of each rotary plate 60 can smoothly be moved from one of the two cams 90 to the other cam 90. Thus, each plate 60 can be rotated through 360 degrees. Each cam follower 84 includes the large-diameter and small-diameter rollers 86, 88, and the large roller 86 slightly earlier reaches the interface of the two cam grooves 92 than the small roller 88. In the state in which the large roller 86 has just reached the interface, the large roller 86 is not sandwiched between the opposed side walls of either of the respective wide grooves 94 of the two cam grooves 92. However, the small roller 88 remains sandwiched between the opposed side walls of the narrow groove 96 of the cam groove 92 of the one cam 90. Accordingly, the large roller 86 can smoothly transfer from the one cam 90 to the other cam 90. When the small roller 88 reaches the interface of the two cam grooves 92, the large roller 86 has already been sandwiched between the opposed side walls of the wide groove 94 of the cam groove 92 of the other cam 90. Thus, the small roller 88 can smoothly transfer from the one cam 90 to the other cam 90, too.

As shown in FIG. 3, each CC-holding head 64 is supported by an elevator member 124 as a movable member which is attached to the corresponding rotary plate 60 such that the elevator member 124 is movable up and down. Two cam-follower rollers 126 are attached to each elevator member 124 such that each of the two rollers 126 is rotatable about an axis line perpendicular to the common axis line of the rotary plates 60. The two cam-follower rollers 126 of each elevator member 124 are held in rolling engagement with a cam groove 130 formed in an inner circumferential surface of a stationary cam 128 fixed to the frame member 68. The inner circumferential surface of the stationary cam 128 has its center line coinciding with the center axis line of the support shaft 70. The cam groove 130 includes a height-position varying portion whose height position (in the axial direction of the shaft 70) continuously varies in the circumferential direction of the cam 128, and a level portion whose height position does not vary. The cam groove 130 is so formed that each CC-holding head 64 takes its uppermost position when the corresponding rotary plate 60 is positioned at the CC sucking position and takes its lowermost position when the rotary plate 60 is positioned at the CC mounting position and that each head 64 is moved in a horizontal plane while the rotary plate 60 is rotated around each of the CC sucking, CC-image taking, and CC mounting positions. Accordingly, when the cam-follower rollers 126 of each rotary plate 60 is moved in rolling engagement with each height-position varying portion of the cam groove 130, the elevator member 124 is moved up and down and accordingly the CC-holding head 64 is moved up and down.

Each CC-holding head 64 includes a nozzle holder 140 which is supported by the elevator member 124 such that the nozzle holder 140 is rotatable about a vertical axis line and a horizontal axis line; and six CC-suction nozzles 146 (only two nozzles 146 are shown in FIGS. 1 and 3) which are held by the nozzle holder 140 such that the six nozzles 146 are equi-angularly spaced from one another about the horizontal axis line of the holder 140. When the nozzle holder 140 is rotated about its horizontal axis line by a nozzle selecting device including, as its drive source, a nozzle selecting/rotating servomotor 148 mounted on the elevator member 124, an appropriate one of the six nozzles 146 is selected and positioned at an operative position where the selected nozzle 146 is oriented vertically downward. In addition, when the nozzle holder 140 is rotated about its vertical axis by a nozzle rotating device including, as its drive source, the nozzle selecting/rotating servomotor 148, the nozzle 146 positioned at the operative position is rotated about its own axis line by an appropriate angle to correct an angular-position error of the CC 150 (FIG. 8) held by the nozzle 146. The angular-position error of the CC 150 means the difference of a current angular position of the CC 150 held by the selected nozzle 146, from a reference angular position of the same 150, as measured in a circumferential direction of the nozzle 146.

The correction of the angular-position error of the CC 150 is performed during a time duration when each rotary plate 60 is moved from the CC-image taking position to the CC mounting position. The changed angular position of the selected nozzle 146 is returned to its original position after the correction of the angular-position error of the CC 150, during a time duration when the rotary plate 60 is moved from the CC mounting position to the CC sucking position after the CC 150 is mounted on the PCB 20. Simultaneously, the current nozzle 146 is changed to another nozzle 146, as needed.

At two locations on the frame member 68 which correspond to the CC sucking and mounting positions, respectively, there are disposed two head elevating and lowering devices (not shown) including respective vertically movable members. The stationary cam 128 has two receiving grooves formed at two positions corresponding to the CC sucking and mounting positions, respectively. The two vertically movable members can be fitted or received in the two receiving grooves, respectively, such that each of the movable members is movable vertically up and down. Each vertically movable member has a horizontal groove which defines part of the cam groove 130 of the stationary cam 128 in the state in which the movable member is positioned at its uppermost position, i.e., is received in the corresponding receiving groove of the cam 128.

Each head elevating and lowering device additionally includes a drive device which elevates and lowers the corresponding vertically movable member. Each drive device has a motion converting mechanism including a cam and a cam follower, and utilizes the main servomotor 100 as its drive source in such a manner that the motion converting device converts the rotation of the servomotor 100 into the upward and downward movement of the corresponding movable member. Each head elevating and lowering device additionally includes a stroke-changing device which can change the stroke of upward and downward movement of the corresponding movable member, i.e., the corresponding CC-holding head 64, based on, e.g., the height dimension of the CC 150 to be mounted.

When each rotary plate 60 is rotated to arrive at the CC sucking position, the cam-follower rollers 126 of the CC-holding head 64 of the rotary plate 60 transfer to the horizontal groove of the vertical movable member of the head elevating and lowering device disposed at the position corresponding to the CC sucking position. Subsequently, the movable member is moved vertically downward and then upward, so that the elevator member 124 of the head 64 is moved down and up. Thus, the head 64 picks up the CC 150 from the CC supplying system 12. Similarly, when each rotary plate 60 is rotated to arrive at the CC mounting position, the cam-follower rollers 126 of the CC-holding head 64 transfer to the horizontal groove of the vertical movable member of the other head elevating and lowering device disposed at the position corresponding to the CC mounting position. Subsequently, the movable member is moved vertically downward and then upward, so that the elevator member 124 of the head 64 is moved down and up. Thus, the head 64 mounts the CC 150 on the PCB 20 supported by the CC carrying device 16. A switching device 160 which is provided on each CC-holding head 64 is mechanically switchable to supply a negative pressure to, and cut the same from, the selected nozzle 146. Two switching-device operating devices (not shown) are provided at two locations of the main members 68, 69 of the CC mounting device 14 which correspond to the CC sucking and mounting positions, respectively. Each switching-device operating device mechanically operates or switches the corresponding switching device 160 when the corresponding CC-holding head 64 is moved down and up. Each switching device 160 is supplied with the negative pressure from a vacuum source (not shown) via a hose, a rotary valve, etc. (not shown). The nozzle selecting/rotating servomotor 148 is supplied with electric power from a power source (not shown) via a non-contact-type electric-power supplying device (not shown).

Hereinafter, the CC supplying system 12 will be described.

Figure 5:
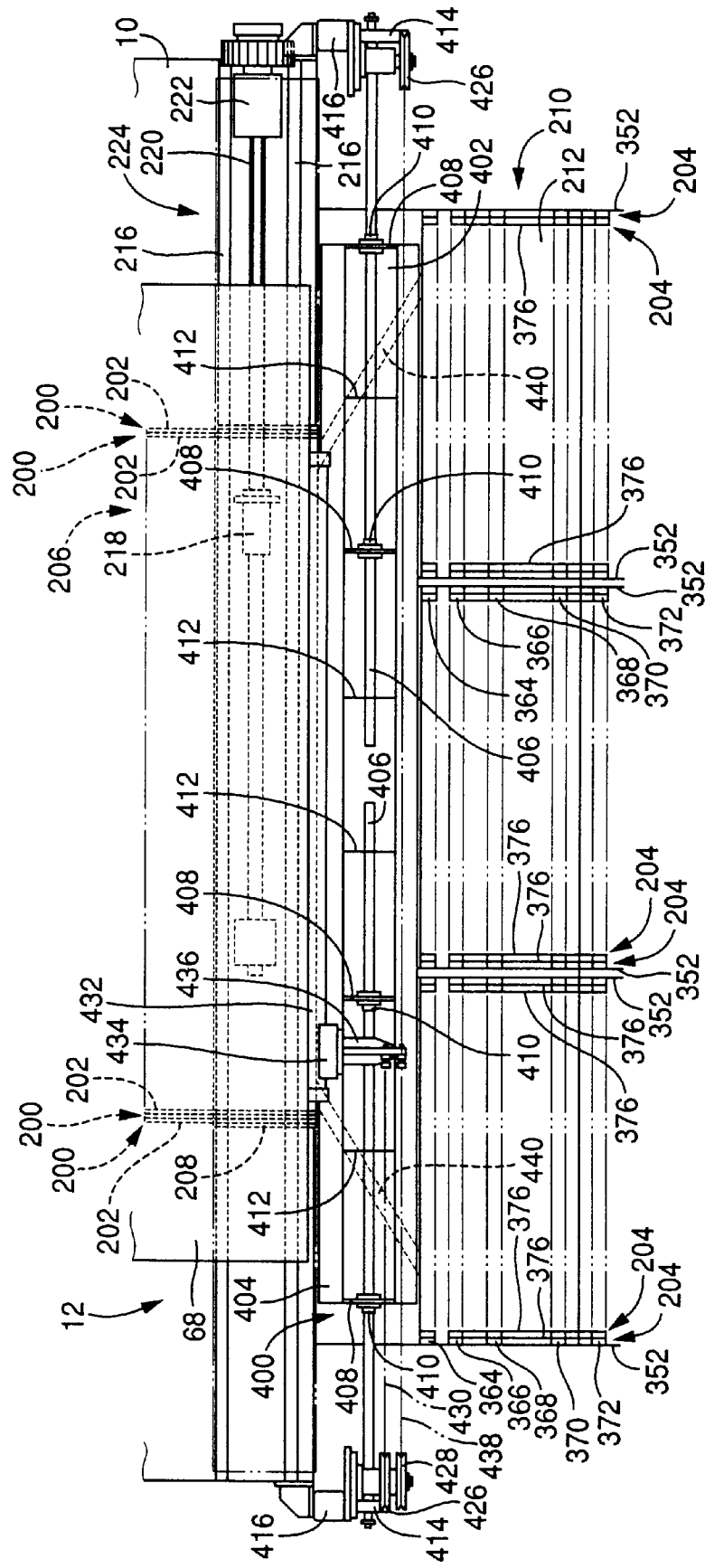
FIG. 5 is a plan view of the CC supplying system of FIG. 1.
Figure 6:
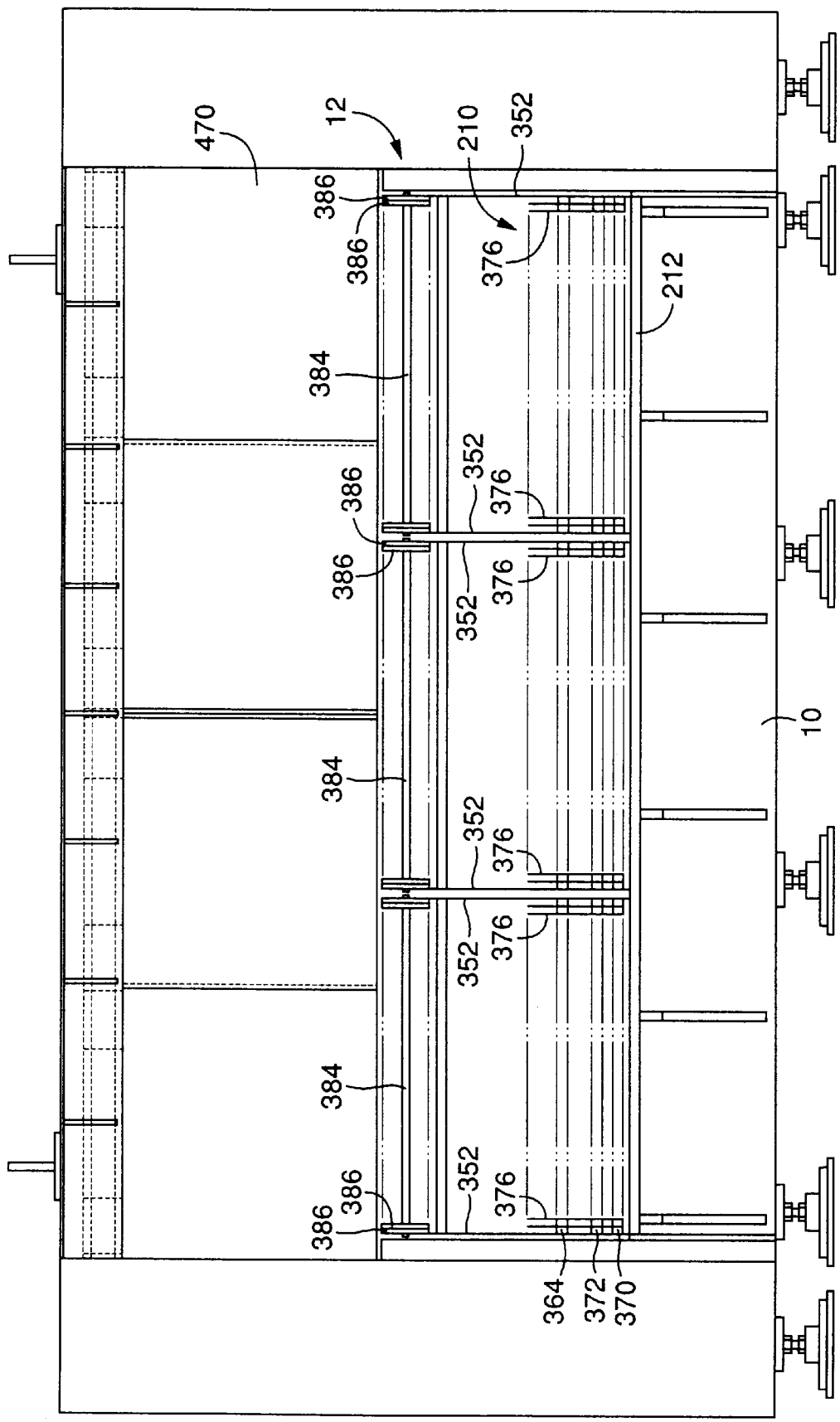
FIG. 6 is a front elevation view of the CC mounting system of FIG. 1, showing the CC supplying system thereof.

As shown in FIG. 5, the CC supplying system 12 includes a plurality of CC supplying units 200 each of which includes a tape feeding device 202 and a tape holding device 204 which are separate from each other. Three groups 206 of the respective tape feeding devices 202 of the CC supplying units 202 are supported on a first support member 208, and three groups 210 of the respective tape holding devices 204 of the units 202 are supported on a second support member 212 (FIG. 6).

As shown in FIG. 5, the first support member 208 has an elongate shape extending parallel to the X-axis direction, and is supported on the base member 10 such that the first support member 208 is movable in the X-axis direction on a pair of linear guide rails 216 as a pair of guide members which are provided on the base member 10. A nut 218 is fixed to the first support member 208, and is threadedly engaged with a ball screw 220 as a sort of feeding screw which is attached to the base member 10 such that the ball screw 220 is rotatable about an axis line parallel to the X-axis direction and is not movable in an axial direction thereof. When the ball screw 220 is rotated by a first-support-member moving servomotor 222, the first support member 208 is moved in the X-axis direction.

The tape feeding devices 202 are attached to the first support member 208 such that respective CC-supply portions of the devices 202 are arranged along a straight line parallel to the X-axis direction. When the first support member 208 is moved, the CC-supply portion of an appropriate one of the tape feeding devices 202 or the CC supplying units 200 is selected and positioned at a CC supplying position right below the CC-holding head 64 being positioned at the CC sucking position of the CC mounting device 14. The nut 218, the ball screw 220, the first-support-member moving servomotor 222, and other members cooperate with one another to provide a first-support-member moving device 224.

Each tape feeding device 202 draws, out of the corresponding tape holding device 204, a CC carrier tape 242 (FIG. 7) carrying a number of CCs 150, and feeds the carrier tape 242 at a regular feeding pitch in a lengthwise direction of the tape 242. The CC carrier tape 242 includes a CC accommodating tape 244 (FIG. 8) having a number of CC accommodating pockets (not shown) which are formed at the same pitch as the feeding pitch in a lengthwise direction of the tape 244 and in each of which one CC 150 is accommodated. The CC carrier tape 242 additionally includes a cover tape 246 (FIG. 8) which covers respective upper openings of the CC accommodating pockets. Thus, the CC carrier tape 242 is provided by the CCs 150 and the two tapes 244, 246. The CC carrier tape 242 has a constant thickness, and its bottom surface is widthwise entirely supported by a support surface of a main member 250 of the CC feeding device 202.

Figure 8:
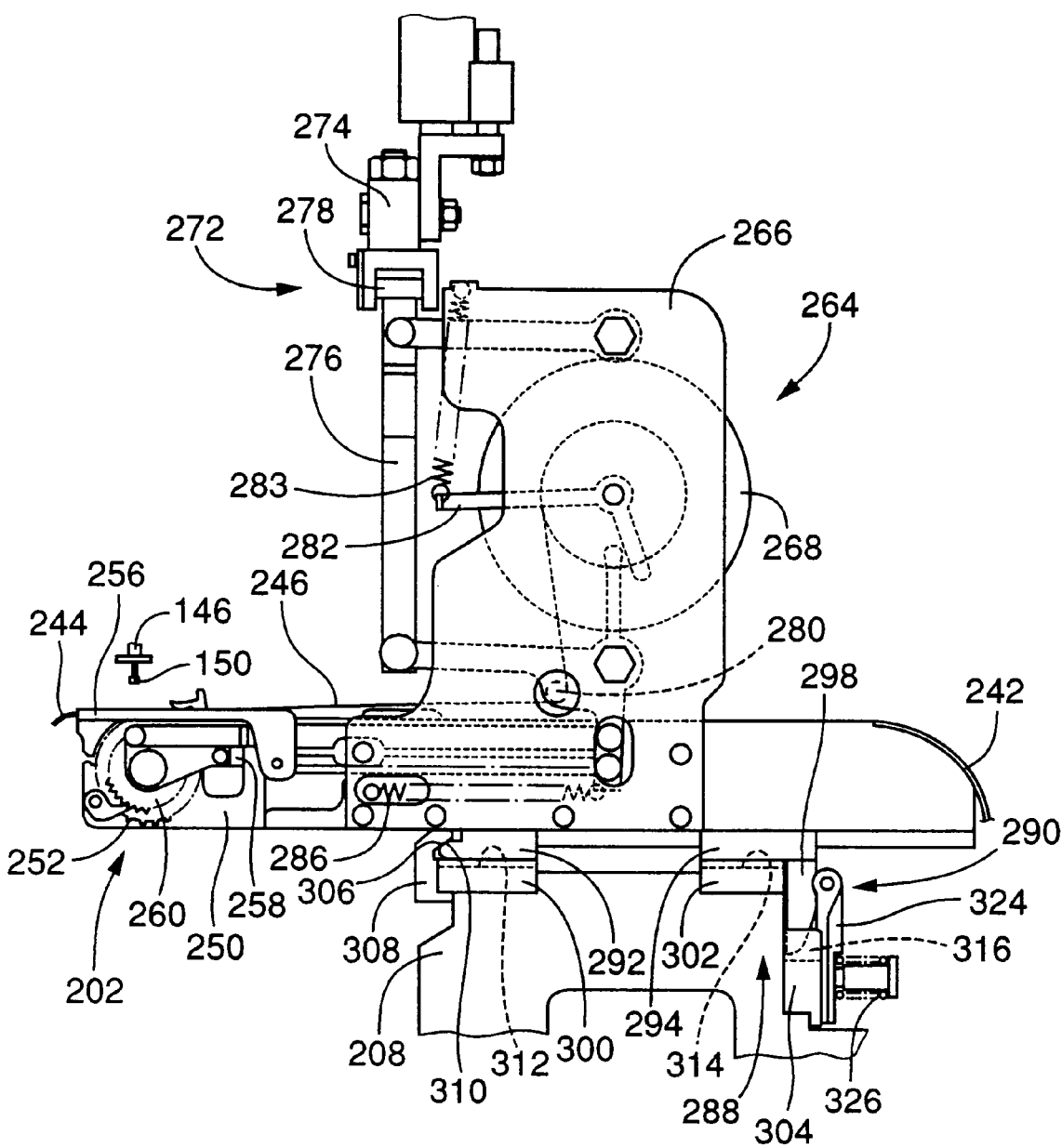
FIG. 8 is a side elevation view of a tape feeding device as an element of the CC supplying system of FIG. 1.

The main member 250 of each CC feeding device 202 has a generally elongate, plate-like shape. The CC accommodating tape 244 has a number of tape-feed holes or perforations which are engageable with teeth of a sprocket 252 (FIG. 8). As shown in FIG. 8, the tape feeding device 202 feeds the CC carrier tape 242 together with a cover member 256 frontward. However, when the feeding device 202 moves the cover member 256 rearward, the feeding device 202 does not move the tape 242 and prepares for the next feeding of the tape 242. More specifically described, the feeding device 242 causes a ratchet pawl 258 (FIG. 8) to move over the teeth of a ratchet wheel 260. The CC feeding device 202 includes a cover-tape take-up device 264 which takes up the cover tape 246 and which is attached to the main member 250 via a bracket 266. The take-up device 264 includes a take-up reel 268 which does not rotate and accordingly does not take up the cover tape 244, when the CC carrier tape 242 is fed, and rotates and accordingly takes up the cover tape 244, when the tape feeding device 202 prepares for the next tape-feeding action.

The tape feeding device 202 including the cover-tape take-up device 264 is driven by a driving device 272 which utilizes the main servomotor 100 as its drive source. The driving device 272 includes a driving member 274 which is provided at the CC sucking position of the CC mounting device 14 such that the driving member 274 is movable up and down; and a motion converting device (not shown) which includes a cam, a cam follower, etc. and which converts the rotation of the main servomotor 100 into the upward and downward movement of the driving member 274, which causes a driving lever 276 to move up and down. Thus, the feeding device 202 including the take-up device 264 is operated.

When the driving member 274 is moved down and an engaging roller 278 (FIG. 8) is engaged with a driving lever 276, the driving lever 276 is moved down, which causes the cover member 256 to be moved rearward, and the tape feeding device 202 prepares for the next tape-feeding action. In addition, a take-up lever 282 of the take-up device 264 is rotated by a biasing force of a tension coil spring 283, which causes the take-up reel 268 to be rotated while peeling and taking up a one-pitch length of the cover tape 246 from the CC-accommodating tape 244. In addition, a movable guiding roller 280 attached to the driving lever 276 is moved downward, so that the distance between the guiding roller 280 and the take-up reel 268 is increased and accordingly a certain length of the cover tape 246 is taken up by the reel 268.

On the other hand, when the driving member 274 is moved up, the driving lever 276 is moved up by a biasing force of a tension coil spring 286 to follow the upward movement of the driving member 274, so that the ratchet wheel 260, and the sprocket 252 which is attached to the wheel 260 such that the sprocket 252 is not rotatable relative to the wheel 260, are rotated. Since the CC carrier tape 242 is engaged with the teeth of the sprocket 252 via the perforations of the CC-accommodating tape 244, the carrier tape 242 is moved frontward by one pitch equal to the regular interval of the CC-accommodating pockets of the CC-accommodating tape 244. Consequently the leading one of the CCs 150 from which the cover tape 246 has been removed is fed to a CC-pick-up position which is prescribed in the CC-supply portion corresponding to one end portion of the main member 250 in a lengthwise direction thereof. When the leading CC 150 is fed to the CC-pick-up position, the take-up reel 268 of the take-up device 264 is not rotated but the movable guiding roller 280 is moved upward, so that the distance between the guiding roller 280 and the take-up reel 268 is decreased and accordingly a certain length of the cover tape 246 which has been taken up is delivered or fed out. Thus, the carrier tape 242 is allowed to move frontward by one pitch, together with the cover member 256.

A tape-feeding direction in which the CC carrier tape 242 is fed is parallel to the lengthwise direction of the main member 250 of each CC feeding device 202, i.e., a front-rear direction of the feeding device 202. A direction of thickness of the feeding device 202 will be referred to as the left-right or widthwise direction thereof. Since the feeding of the CC carrier tape 242 and the taking up of the cover tape 246 are not relevant to the present invention, more detailed description thereof is omitted.

As shown in FIG. 1, a CC-accommodating-tape treating device 284 is provided, on the support plate 69, at a position corresponding to the CC sucking position. The treating device 284 includes a cutter which cuts, into small pieces, the CC-accommodating tape 244 from which the CCs 150 have been picked up, and a vacuum device which applies a negative pressure to the cut small pieces and collects them. Each time one CC 150 is supplied and the carrier tape 242 is fed one pitch, the treating device 244 cuts off a one-pitch length of the tape 244.

Each tape feeding device 202 is attached to the first support member 208, using an attaching device 290, and is positioned by a positioning device 288. The positioning device 288 and the attaching device 290 have respective constructions similar to those of the positioning device and the attaching device disclosed in U.S. Pat. No. 5,658,122, and are briefly described below.

As shown in FIG. 8, each positioning device 288 includes two first positioning projections 292, 294 which are provided, on a bottom surface of the main member 250, at two locations which are distant from each other in the front-rear direction of the CC feeding device 202; a second positioning projection 298 which projects from the rear first positioning projection 294, in a direction perpendicular to the main member 250; two first positioning plates 300, 302 which are fixed to front and rear portions of an upper surface of the first support member 208, respectively, such that the two first positioning plates 300, 302 extend parallel to the X-axis direction; a second positioning plate 304 which is fixed to a rear surface of the first support member 208 at a position lower than that of respective upper surfaces of the two first positioning plates 300, 302, such that the second positioning plate 304 extends parallel to the X-axis direction; a first inclined surface 306 which is formed in an upper portion of a front end portion of the front first positioning member 292 and which is inclined frontward and downward; and a second inclined surface 310 which is formed in a stopper plate 308 fixed to a front surface of the first support member 208 and which is inclined frontward and downward at an angle equal to the angle of inclination of the first inclined surface 306. The front surface of the first support member 208 is nearer to the CC mounting device 14 than the rear surface thereof. Each of the two first positioning plates 300, 302 has a number of first positioning grooves 312, 314, and the second positioning plate 304 has a number of second positioning grooves 316, at a regular pitch at which the tape feeding devices 202 are attached to the first support member 208. However, since the tape feeding devices 202 may have different widths, the distance between one pair of adjacent feeding devices 202 may differ from that of another pair of adjacent feeding devices 202. The first positioning grooves 312, 314 extend parallel to the front-rear direction of the feeding device 202, i.e., the Y-axis direction.

Each attaching device 290 includes the above-described second positioning projection 298; the above-described first and second inclined surfaces 306, 310; an engaging lever 324 which is attached to the first support member 208 at a position corresponding to one of the second positioning grooves 316 of the second positioning plate 304, such that the engaging lever 324 is pivotable relative to the second positioning plate 304; and a compression coil spring 326 as a biasing device which biases the engaging lever 324 toward the second positioning plate 304. The first support member 208 supports a number of the engaging levers 324 corresponding to a number of the second positioning grooves 316, respectively.

When the tape feeding device 202 is attached to the first support member 208, first, the feeding device 202 is tilted such that its front half portion is lower than its rear half portion, next a front end portion of the front first positioning projection 292 is fitted in one of the front first positioning grooves 312, and then the feeding device 202 as a whole is moved frontward till the first inclined surface 306 engages the second inclined surface 310. Subsequently, the feeding device 202 as a whole is placed down on the first support member 208. Thus, the two first positioning projections are fitted in the one front first positioning groove 312 and a corresponding rear first positioning groove 314, respectively, and the second positioning projection 298 enters a space between the first support member 208 and a corresponding engaging lever 324, while rotating the one engaging lever 324 against a biasing force of a corresponding compression coil spring 326, so that the second positioning projection 298 is fitted in a corresponding second positioning groove 316.

Since the first and second positioning projections 292, 294, 298 are fitted in the first and second positioning grooves 312, 314, 316, respectively, the tape feeding device 202 is positioned in its widthwise direction. In addition, since the first and second inclined surfaces 306, 310 are engaged with each other, the feeding device 202 is positioned in its lengthwise (i.e., front-rear) direction. Moreover, since the engaging lever 324 is engaged with the second positioning projection 298, the first inclined surface 306 is pressed against the second inclined surface 310, so that the main member 250 is pressed against the front first positioning plate 300 because of the inclination of the surfaces 306, 310 engaged with each other. Furthermore, the engagement of the engaging lever 324 with the second positioning projection 298 produces an angular moment which causes the main member 250 to be pressed against the rear first positioning plate 302. Thus, the tape feeding device 202 is effectively prevented from moving out of position and is securely attached to the first support member 208.

Next, the tape holding devices 204 will be described.

Figure 7:
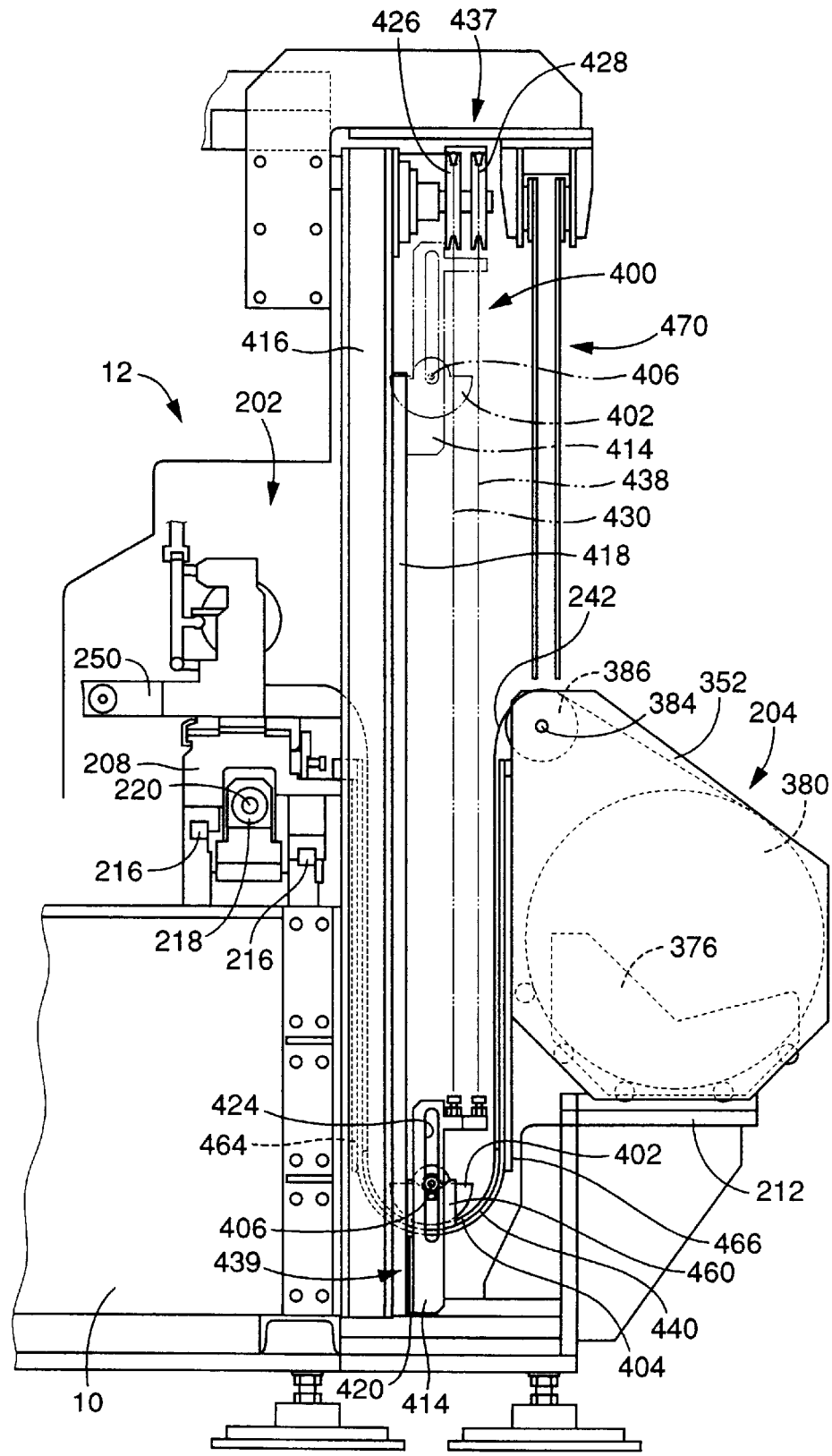
FIG. 7 is a side elevation view of the CC supplying system of FIG. 1.

As shown in FIGS. 5 and 7, the second support member 212 is elongate, and is fixed to the base member 10 such that the elongate second support member 212 extends parallel to the X-axis direction in which the first support member 208 is movable. The plurality of tape holding devices 204 supported on the second support member 212 consist of three groups of devices. Three pairs of support plates 352 are fixed to the second support member 212 such that each pair of support plates 352 are distant from each other in the X-axis direction and such that the three pairs of support plates 352 are juxtaposed with one another in the X-axis direction. Each pair of support plates 352 cooperate with each other to support five support shafts 354, 356, 358, 360, 362 (FIG. 9) such that the five support shafts 354–362 extend parallel to the X-axis direction and are spaced from one another in the Y-axis direction and such that those support shafts 354–362 take different height positions. A number of support rollers 364 are fitted on the support shaft 354, such that each of the support rollers 364 is rotatable about the support shaft 354. Similarly, a number of support rollers 366, 368, 370, 372 are fitted on each of the other support shafts 356–362, such that the number of support rollers 366–372 are rotatable about the each support shaft 356–362.

Figure 9:
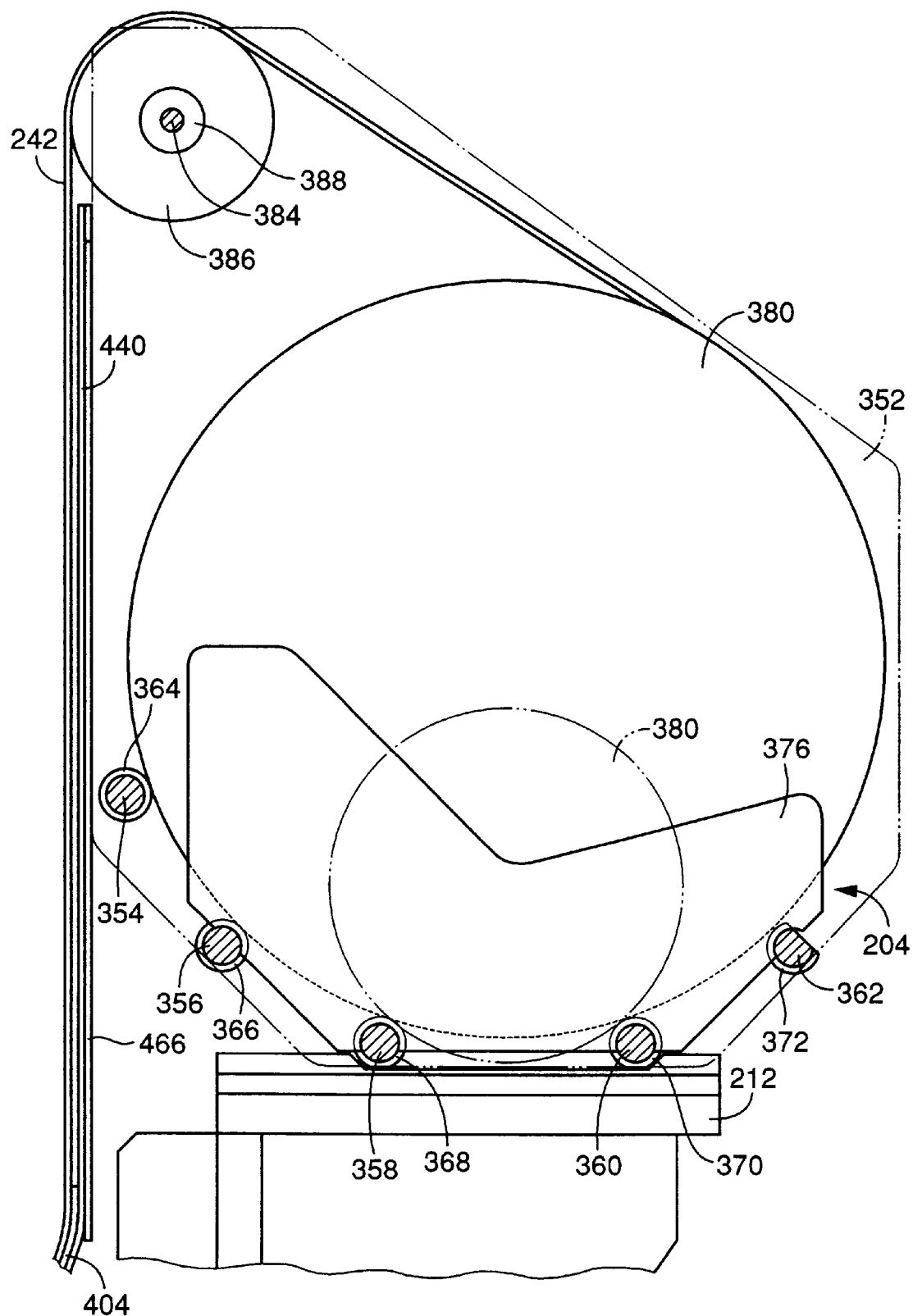
FIG. 9 is a side elevation view of a tape holding device as another element of the CC supplying system of FIG. 1.

Each of a plurality of partition plates 376 is provided between a corresponding pair of adjacent support rollers 364, a corresponding pair of adjacent support rollers 366, a corresponding pair of adjacent support rollers 368, a corresponding pair of adjacent support rollers 370, and a corresponding pair of adjacent support rollers 372. As shown in FIG. 9, each partition plate 376 is fitted on the four support shafts 356, 358, 360, 362. Each CC carrier tape 242 is wound around a tape reel 380. The tape reel 380 includes an axis portion around which the carrier tape 242 is wound and which has a circular cross section, and two flange portions which radially outwardly extend from axially opposite ends of the axis portion. The tape reel 380 is accommodated in a space between each pair of adjacent partition plates 376, and is supported on the five support rollers 364–372 such that the reel 380 is rotatable about an axis line parallel to the X-axis direction. The five support rollers 364–372 have different positions in the Y-axis direction, and different height positions in a Z-axis direction perpendicular to the X-axis and Y-axis directions. Thus, the support rollers 364–372 can support different sorts of tape reels 380 having different widths and different diameters. In FIG. 5, the CC carrier tapes 242 and the tape reels 380 are not shown for easier understanding purposes only.

Figure 10:
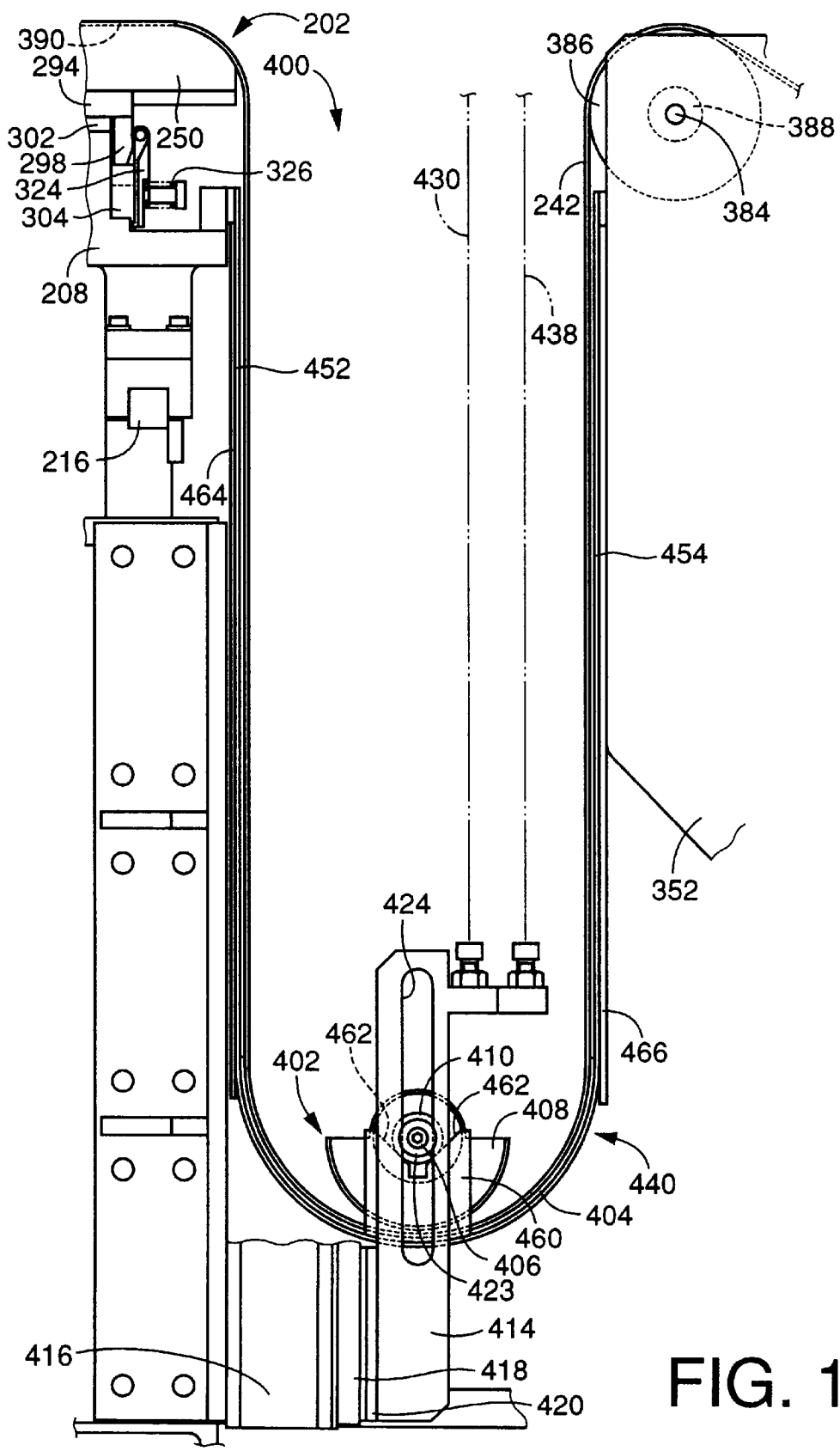
FIG. 10 is a side elevation view of a tape-curve keeping device as another element of the CC supplying system of FIG. 1.

Each support plate 352 is larger than a tape reel 380 having the greatest diameter of the respective diameters of all sorts of tape reels 380 that can be used on the second support member 212. As shown in FIG. 10, the top end of each support plate 352 is substantially level with the main member 250 of each CC feeding device 202. Each pair of support plates 352 cooperate with each other to support a support shaft 384 extending parallel to the X-axis direction. A number of guide rollers 386 are fitted on the support shaft 384 via respective bearings 388 such that each one of the guide rollers 386 is rotatable about the shaft 384 independent of the other rollers 386. The total number of the guide rollers 386 is greater than that of the tape reels 380. The guide rollers 386 are attached to the support shaft 384 such that the rollers 386 are close to each other in a direction parallel to an axis line about which they are rotatable. The CC carrier tape 242 drawn out of each tape reel 380 is first wound on the guide rollers 386, subsequently is placed on an upper surface of a rear end portion of the main member 250 of the tape feeding device 202, and then is introduced into a guide groove 390 (FIG. 10) which has a rectangular cross section and which extends from the rear end portion to a front end portion of the main member 250. Each pair of adjacent partition plates 376, the five support rollers 364–372, and the guide rollers 386 cooperate with one another to provide one tape holding device 204; the guide rollers 386 provide a tape outlet of the tape holding device 204; and an opening of the guide groove 390 located on the side of the tape holding device 204 provides a tape inlet of the tape feeding device 202. The top of each guide roller 386 is level with the guide groove of the main member 250 of each tape feeding device 202, so that the tape outlet is level with the tape inlet and the tape reel 380 is provided at a position lower than that of the tape outlet.

The width of each tape feeding device 202 is smaller than that of each tape holding device 204, and the total number of the tape feeding devices 202 that can be attached to the first support member 208 is equal to that of the tape holding devices 204 that are provided on the second support member 212. However, a dimension of each group of tape feeding devices 206 attached to the first support member 208 as measured in a direction in which the respective CC-supply portions of the devices 206 are arranged, is smaller than that of each group of tape holding devices 210 attached to the second support member 212 as measured in the same direction, and the first support member 208 is smaller than the second support member 212.

As shown in FIGS. 5 and 7, a tape-curve keeping device 400 is provided between the first and second support members 208, 212. The tape-curve keeping device 400 includes a tape hold-down member 402 and a tape support member 404.

Figure 11:
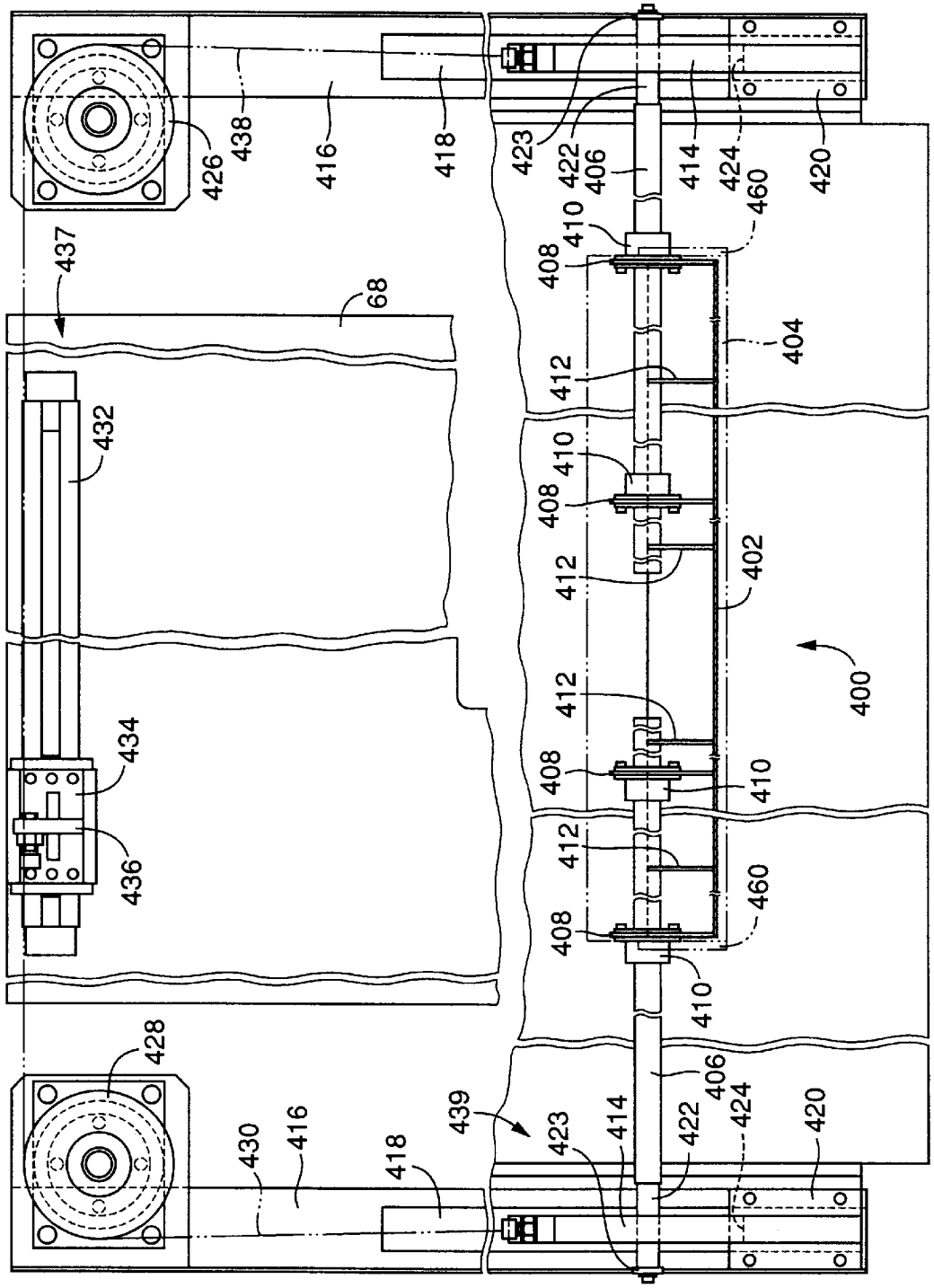
FIG. 11 is a front elevation view of the tape-curve keeping device of FIG. 10.

As shown in FIGS. 5 and 10, the tape hold-down member 402 is an elongate member which has a downwards convex, semi-cylindrical lower surface and which extends parallel to the X-axis direction along a horizontal plane. Two support shafts 406 cooperate with each other to support the tape hold-down member 402. As shown in FIG. 11, the hold-down member 402 has four ribs 408 at lengthwise opposite ends thereof and two positions intermediate between the two ends, respectively, such that each rib 408 extends perpendicularly to the lengthwise direction of the hold-down member 402. A boss member 410 is fixed to each rib 408 such that the boss member 410 is oriented parallel to the lengthwise direction of the hold-down member 402. Each support shaft 406 extends through the corresponding two boss members 410, such that the two boss members 410 are movable relative to the each support shaft 406 in an axial direction of the shaft 406. Thus, the hold-down member 402 is movable relative to the two support shafts 406 via the boss members 410. One or two second ribs 412 are provided between each pair of adjacent first ribs 408. Each of the second ribs 412 has a U-shaped cross section and accordingly does not interfere with the corresponding support shaft 406. In FIG. 11, the first and second ribs 408, 412 and the boss members 410 are not cross-sectioned.

As shown in FIG. 11, one end portion of each support shaft 406 is fitted in a corresponding elevator member 414, such that the each support shaft 406 is movable relative to the elevator member 414 in a vertical direction. Each of the two elevator members 414 is supported by the base member 10 such that the elevator member 414 is movable up and down. As shown in FIGS. 5 and 11, two column members 416 vertically project from the base member 10 at two positions which are distant from each other in the X-axis direction. A linear guide rail 418 as a guide member is fixed to a surface of each column member 416 which faces the tape holding devices 204, such that the guide rail 418 vertically extends. A guide block 420 as a guided member which is fixed to each elevator member 414 is fitted on the corresponding guide rail 418, such that the each elevator member 414 is movable up and down. Thus, each pair of guide rail and block 418, 420 provides a linear guide device. Each guide block 420 has a plurality of circulatable balls, and is fitted on the corresponding guide rail 418 via the balls such that the each guide block 420 is vertically guided by the guide rail 418 while being prevented by the balls from moving in a widthwise direction thereof and coming off the guide rail 418.

Each of the two elevator members 414 has a vertical elongate hole 424, and one end portion 422 of each of the two support shafts 406 is fitted in the elongate hole 424 of the corresponding elevator member 414 such that the each support shaft 406 is movable relative to the elevator member 414 in a vertical direction and an axial direction thereof. The diameter of the end portion 422 of each support shaft 406 is slightly smaller than that of the width of each elongate hole 424, and the diameter of the remaining portion of each support shaft 406 other than the end portion 422 thereof is greater than that of the elongate hole 424. The length of the end portion 422 of each support shaft 406 as measured in a direction parallel to the axis line of the support shaft 406 is greater than the dimension of the elevator member 414 as measured in the same direction, and accordingly the each support shaft 406 can be tilted relative to the elongate hole 424 of the elevator member 414. A disc-like stopper member 423 whose diameter is greater than the width of the elongate hole 424 is fixed to a free end of the end portion 422 of each support shaft 406, so that the each support shaft 406 is prevented from coming off the corresponding elevator member 414.

As shown in FIGS. 5, 7, and 11, a first pulley 426 is attached to an upper end portion of each of the two column members 416, such that the first pulley 426 is rotatable about an axis line parallel to the Y-axis direction. As shown in FIG. 5, the two first pulleys 426 are not aligned with each other in the Y-axis direction. A second pulley 428 is attached to an axis member such that the second pulley 428 and one of the two first pulleys 426 are rotatable thereabout, and such that the second pulley 428 is aligned with the other first pulley 426 in the Y-axis direction.

As shown in FIGS. 5 and 11, one end portion of a wire 430 is fixed to one elevator member 414 which is vertically movable relative to one column member 416 to which the first and second pulleys 426, 428 are attached. This wire 430 is wound on that first pulley 426 such that a vertical portion of the wire 430 starting from the elevator member 414 is directed by the first pulley 426 to a horizontal portion of the wire 430, which is then secured to a bracket 436 fixed to a movable member 434 of a rodless air-cylinder device 432 as a sort of fluid-pressure-operated cylinder device as a drive source.

The rodless air-cylinder device 432 which does not have a piston rod is attached to a vertical side surface of the frame member 68 as one of the main members 68, 69 of the CC mounting device 14, such that the rodless cylinder 430 extends parallel to the X-axis direction. That vertical side surface of the frame member 68 faces the CC supplying system 12. The rodless cylinder 430 includes a movable portion which is integral with a piston thereof and which air-tightly projects out of a housing thereof, and the movable member 434 is fixed to the movable portion. Thus, when the movable portion of the rodless cylinder 430 is moved in the X-axis direction, the movable member 434 is moved in the same direction while being guided by a guide rail.

One end portion of a second wire 438 is fixed to the other elevator member 414. The second wire 438 is wound on the other first pulley 426 such that a vertical portion of the wire 438 starting from the other elevator member 414 is directed by the other first pulley 426 to a first horizontal portion of the wire 438, which is then wound around the second pulley 428 and is directed by the same 428 to a second horizontal portion of the wire 38 which extends parallel to the first horizontal portion and is secured to the bracket 436 fixed to the movable member 434 of the rodless cylinder 432.

Therefore, when the movable member 434 is moved rightward in FIGS. 5 and 11, the two elevator members 414 are simultaneously moved up by the same distance; and when the movable member 434 is moved leftward, the two elevator members 414 are simultaneously moved down by the same distance. Thus, the two support shafts 406 are moved up and down while being supported by the two elevator members 414, respectively, and the tape hold-down member 402 is moved up and down between its lowermost position, indicated in solid lines in FIG. 7, which is lower than a straight line or a plane connecting between the tape outlet of each tape holding device 204 and the tape inlet of the corresponding tape feeding device 202, and its uppermost position, indicated in two-dot chain lines, which is higher than the straight line or the plane. The pair of elevator members 414 are provided so that the tape hold-down member 402 is positioned between the tape inlet and the tape outlet in a direction perpendicular to the direction of movement of the first support member 208, i.e., in a direction in which the first and second support members 208, 212 are spaced from each other. Thus, the tape hold-down member 402 is symmetrical with respect to a vertical plane which is parallel to the straight line along which the respective CC-supply portions of the tape feeding devices 202 are arranged, and which is positioned between the tape inlet and the tape outlet in the direction in which the first and second support members 208, 212 are spaced from each other. The tape hold-down member 402 is movable up and down at a position intermediate between the tape inlet and outlet.

The wires 430, 438, the first and second pulleys 426, 428, and the rodless cylinder 432 cooperate with one another to provide a synchronism elevating and lowering device 437, which cooperates with the elevator members 414 to provide a tape-hold-down-member elevating and lowering device 439.

As shown in FIGS. 5 and 10, the tape support member 404 is an elongate member which has a downwards convex, semi-cylindrical upper surface and which extends parallel to the X-axis direction along a horizontal plane. As shown in FIG. 5, the tape support member 404 has substantially the same length as that of the tape hold-down member 402, and is hung from the first and second support members 208, 212, using two flat belts 440 formed of a synthetic resin.

As shown in FIG. 10, one end portion of each of the two flat belts 440 is attached to the first support member 208 such that the one end portion is pivotable relative to the first support member 208, and the other end portion of each flat belt 440 is attached to a plate-like restricting member 466 fixed to the second support member 212, such that the other end portion is pivotable relative to the second support member 212. The restricting member 466 is fixed to three members (not shown) each of which is fixed to respective portions of the corresponding pair of support plates 352 which portions are located on the side of the first support member 208. That is, the other end portions of the flat belts 440 are pivotably fixed to the second support member 212 via the support plates 352 and the restricting member 466. That is, it can be said that the tape support member 404 is hung from not only the first support member 208 but also the second support member 212. The restricting member 466 will be described in more detail later. In addition, respective intermediate portions of the two flat belts 440 are pivotably attached to the lower (outer) surface of the tape support member 404.

Figure 13:
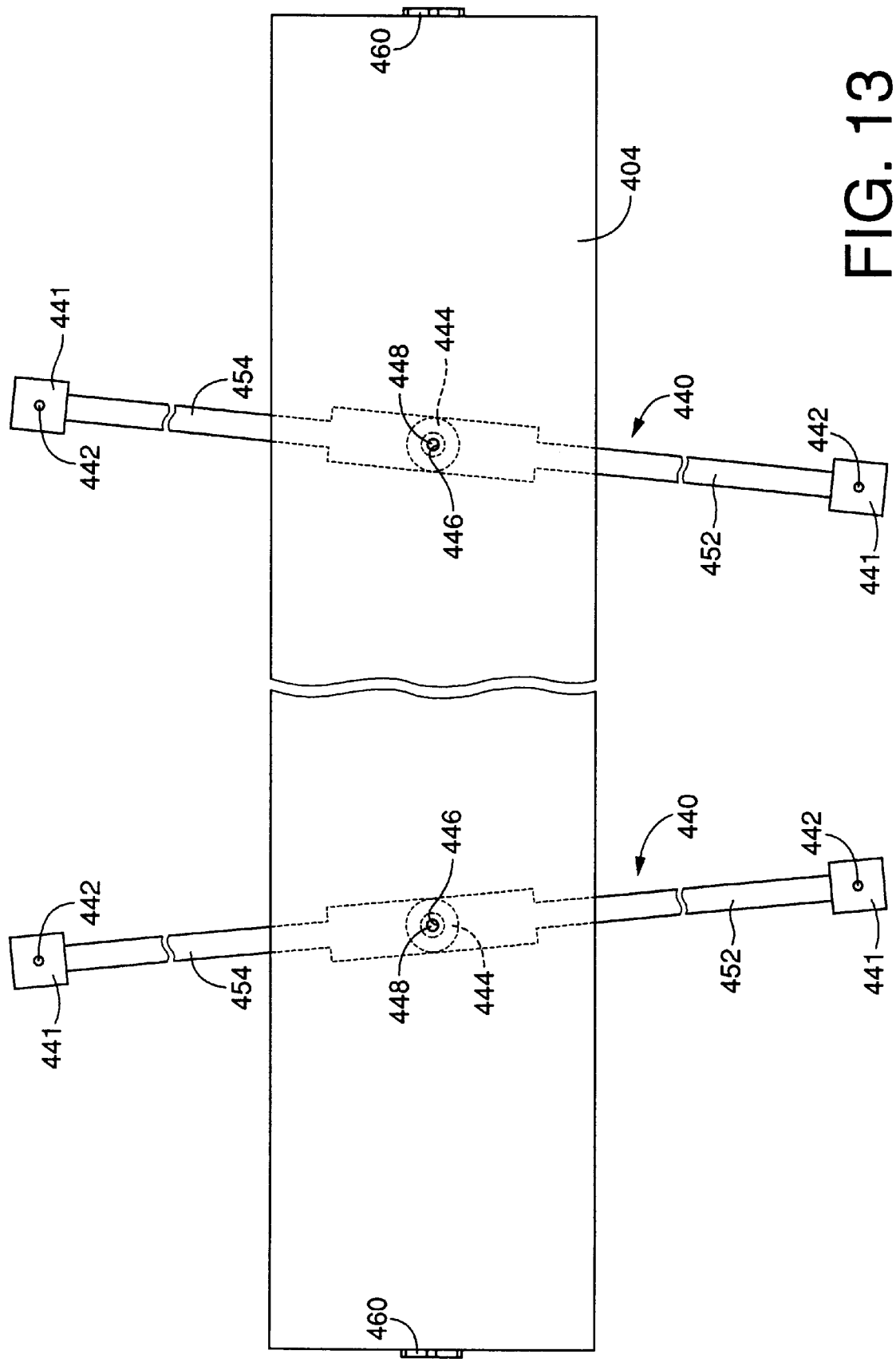
FIG. 13 is an exploded view of the tape support member and the flat belts.

As shown in FIG. 13, two thin reinforcing members 441 formed of a metal are attached to lengthwise opposite end portions of each flat belt 440, respectively. Each reinforcing member 441 is attached to one of opposite surfaces of the corresponding flat belt 440 which is not contacted with the first support member 208 or the restricting member 466. A pin hole 442 is formed through each reinforcing member 441 and the corresponding flat belt 440. A pin (not shown) is inserted in each pin hole 442, so that each of the opposite end portions of each flat belt 440 is pivotable about a horizontal axis line perpendicular to the straight line along which the tape feeding devices 202 are arranged. A second thin reinforcing member 444 is attached to a lengthwise middle portion of each flat belt 440. The second reinforcing member 444 is attached to one of opposite surfaces of the flat belt 440 which is not contacted with the tape support member 404. A pin hole 446 is formed through each reinforcing member 444 and the corresponding flat belt 440. A pin 448 is inserted in each pin hole 446, so that the intermediate portion of each flat belt 440 is pivotable about a vertical axis line perpendicular to a lengthwise direction of the tape support member 404. An intermediate portion between the lengthwise middle portion of each flat belt 440 and each of the lengthwise end portions thereof has a width smaller than that of the middle and end portions. Thus, even if the middle or end portions of each flat belt 440 may not be sufficiently pivoted about the pin 448 or pins (not shown) because of, e.g., a large frictional resistance, the each flat belt 440 can easily be curved in a plane parallel to a widthwise direction of the belt 440.

Figure 12:
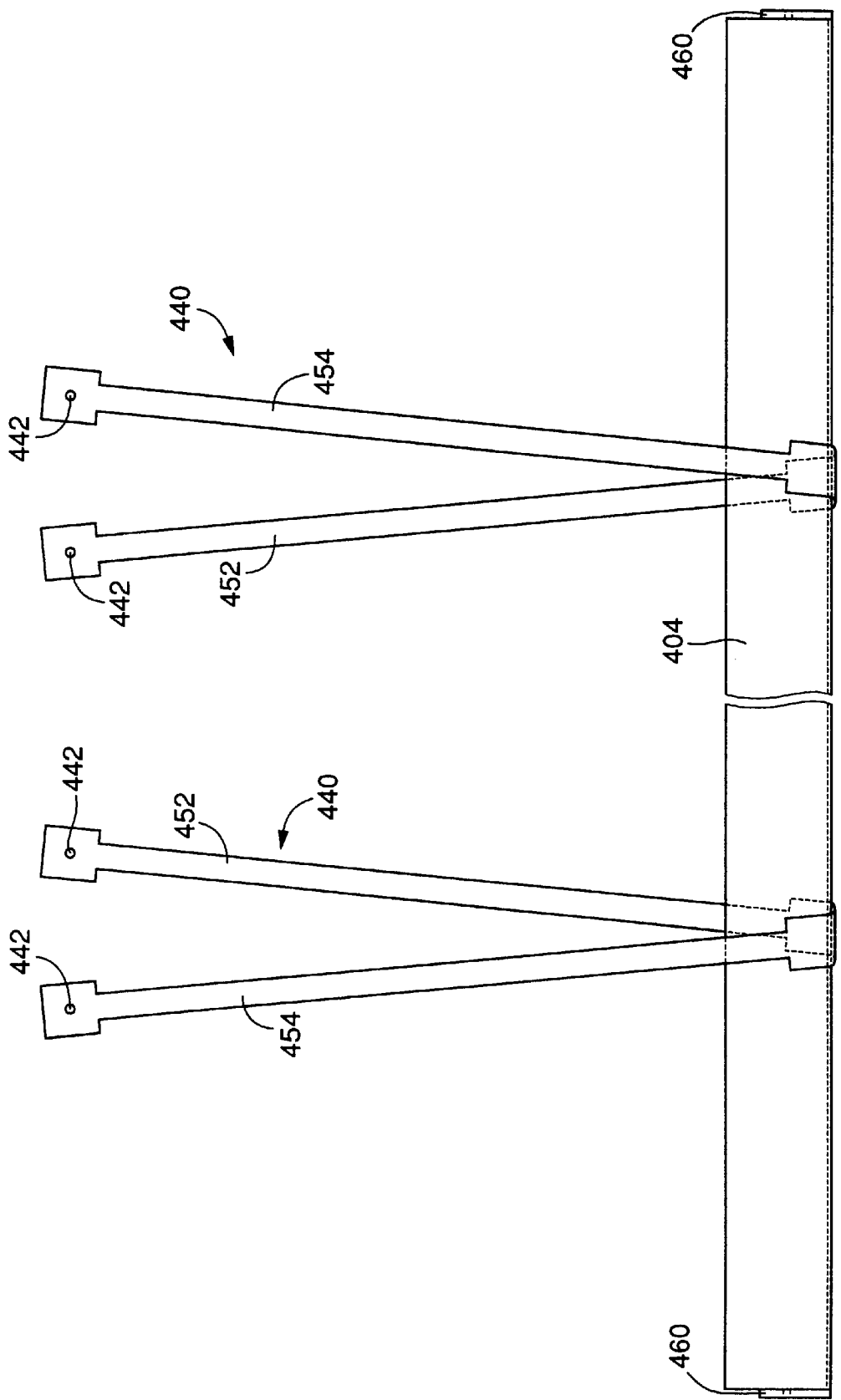
FIG. 12 is a front elevation view of a tape support member of the tape-curve keeping device of FIG. 10, showing the tape support member being hung using flat belts.

In the state, shown in FIG. 12, in which respective middle portions of the first and second support members 208, 212 as seen in the direction parallel to the straight line along which the respective CC-supply portions of the tape feeding devices 202 are arranged, are opposed to each other, a first hanging portion 452 of each flat belt 440 which hangs the tape support member 404 from the first support member 208, is inclined downward away from the middle portion of the first support member 208, and a second hanging portion 454 of the each flat belt 440 which hangs the tape support member 404 from the second support member 208, is inclined downward toward the middle portion of the second support member 212. Each first hanging portion 452 provides a first hanging member, and each second hanging portion 454 provides a second hanging member. As shown in FIG. 10, the first and second hanging portions 452, 454 are generally symmetric with each other with respect to a vertical plane positioned between the tape inlet and outlet in the direction parallel to the straight line along which the respective CC-supply portions of the tape feeding devices 202 are arranged, i.e., the direction in which the first and second support members 208, 212 are arranged. The tape support member 404 is provided between the tape inlet and outlet in the direction in which the first and second support members 208, 212 are arranged, and is accurately symmetric with respect to the same vertical plane.

The positions where the opposite end portions of each flat belt 440 are attached to the first and second support members 208, 212, respectively, in the direction parallel to the straight line along which the tape feeding devices 202 are arranged, and the angles at which the first and second hanging portions 452, 454 are inclined with respect to a vertical direction will be described later.

As shown in FIGS. 10 and 11, two tape-hold-down-member support members 460 are fixed to lengthwise opposite end portions of the tape support member 404, respectively. As shown in FIG. 10, each tape-hold-down-member support member 460 has a pair of support surfaces 462 which are inclined with respect to a vertical plane parallel to the lengthwise direction of the tape support member 460. When the elevator members 414 take their lowermost position, the lower ends of the elongate holes 424 thereof are positioned below the support surfaces 462 of the support members 460. Therefore, when the elevator members 414 are moved downward, the support shafts 406 are moved downward with the elevator members 414, while being supported on the bottom surfaces of the elongate holes 424 of the elevator members 414. Thus, the tape hold-down member 402 is moved downward. Before the elevator members 414 reach their lowermost position, the boss members 410 attached to the hold-down member 402 are received and supported on the support members 460. Then, only the elevator members 414 are further lowered, so that the tape hold-down member 402 is released from the elevator members 414. The two support surfaces 462 of each support member 460 are inclined symmetrically with each other. In the state in which the boss members 410 are engaged with the support surfaces 462, the tape hold-down member 402 is positioned relative to the support members 460 in all directions perpendicular to the lengthwise direction of the hold-down member 402, and is moved in all directions with the tape support member 404.

The tape feeding devices 202 are attached to the first support member 208 and the tape reels 380 are set in the tape holding devices 204, in the state in which the tape hold-down member 402 is positioned at its uppermost position. In addition, the first and second support members 208, 212 are positioned relative to each other such that the respective middle portions thereof are opposed to each other as indicated in solid lines in FIG. 5. The tape feeding devices 202 are positioned by the positioning devices 228, respectively, and are attached to the first support member 208 by the attaching devices 290, respectively, as described previously. Each tape reel 280 is set in a space between each pair of adjacent partition plates 376, and is rotatably supported by the support rollers 364–372. One end portion of the CC carrier tape 242 is drawn out of the tape reel 380, subsequently is wound on the guide rollers 386, and then is passed through a space under the tape hold-down member 402. The carrier tape 242 is then placed on the upper surface of the rear end portion of the main member 250 of the corresponding CC feeding device 202, and is inserted in the guide groove 390 formed in the main member 250. The CC accommodating tape 244 of the carrier tape 242 is engaged with the sprocket 252 of the feeding device 202, and the tape 242 is covered with the cover member 256. One end portion of the cover tape 246 is wound around the take-up reel 268.

After the CC carrier tapes 242 are set for all the tape feeding devices 202, the elevator members 414 are lowered and accordingly the tape hold-down member 402 is lowered. The hold-down member 402 is contacted with all the carrier tapes 242, so that the carrier tapes 242 are simultaneously drawn out of the tape reels 380. Consequently the carrier tapes 242 are pushed downward while being curved by the hold-down member 402.

When the elevator members 414 reach their lowermost position, the tape hold-down member 402 has already been released from the elevator members 414 and been received by the support members 460. In this state, a space is left between the tape hold-down member 402 and the tape support member 404. This space is more than three times greater than the thickness of the thickest carrier tape 242 of all sorts of carrier tapes 242 to be used with the CC supplying system 12. In the case where all the CC carrier tapes 242 to be used with the supplying system 12 have a generally constant thickness, the space left between the tape hold-down member 402 and the tape support member 404 may be greater than the constant thickness and smaller than twice the thickness. In this case, respective curved transferring portions of adjacent CC carrier tapes 242 would effectively be prevented from crossing each other or being entangled with each other when the carrier tapes 242 are fed forward. In contrast thereto, in the present embodiment, different sorts of carrier tapes 242 having different thick values are used with the CC supplying system 12. Hence, a sufficiently large space is provided between the hold-down member 402 and the support member 404, so that the large space allows three transferring portions of the thickest carrier tapes 242 to overlap one another without causing any problems. That is, even if the three transferring portions may overlap one another, those are prevented from being fixedly sandwiched between the two members 402, 404, and are assured of being smoothly fed forward. Respective middle portions of the U-shaped transferring portions of the CC carrier tapes 242 are supported on the tape support member 404, which leads to preventing the carrier tapes 242 from being endlessly drawn out of the tape reels 380 because of the weights of the transferring portions. In addition, the tape outlets and the tape inlets are level with each other and accordingly the U-shaped transferring portions of the carrier tapes 242 which are pendent between the tape outlets and inlets are generally symmetrical with respect to the vertical plane which is positioned between the outlets and inlets in the direction parallel to the straight line along which the CC-supply portions of the feeders 202 are arranged, and perpendicular to the direction of movement of the first support member 208, i.e., the direction in which the first and second support members 208, 212 are arranged. The respective middle portions of the transferring portions are positioned between the tape outlets and inlets in the direction in which the first and second support members 208, 212 are arranged. When the first support member 208 is moved relative to the second support member 212, those middle portions are moved by half the distance of movement of the first support member 208.

When the tape hold-down member 402 is lowered, the respective middle portions of the tape hold-down member 402 and the tape support member 404 are opposed to the middle portion of the second support member 212, i.e., take the same position in the direction parallel to the direction of movement of the first support member 208, i.e., in the lengthwise direction of the two members 402, 404. Therefore, the hold-down member 402 can fit in a space between the two support members 460 fixed to the tape support member 404. If the two members 402, 404 are not aligned with each other in the lengthwise direction thereof and accordingly the member 402 cannot fit in the space between the two members 460, the present CC supplying system 12 requires the operator to manually fit the member 402 between the two members 460. For facilitating this operation, it is preferred that the member 402 and/or the members 460 be provided with guide means for guiding the manual fitting of the member 402 in the space between the two members 460.

Midway when the elevator members 414 are moved upward, the elevator members 414 receive the support shafts 406 of the tape hold-down member 402, from the support members 460, and move the member 402 up.

As shown in FIG. 10, in addition to the plate-like restricting member 466 fixed to the second support member 212, another plate-like restricting member 464 is fixed to the first support member 208. The two restricting members 464, 466 are fixed to respective sides of the first and second support members 208, 212 which are opposed to each other, and each member 464, 466 extends parallel to the direction of movement of the first support member 208 and in a vertical direction. The first restricting member 464 is directly fixed to the first support member 208, and the second restricting member 466 is fixed to the three members (not shown) which are fixed to the three pairs of support plates 352, respectively, which in turn are fixed to the second support member 212. One end portions of the two flat belts 440 are pivotably attached to the second restricting member 466. In FIG. 5, the two restricting members 464, 466 are not shown.

The two restricting members 464, 466 have substantially the same length as that of the two support members 208, 212, i.e., the dimension thereof as measured in the direction parallel to the direction of movement of the first support member 208. The two restricting members 464, 466 extend downward from two positions slightly lower than the tape inlets and the tape outlets, respectively, and in the vicinity of the inlets and the outlets, and reach two positions in the vicinity of the tape support member 404, respectively. The two flat belts 440 are provided inside the two restricting members 464, 466. Thus, the restricting members 464, 466 prevent the flat belts 440 from moving in a horizontal direction in which the two support members 208, 212 are arranged, i.e., a direction perpendicular to the lengthwise direction of the tape support member 404. Though the restricting members 464, 466 prevent the transferring portions of the CC carrier tapes 242 from moving in the above horizontal direction, those members 464, 466 also function as swing preventing members which prevent the tape support member 404 from swinging in a horizontal direction perpendicular to the lengthwise direction of the member 404.

As shown in FIGS. 6 and 7, a shutter 470 is provided above the groups of tape holding devices 210. The shutter 470 is opened and closed by an opening and closing device (not shown) including, as its drive source, a rodless air-cylinder device as a sort of fluid-pressure-operated cylinder device. While the CCs 150 are mounted on the PCB 20, the shutter 470 is kept closed for preventing not only the leakage of noise produced by the operation of the CC supplying system 12, but also safe hazards.

Figure 14:
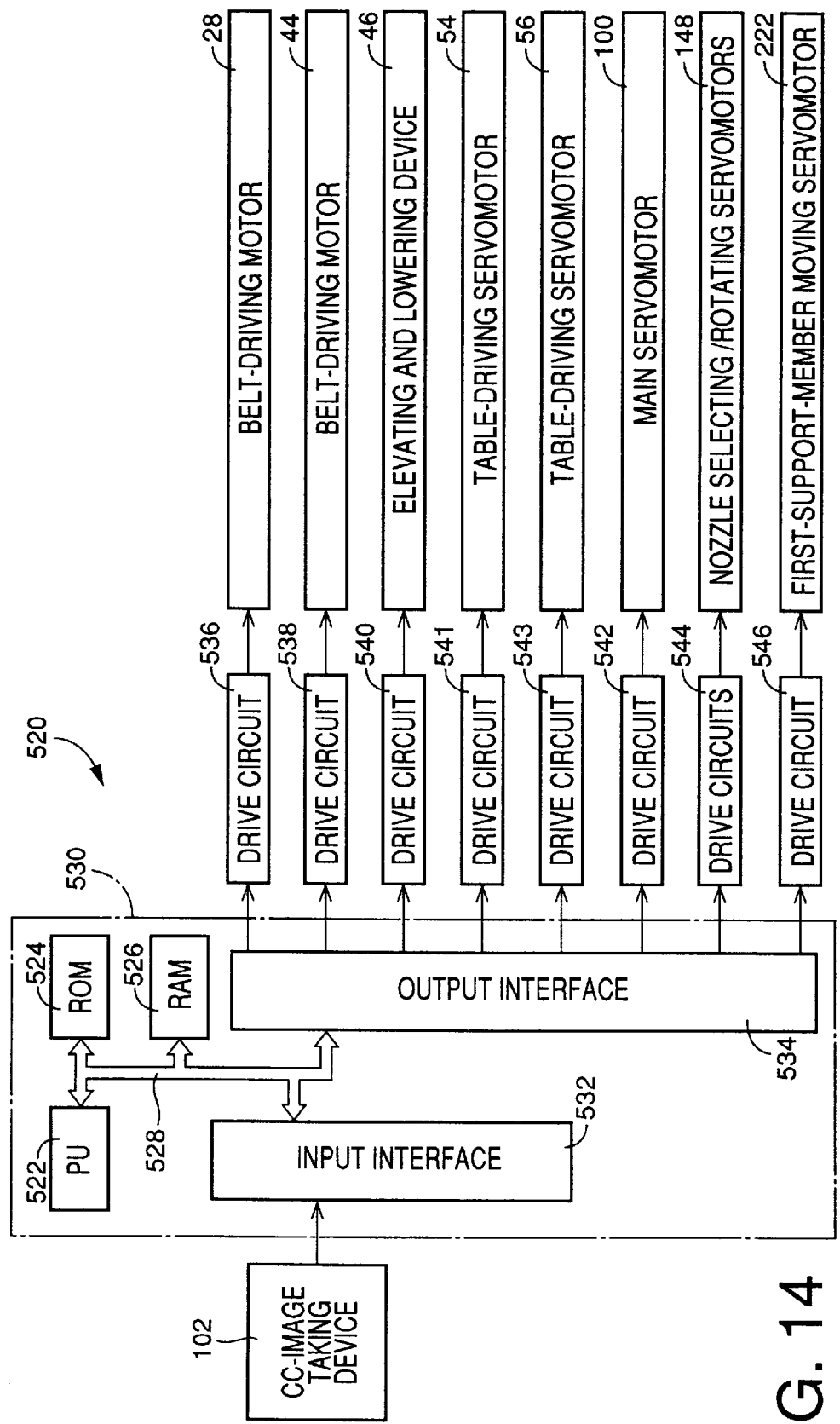
FIG. 14 is a diagrammatic view of a relevant portion of a control device of the CC mounting system of FIG. 1.

The present CC mounting system 8 includes a control device 520 shown in FIG. 14. The control device 520 is provided by a computer including a processing unit (PU) 522, a read only memory (ROM) 524, a random access memory (RAM) 526, and a bus 528 for connecting the elements 522, 524, 526 to one another. An input interface 532 is connected to the bus 528, and the CC-image taking device 102 is connected to the input interface 532. An output interface 534 is also connected to the bus 528. The output interface 534 is connected via respective drive circuits 536, 538, 540, 541, 543, 542, 544, and 546 to the belt-driving motors 28, 44, the table-driving servomotors 54, 56, the elevating and lowering device 46, the main servomotor 100, the nozzle selecting/rotating servomotors 148, and the first-support-member moving servomotor 222, respectively. The ROM 524 stores various control programs which are needed for positioning each of the CC-supply portions of the tape feeding devices 202, and supplying and mounting each of the CCs 150.

Each of the table-driving servomotors 54, 56, the main servomotor 100, the nozzle selecting/rotating servomotors 148, and the first-support-member moving servomotor 222 is a sort of electric motor as a drive source, and is controllable with respect to its rotation angle or amount and its rotation direction. One or more of the servomotors 54, 56, 100, 148, 222 may be replaced by a stepper motor or motors.

In the CC mounting system 8 constructed as described above, when the CCs 150 are mounted on the PCB 20, first, the PCB carry-in device 24 carries the PCB 20 onto the PCB position-support device 22. After the PCB support table 40 being positioned at its uppermost position receives the PCB 20 from the carry-in device 24 and holds the same 20, the support table 40 is lowered to its lowermost position where the table 40 is moved to any desired position in a horizontal plane by the respective movements of the X table 36 and the Y table 38 so that the CCs 150 are mounted at the CC-mount places on the PCB 20, respectively. Before the CCs 150 are mounted on the PCB 20, respective images of reference marks (not shown) fixed to the PCB 20 are taken by a reference-mark-image taking device (not shown), and the control device 530 calculates, based on image data indicative of the taken reference images, respective positional errors of each of the CC-mount places on the PCB 20 in the X-axis and Y-axis directions. As described above, the control device 530 additionally calculates respective positional errors of the CC 150 held by each of the CC-holding heads 64 in the X-axis and Y-axis directions. The control device 530 corrects the positional error of each CC-mount place and the positional error of the CC 150 held by each CC-holding head 64, by correcting the respective distances of movement of the PCB 20 in the X-axis and Y-axis directions.

When the CCs 150 are mounted on the PCB 20, the main servomotor 100 is actuated to rotate the four globoidal cams 90*a*, 90*b*, 90*c*, 90*d* in synchronism with one another. Thus, the fifteen rotary plates 60 are rotated and stopped, so that the fifteen CC-holding heads 64 are sequentially moved to the CC sucking position where each CC-holding head 64 takes the CC 150 out of the CC-supply portion of the tape feeding device 202 being positioned at the CC supplying position. After the CC-holding head 64 has taken out the CC 150, the rotary plate 60 supporting the head 64 is moved to the CC-image taking position where the plate 60 is stopped and an image of the CC 150 held by the head 64 is taken. Thus, the control device 530 calculates the positional errors of the CC 150 held by the head 64 in the X-axis and Y-axis directions and the angular-position error of the CC 150 about the axis line of rotation of the CC-suction nozzle 146 of the head 64. After the taking of the CC image, the rotary plate 60 is further rotated while the CC suction nozzle 146 being positioned at the operative position is rotated about the axis line thereof to correct the angular-position error of the CC 150 held thereby. Then, the rotary plate 60 is moved to the CC mounting position where the CC-holding head 64 releases the CC 150 and mounts the same 150 on the PCB 20.

Meanwhile, the CC supplying units 200 are operated such that the CC-supply portion of the tape feeding device 202 of one of the units 200 is positioned at the CC supplying position so as to supply one or more CCs 150. After one unit 200 finished supplying the CC or CCs 150, the first support member 208 is moved to position the CC-supply portion of the tape feeding device 202 of another unit 200 at the CC supplying position. The CC supplying system 12 has a general rule that the tape feeding devices 202 are attached to the first support member 208 and the tape holding devices 204 (or the tape reels 380) are provided on the second support member 212, in the same order as the order of mounting of the CCs 150 on the PCB 20. Therefore, after one tape feeding device 202 finished supplying one or more CCs 150, the first support member 208 is moved in one direction by one pitch equal to the distance between each pair of adjacent tape feeding devices 202, so that the CC-supply portion of the tape feeding device 202 adjacent or next to the above-indicated one tape feeding device 202 is positioned at the CC supplying position. When the CCs 150 are supplied, the first support member 208 is intermittently moved at the pitch, from its CC-supply starting position, indicated in one-dot chain line in FIG. 5, where the CC-supply portion of the tape feeding device 202 of the first CC supplying unit 200 that first supplies one or more CCs 150 is positioned at the CC supplying position, to its CC-supply ending position, indicated in two-dot chain lines, where the CC-supply portion of the tape feeding device 202 of the last CC supplying unit 200 that last supplies one or more CCs 150 is positioned at the CC supplying position. After the supplying of the CCs 150 is finished, the first support member 208 is returned by one stroke from the ending position to the starting position.

Hereinafter, the behavior of each CC carrier tape 242 when the CCs 150 are supplied from the CC supplying system 12 will be described below. When the first support member 208 is moved, the transferring portion of the CC carrier tape 242 is moved while maintaining its curved shape. A portion of the carrier tape 242 which is wound on the guide rollers 386 is moved over the guide rollers 386 while the direction of running thereof is changed. However, one carrier tape 242 never passes or crosses another carrier tape 242. That is, all the carrier tapes 242 move parallel to one another.

Since the transferring portion of each CC carrier tape 242 is curved like the capital "U", that portion is not forcedly deformed when the first support member 208 is moved and accordingly the corresponding tape feeding device 202 is moved relative to the corresponding tape holding device 204. On the other hand, in the case where the transferring portion is stretched along a straight line, that portion is forcedly subjected to cubic deformation, as described above. In the present embodiment, the relative movement between one end portion of the transferring portion on the side of the tape feeding device 202 and the other end portion of the same on the side of the tape holding device 204 is substantially absorbed by respective torsions of the two arm portions of the U shape of the transferring portion and the rotation of the bottom portion of the U shape about a vertical axis line. Thus, in the present embodiment, each carrier tape 242 is not forcedly subjected to the cubic deformation.

In the present embodiment, when the support member 208 is moved, the portion of each CC carrier tape 242 that is wound on the guide rollers 386 is moved in the direction parallel to the direction of movement of the first support member 208, and the movement of the portion of the carrier tape 242 absorbs a portion of the movement of the corresponding tape feeding device 202 relative to the corresponding tape holding device 204. However, it is possible that each carrier tape 242 be wound on a single guide roller which is exclusive for the corresponding tape holding device 204 and which has two flanges at its axially opposite ends, respectively. In this case, each carrier tape 242 is prevented from being moved in the direction parallel to the direction of movement of the first support member 208.

Figure 16:
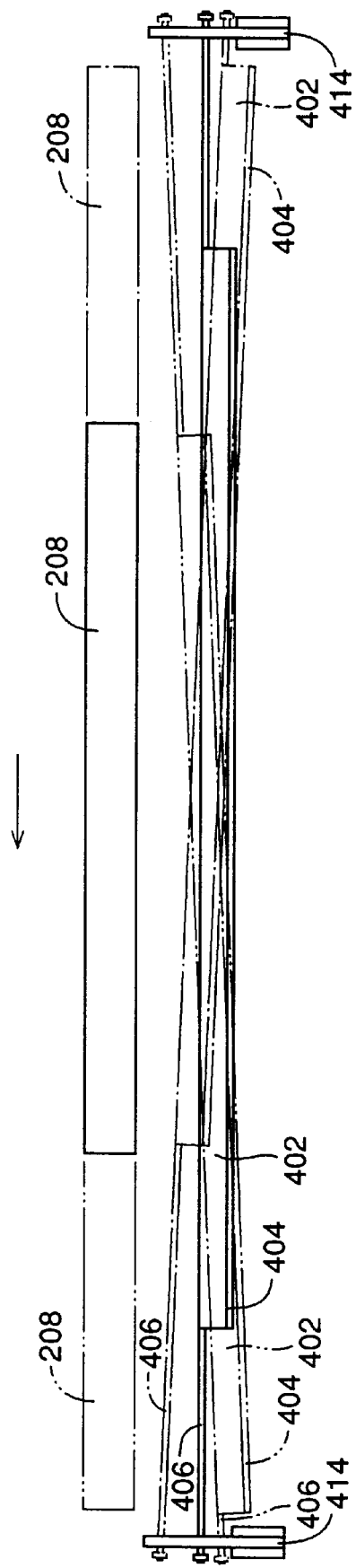
FIG. 16 is a view for explaining the manner in which the tape support member and a tape hold-down member are tilted when the first support member is moved in the CC supplying system of FIG. 1.

Next, the respective behaviors of the tape hold-down member 402 and the tape support member 404 will be described below. When the first support member 208 is moved, the respective first hanging portions 452 of the two flat belts 440 are moved with the first support member 208, while pulling the tape support member 404 and the respective second hanging portions 454 of the flat belts 440. Thus, the tape support member 404 is moved. As schematically shown in FIG. 16, when the first support member 208 is positioned at its CC-supply starting position indicated in one-dot chain lines, the tape support member 404 is positioned at a position, indicated in one-dot chain lines, where the member 404 is tilted such that an upstream-side end portion of the member 404 as seen in the direction of movement thereof, indicated at arrow, is lower than the downstream-side end portion thereof. When the first support member 208 is positioned between its CC-supply starting and ending positions, as indicated in solid lines, the tape support member 404 is positioned at a position, indicated in solid lines, where the member 404 is horizontal; and when the first support member 208 is positioned at its CC-supply ending position indicated in two-dot chain lines, the tape support member 404 is positioned at a position, indicated in two-dot chain lines, where the member 404 is tilted such that the upstream-side end portion of the member 404 is higher than the downstream-side end portion thereof. When the tape support member 404 is thus moved, the tape hold-down member 402 is also moved because the hold-down member 402 is supported by the support member 404 via the tape-hold-down-member support members 460. The two support shafts 406 that support the tape-hold-down member 402 are not freely movable relative to the corresponding elevator members 414 in their axial direction because each support shaft 406 includes its large-diameter portion and has the stopper member 423 thereon, and the tape hold-down member 402 is movable relative to the support shafts 406. As described previously, the tape hold-down member 402 and the tape support member 404 are provided between the tape outlets and the tape inlets, and are moved by half the amount or distance of movement of the first support member 208.

Figure 15:
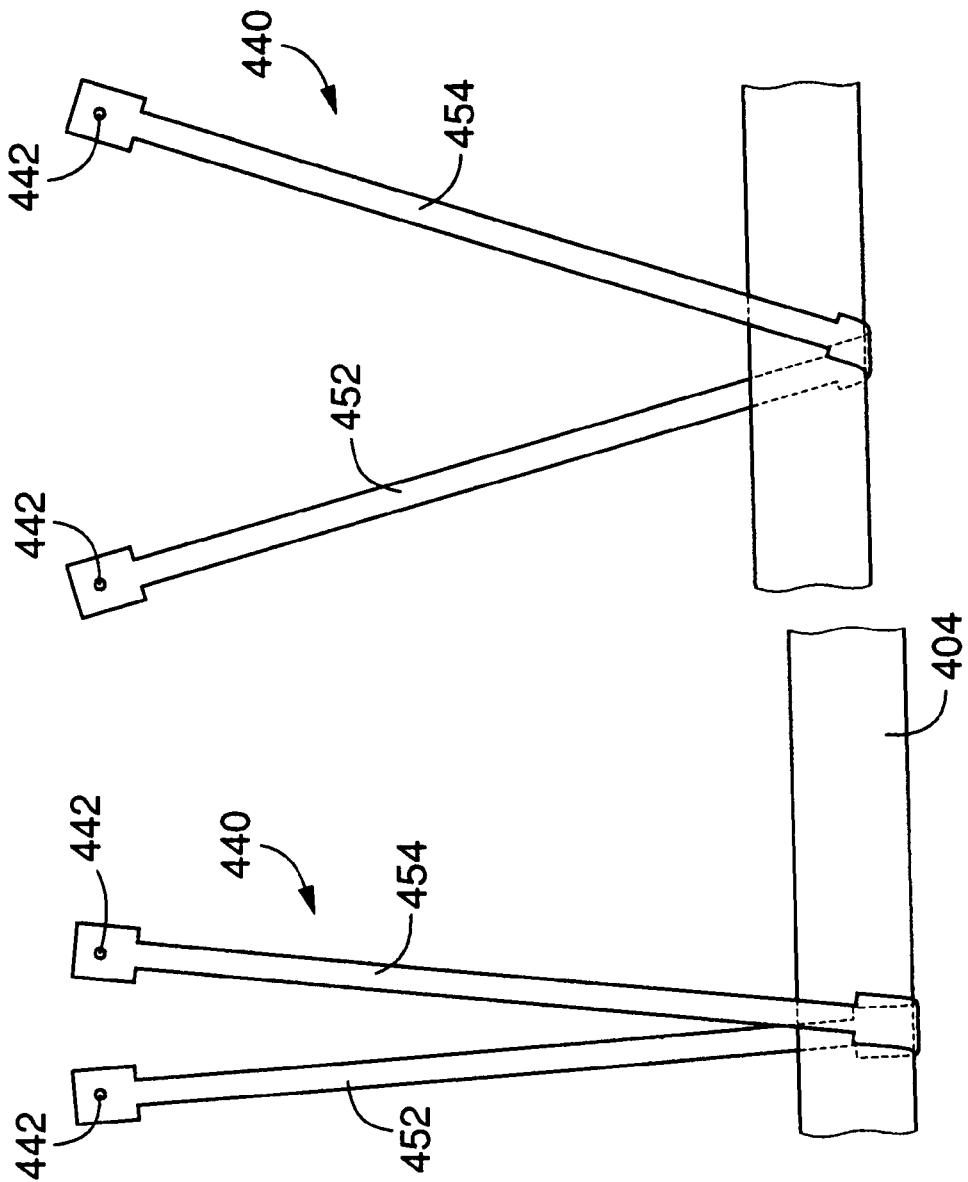
FIG. 15 is a view for explaining the manner in which the flat belts are moved and the tape support member is tilted when a first support member is moved in the CC supplying system of FIG. 1.

The reason why the tape support member 404 is tilted when the first support member 208 is moved is that in the state in which the respective middle portions of the first and second support members 208, 212 as seen in the direction parallel to the X-axis direction are opposed to each other, the respective first hanging portions 452 of the two flat belts 440 are inclined, for hanging the tape support member 404, downward away from the above middle portions and the respective second hanging portions 454 of the flat belts 440 are inclined, for the same purpose, downward toward the middle portions. If the first support member 208 is moved from the above state, leftward to its left-hand end in FIG. 16, the angle contained by the right-hand first and second hanging portions 452, 454 increases whereas the angle contained by the left-hand first and second hanging portions 452, 454 decreases and eventually the left-hand first hanging portion 452 passes the left-hand hanging portion 454, as shown in FIG. 15. Consequently the tape support member 404 is tilted such that the left-hand end portion thereof is slightly lower than the right-hand end portion thereof. For what purpose the tape support member 404 is tilted will be described later. The tape hold-down member 402 is allowed to be tilted, because the end portions 422 of the support shafts 406 are moved up and down in the elongate holes 424 of the elevator members 414. Each end portion 422 may have any length which allows the tilting of the tape hold-down member 402. The first and second hanging portions 452, 454 are pivotably connected to the first and second support members 208, 212 and the tape support member 404. Therefore, as the first support member 208 is moved, the hanging portions 452, 454 are pivoted relative to those support members 208, 212, 404, as shown in FIG. 15. Thus, the flat belts 440 are prevented from being forcedly deformed.

As is apparent from the foregoing description, the tape hold-down and support members 402, 404 may be moved together with each other. The middle portions of the transferring portions of the CC carrier tapes 242 are positioned between the tape outlets and the tape inlets in the direction perpendicular to the direction of movement of the first support member 208 relative to the second support member 212, i.e., in the direction in which the two support members 208, 212 are arranged, and the amount of movement of the hold-down and support members 402, 404 is substantially the same as that of the middle portions of the transferring portions of the carrier tapes 242. Thus, substantially no relative movement occurs between the hold-down and support members 402, 404 and the carrier tapes 242. Accordingly, the carrier tapes 242 are prevented from overlapping, crossing, or entangling each other. In the present embodiment, when the first support member 208 is moved, the respective transferring portions of the CC carrier tapes 242 are also moved as described above. On the other hand, if the hold-down and support members 402, 404 cannot be moved, some transferring portions may not be moved because of being engaged with the members 402, 404 due to friction and other transferring portions may be moved, so that some transferring portions may be entangled with other transferring portions. In contrast, in the present embodiment, substantially no relative movement occurs between the hold-down and support members 402, 404 and the carrier tapes 242, and accordingly the carrier tapes 242 are prevented from crossing or passing each other.

After the tape hold-down member 402 has pushed down the transferring portions of the CC carrier tapes 242, the hold-down member 402 remains at its hold-down position where the member 402 holds down all the transferring portions and prevents each portion from moving up. Accordingly, each time one CC 150 is supplied from each tape feeding device 202, the corresponding carrier tape 242 is drawn by one pitch out of the corresponding tape reel 380. If the tape hold-down member 402 is not employed, no new portion of the carrier tape 242 may be drawn out of the tape reel 380 or the tape holding device 204, even if the tape 242 is fed by the tape feeding device 202. In the latter case, only the transferring portion of the tape 242 will be consumed and the transferring portion will be linearly stretched between the feeding device 202 and the holding device 204. Thus, when the feeding device 202 is moved relative to the holding device 204, the carrier tape 242 will be subjected to cubic deformation as described above. In contrast, in the present embodiment, the tape hold-down member 402 is employed and prevents the moving up of each carrier tape 242. Therefore, the carrier tape 242 is reliably drawn out of the tape reel 380 little by little, the transferring portion of the tape 242 is not shortened, and the tape 242 is subjected to small deformation only.

When the CC carrier tape 242 is fed forward by the tape feeding device 202 whose CC-supply portion is positioned at the CC supplying position, only one or more guide rollers 386 on which the carrier tape 242 is wound are rotated. The other guide rollers 386 are not rotated. Therefore, the unnecessary carrier tapes 242 are not drawn out of the corresponding tape reels 380.

Last, there will be described the reason why the tape hold-down and support members 402, 404 are tilted when the first support member 208 is moved.

In the present embodiment, each CC carrier tape 242 has its curved transferring portion. The curved transferring portion cannot be rewound around the tape reel 380. If the upward and downward movement of the transferring portion is not obstructed by anything, the transferring portion is moved up and down when the first support member 208 is moved and the tape feeding device 202 is moved relative to the tape holding device 204. As the amount of relative movement between the feeding and holding devices 202, 204 increases, the lower end of the transferring portion moves upward.

Figure 17:
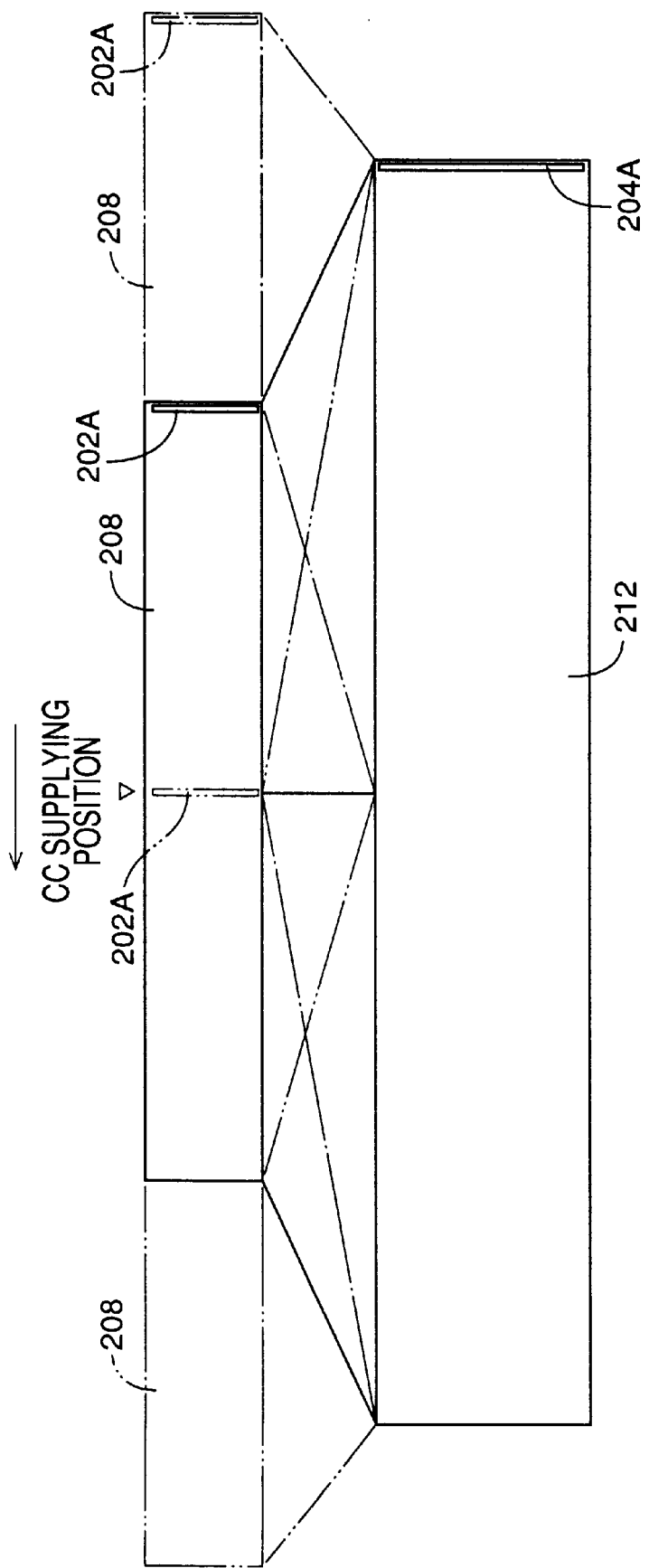
FIG. 17 is a view for explaining the manner in which the relative positions between the tape feeding devices and the corresponding tape holding devices are changed when the first support member is moved in the CC supplying system of FIG. 1.

The respective height positions of the lower ends of the transferring portions of the CC carrier tapes 242 change differently from each other when the first support member 208 is moved. In FIG. 17, reference numerals 202A and 204A denote the most upstream tape feeding and holding devices 202, 204 as seen in the direction, indicated at arrow, in which the first support member 208 is moved. When the movement of the member 208 starts, the amount of misalignment between the feeding and holding devices 202A, 204A is greater than zero; as the member 208 is moved, the misalignment decreases, becomes zero, and then increases; and when one CC 150 is supplied from the feeding device 202A, the misalignment becomes maximum. That is, the lower end of the transferring portion of the CC carrier tape 242 fed from the feeding device 202A first takes an intermediate height position, then the lowest position, and finally the highest position. Conversely, concerning the most downstream feeding and holding devices 202, 204, the lower end of the transferring portion of the CC carrier tape 242 fed from that feeding device 202 first takes the highest position, then the lowest position, and finally an intermediate height position. Concerning the central feeding and holding devices 202, 204, the amount of misalignment between those feeding and holding devices 202, 204 becomes maximum when the CC supplying operation starts and ends; and the misalignment becomes zero when one CC 150 is supplied from that feeding device 202. That is, the lower end of the transferring portion of the CC carrier tape 242 fed from the central feeding device 202 takes the highest position when the CC supplying operation starts and ends, and takes the lowest position when the CC 150 is supplied from the central feeding device 202.

Each CC carrier tape 242 is required to allow, when the tape feeding device 202 is moved in a direction to increase the misalignment thereof from the corresponding tape holding device 204, that movement of the tape feeding device 202. If there is nothing to obstruct the upward and downward movement of the transferring portion of the carrier tape 242, the transferring portion is moved upward while allowing the tape feeding device 202 to be moved. On the other hand, if the transferring portion cannot freely be moved up or down, a certain length of the carrier tape 242 is drawn out of the tape holding device 204. However, in the present embodiment, the tape hold-down member 402 is moved and tilted while allowing to some extent the upward and downward movement of the transferring portion of the carrier tape 242. Thus, the transferring portion is moved up and the feeding device 204 is allowed to be moved. Accordingly, only a small length of the tape 242 is drawn out of the holding device 204. Since the length of the tape 242 drawn out of the reel 380 is small, the amount of slacking of the tape 242 is also small when the misalignment between the tape feeding and holding devices 202, 204 decreases. Thus, each carrier tape 242 is prevented from being entangled with its two adjacent carrier tapes 242.

As described above, the respective CC carrier tapes 242 fed by the tape feeding devices 202 have different manners in which the respective heights of the lower ends of the transferring portions of the tapes 242 change as the first support member 208 is moved. Therefore, though the tape support member 404 and the tape hold-down member 402 can be tilted, it is impossible that the transferring portion of each of the tapes 242 enjoy the advantage that the amount of drawing of that tape 242 from the reel 380 and the amount of slacking of the tape 242 are sufficiently small. The maximum angle of tilting of the tape support member 404 depends on the positions where the first and second hanging portions 452, 454 of the flat belts 440 are attached to the first and second support members 208, 212 and the angles at which the hanging portions 452, 454 are inclined relative to a vertical plane. Therefore, those positions and angles are so predetermined as to minimize the total amount of drawing of the tapes 242 from the corresponding reels 380 and the total amount of slacking of the tapes 242.

Even if the transferring portions of the CC carrier tapes 242 may be slacked, the restricting members 464, 466 prevent those portions from being "swollen" outward in the widthwise direction of the tape support member 404, i.e., the direction in which the first and second support members 208, 212 are arranged.

After the mounting of the CCs 150 on one PCB 20 is finished, the first support member 208 is returned to its CC-supply starting position. In addition, the PCB support-position device 22 returns the PCB support table 40 to its original position, and elevates the table 40 to its uppermost position where the PCB holding device releases the PCB 20. Then, the PCB carry-in and carry-out device moves the PCB 20 onto the PCB carry-out device 26. After, or while, the PCB 20 is thus carried out, the PCB carry-in device 24 and the PCB carry-in and carry-out device carry in a new PCB 20, so that the PCB holding device holds the new PCB 20 for carrying out another CC mounting operation.

If the amount of the CCs 150 remaining in each CC supplying unit 200 decreases to a reference amount, the operator manually replaces the used tape reel 380 with a new tape reel 380. When the used reel 380 is replaced with a new reel 380, first, the carrier tape 242 remaining in the reel 380 set in the CC holding device 204 is entirely drawn out of the old reel 380, then the empty reel 380 is detached from the holding device 204, and the new reel 380 is set in the holding device 204. Subsequently, the leading end of the new tape 242 of the new reel 380 is connected to the trailing end of the old tape 242 being fed by the feeding device 202.

A tape-consumption detecting device judges whether each CC carrier tape 242 has been consumed. This detecting device may be provided by the computer of the control device 530. The detecting device or the computer may include a counter which counts the total number of CCs 150 supplied from each CC supplying unit 200 and, when the number of the remaining CCs 150 becomes equal to a reference number, controls an informing device to inform the operator of that situation and request him or her to supply a new tape 242 to the unit 200. The reference number corresponds to a time duration which allows the operator to replace the old reel 380 with a new reel 380 and connect a new tape 242 to the old tape 242. The informing device may inform the operator in any one of various manners. For example, the informing device may output an alarm sound, may display a message, or may light or flash a lamp. Alternatively, each carrier tape 242 may be labelled with one or more marks, and a mark detecting device may detect the mark or marks and thereby identify that each carrier tape 242 has been consumed to a reference amount.

The second support member 212 is not moved while the CCs 150 are supplied. Therefore, the operator can supply a new tape 242 not only while the first support member 208 is stopped but also while the same 208 is moved. In addition, the guide rollers 386 that provide the tape outlets of the tape holding devices 204 are level with the tape inlets, and the tape reels 380 are provided at positions lower than the guide rollers 386. Therefore, the operator can easily replace the old reels 380 with new reels 380. Moreover, since the direction of running of each carrier tape 242 is changed by the guide rollers 386, a portion of the tape 242 on the side of the tape holding device 204 is not moved so much, when the remaining portion of the tape 242 on the side of the tape feeding device 204 is moved, because of the movement of the first support member 208, in the direction parallel to the direction of movement of the member 208. Therefore, the operator can easily connect a new tape 242 to the trailing end portion of the old tape 242.

In the first embodiment shown in FIGS. 1 to 17, the tape support member 404 is hung from the first and second support members 208, 212 by the flat belts 440 such that the tape support member 404 is movable with the first support member 208. However, it is not essentially required that the tape support member 404 is hung from the first and second support members 208, 212.

Figure 18:
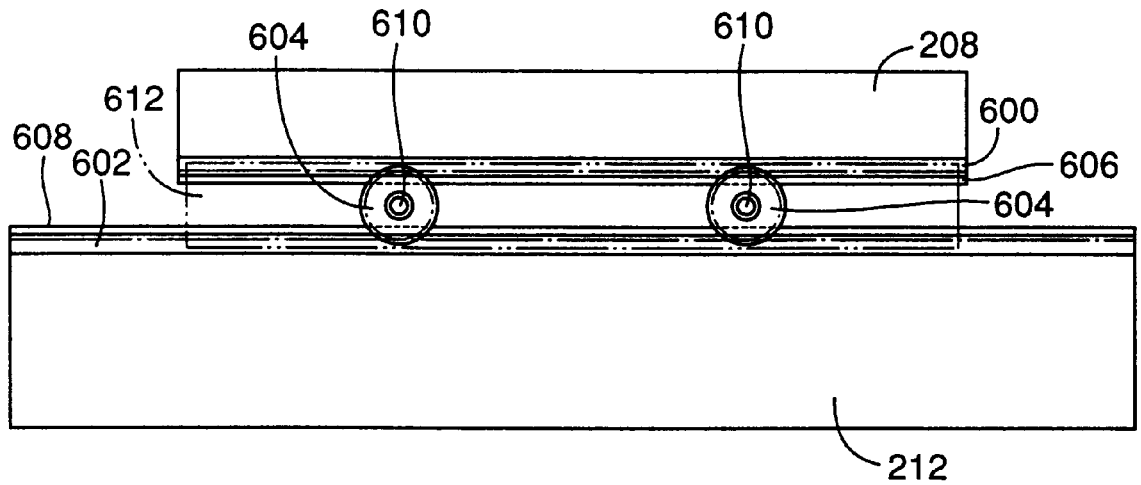
FIG. 18 is a schematic plan view of another CC supplying system which embodies the CC supplying system of the present invention and carries out the CC supplying method of the present invention.
Figure 19:
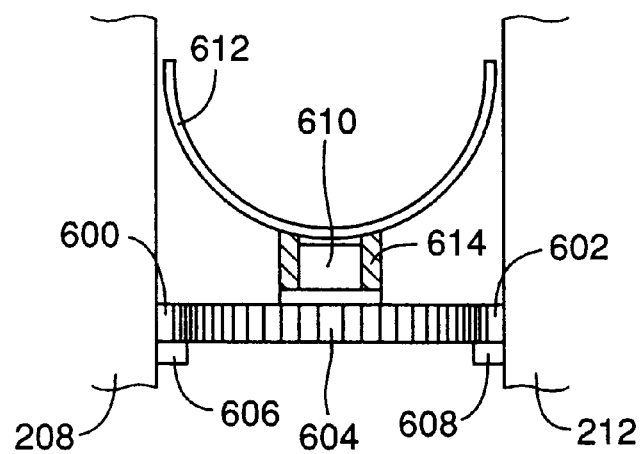
FIG. 19 is a side elevation view of a tape support member, pinions supporting the tape support member, and racks engaged with the pinions, all of which are elements of the CC supplying system of FIG. 18.

For example, FIGS. 18 and 19 show a second embodiment of the present invention wherein two racks 600, 602 are fixed to respective surfaces of the first and second support members 208, 212 which are opposed to each other, such that the racks 600, 602 extend parallel to the straight line along which the respective CC-supply portions of the tape feeding devices 202 are arranged, and two pinions 604 are meshed with the racks 600, 602. Two support members 606, 608 are fixed to respective lower surfaces of the two racks 600, 602, such that the support members 606, 608 project inward from the racks 600, 602, respectively. The two support members 606, 608 cooperate with each other to support respective lower surfaces of the two pinions 604 such that each of the pinions 604 is rotatable about a vertical axis line and is movable in a lengthwise direction of the racks 600, 602. A tape support member 612 is provided between the tape outlets of the tape holding devices 204 and the take inlets of the tape feeding devices 202 in the direction in which the first and second support members 208, 212 are arranged. The two pinions 604 include respective axis portions 610 which are fitted in two cylindrical engagement portions 614, respectively, which project downward from the lowest portion of an outer surface of the tape support member 612. The two pinions 604 are rotatable about the axis portions 610 thereof relative to the two engagement portions 614, respectively. In the second embodiment, the same tape hold-down member 402 and tape-hold-down-member support members 460 as those 402, 460 employed in the first embodiment are employed but not shown in FIG. 18 or 19. Thus, the tape hold-down member 402 can be supported on the tape-hold-down-member support members 460 which are provided on the tape support member 612, and can be moved with the tape support member 612.

When the first support member 208 is moved, the first rack 600 is moved and accordingly the pinions 604 are rotated and moved. The tape support member 612 is moved in a direction parallel to the direction of movement of the first support member, by half the distance of movement of the first support member 208. Thus, the tape support member 612 is moved while substantially following the movement of the middle portions of the transferring portions of the CC carrier tapes 242, because the middle portions of the transferring portions are also located between the tape outlets and the tape inlets in the direction in which the first and second support members 208, 212 are arranged, and are moved by half the distance of movement of the first support member 208. Thus, each pair of adjacent carrier tapes 242 are prevented from being entangled with each other. In the second embodiment, the racks 600, 602 and the pinions 604 cooperate with each other to provide a tape-support-member moving device.

Figure 20:
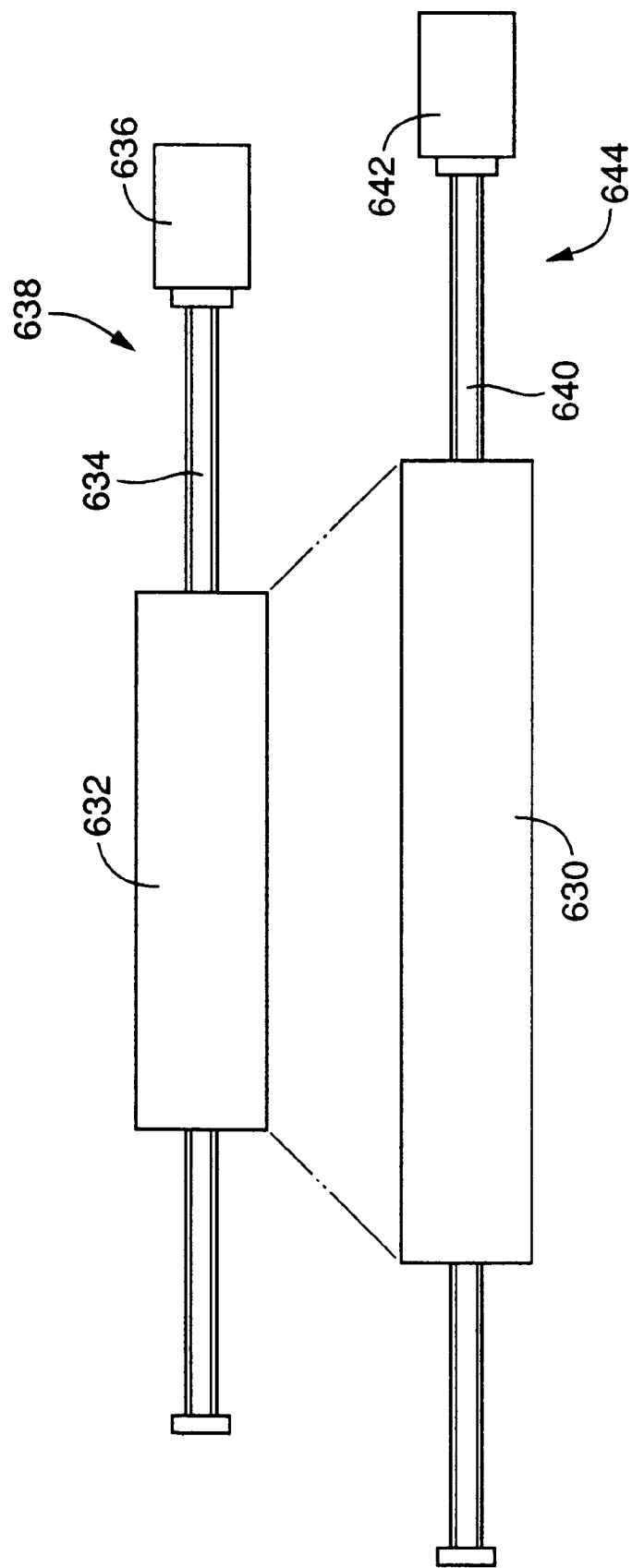
FIG. 20 is a schematic plan view of another CC supplying system which embodies the CC supplying system of the present invention and carries out the CC supplying method of the present invention.

In each of the first embodiment shown in FIGS. 1 to 17 and the second embodiment shown in FIGS. 18 and 19, the second support member 212 is fixed to the base member 10. However, it is not essentially required that the second support member 212 be fixed to the base member 10. For example, FIG. 20 shows a third embodiment of the present invention wherein not only a first support member 632 but also a second support member 630 are movable relative to the base member 10 (not shown in FIG. 20). A first-support-member moving device 638 which includes a nut (not shown), a feed screw 634, and a first-support-member moving servomotor 636 moves the first support member 632 in opposite directions parallel to the straight line along which the respective CC-supply portions of the tape feeding devices 202 are arranged. Similarly, a second-support-member moving device 644 which includes a nut (not shown), a feed screw 640, and a second-support-member moving servomotor 642 moves the second support member 630 in the same directions.

In the third embodiment, the transferring portions of the CC carrier tapes 242 may, or may not, be curved in an upward or downward direction. In the case where the transferring portions are curved, it is possible to employ both, or either one, of the tape hold-down member 402 and the tape support member 404, 612 employed in the first or second embodiment. In the first case where the transferring portions are curved in a downward direction, it is possible to employ only the tape hold-down member 402 and omit the tape support member 404, 612. In the second case where the transferring portions are curved in an upward direction, it is possible to employ only a tape support member and no tape hold-down member. In the second case, the tape support member may have an upwards convex, part-cylindrical upper surface and may support the curved transferring portions of the carrier tapes 242 in a state thereof in which the upper surface is positioned at a position higher than the straight lines connecting between the tape outlets and the tape inlets. In the second case, however, it is possible to employ a tape hold-down member. In the last case, the tape hold-down member may have an upwards convex, part-cylindrical lower surface. These are converse to the first case where the tape hold-down member 402 has a downwards convex, part-cylindrical lower surface and the tape support member 404, 612 has the downwards convex, part-cylindrical upper surface. In the above-indicated last case, the tape hold-down member may, or may not, be elevated and lowered to its highest position higher than the straight lines connecting between the tape outlets and the tape inlets and to its lowest position lower than the straight lines. In the case where the tape hold-down member is not elevated or lowered, it is provided at a position higher than the straight lines connecting between the tape outlets and the tape inlets.

In either case, the tape support member 404, 612 may be fixed to the second support member 630 which is moved at an acceleration and a deceleration lower than those at which the first support member 632 is moved. In the case where the amount of relative movement between the first and second support members 632, 630 increases to a great value, it is possible to employ a tape-support-member moving device like in each of the first and second embodiments. That is, the tape support member 404, 612 may be hung from the first and second support members 632, 630 by the flat belts 440 employed in the first embodiment, or may be moved relative to the first and second support members 632, 630 by the racks and pinions 600, 602, 604 employed in the second embodiment.

Figure 21:
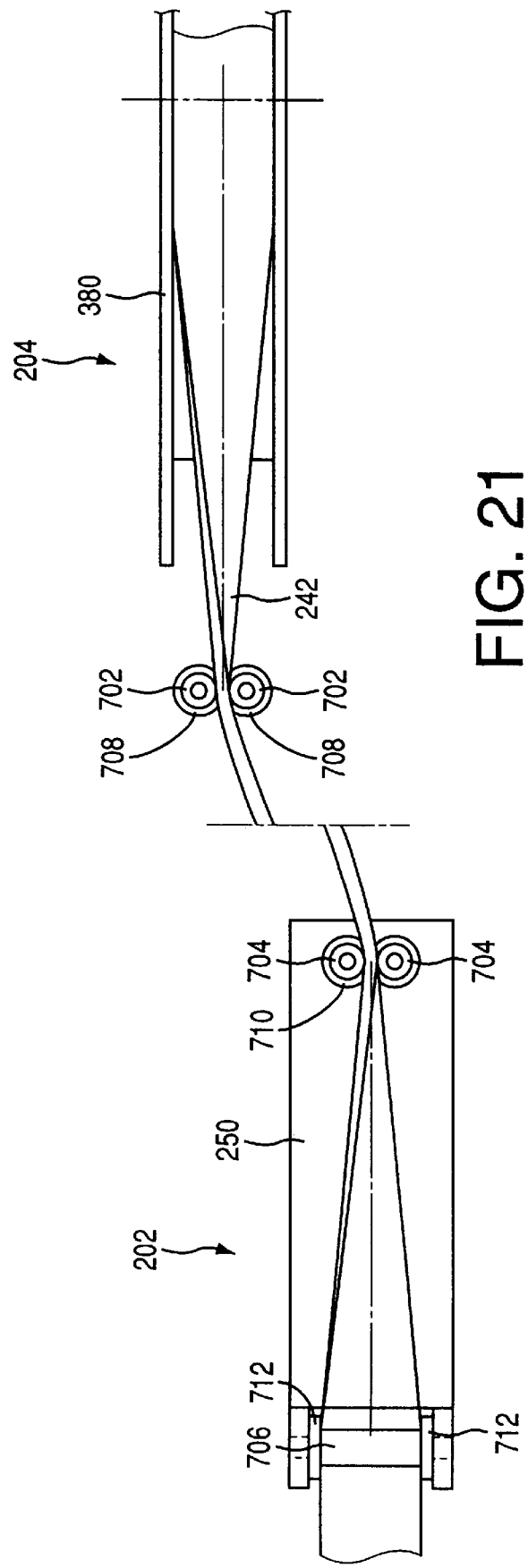
FIG. 21 is a schematic plan view of a CC supplying unit of the CC supplying system of FIG. 20.

In the case where the transferring portions of the CC carrier tapes 242 are not curved in an upward or downward direction and, as shown in FIG. 20, the respective lengths of the first and second support members 632, 630 differ from each other because the sum of the respective widths of the tape feeding devices 202 and that of the tape holding devices 204 differ from each other, each of the tape feeding devices 202 supported by the lengthwise end portions of the first support member 208 and a corresponding one of the tape holding devices 204 supported by the lengthwise end portions of the second support member 212 may be largely misaligned from each other in the lengthwise direction of the first and second support members 632, 630, while the CCs 150 are supplied from the tape feeding devices 202. Meanwhile, since the length of each carrier tape 242 is much greater than the thickness thereof, the carrier tape 242 resists to being curved in the widthwise direction thereof. Therefore, if one tape feeding device 202 and a corresponding tape holding device 204 are largely misaligned from each other in the lengthwise direction of the first and second support members 208, 212, that misalignment may not completely be absorbed by the curving of the carrier tape 242 in the widthwise direction thereof. However, this problem can be solved. For example, as shown in FIG. 21, the transferring portion of each CC carrier tape 242 is twisted such that the widthwise direction of the transferring portion is parallel to a vertical direction. The carrier tape 242 drawn from the tape reel 380 of the corresponding tape holding device 204 is passed through a pair of guide rollers 702 which are provided on the tape holding device 204 such that the guide rollers 702 are rotatable about respective vertical axis lines. Thus, the carrier tape 242 is twisted by 90 degrees. Subsequently, the carrier tape 242 is passed through another pair of guide rollers 704 which are provided on the corresponding tape feeding device 202 such that the guide rollers 704 are rotatable about respective vertical axis lines, and then is passed between a guide roller 706 which is rotatable about a horizontal axis line, and the main member 250 of the tape feeding device 202. Thus, the carrier tape 242 is twisted back by 90 degrees. In the present embodiment, the misalignment between the tape feeding device 202 and the corresponding tape holding device 204 in the lengthwise direction of the first and second support members 632, 630 can be absorbed by the curving of the carrier tape 242 in the direction of thickness thereof along the outer circumferential surfaces of the guide rollers 702, 704. Thus, in the present embodiment, the transferring portions of the carrier tapes 242 need not be curved in an upward or downward direction, unlike the first or second embodiment, and accordingly the carrier tapes 242 can be handled easily. In FIG. 21, reference numerals 708, 710, 712 denote respective flanges of the guide rollers 702, 704, 706.

Back to FIG. 20, the first support member 632 is moved and stopped at high acceleration and deceleration, to position each CC-supply portion at the CC supplying position, whereas the second support member 630 is continuously moved without being stopped, as a general rule. The control device 530 has control data indicative of the timings, velocities, accelerations, etc. at which the first support member 632 is moved and, based on those data, calculates the velocities and accelerations at which the second support member 630 is moved for each tape holding device 204 to follow a corresponding tape feeding device 202 at the lowest possible velocities and accelerations without running before, or after, the same 202 by more than a predetermined distance. The control device 530 controls the second-support-member moving servomotor 642 based on the thus calculated velocities and accelerations. Thus, the amount of change of relative position between each tape feeding device 202 and the corresponding tape holding device 204 is minimized while the vibration and noise resulting from the moving of the second support member 630 and the groups of tape holding devices 204 held thereby are minimized. Therefore, the amount of curving of the transferring portion of each carrier tape 242 in a direction perpendicular to the direction of movement of the first and second support members 632, 630 can be minimized or even zeroed.

The velocities and accelerations of the second support member 630 may directly be corresponded to those of the first support member 632. For example, the control device 530 may store, in the ROM 524, a plurality of predetermined movement patterns or maps for the second support member 630 which correspond to a plurality of predetermined movement patterns or maps for the first support member 632, respectively, and select one of the patterns or maps for the second member 630 which corresponds to a current pattern or map according to which the first member 632 is being moved.

In addition, the control device 530 may control the second support member 630 in such a manner that while the second member 630 is continuously moved in one direction, the second member 630 is decelerated when the first support member 632 is accelerated and vice versa. In this case, the vibration resulting from the acceleration and deceleration of the first support member 632 can be canceled out by the vibration resulting from the deceleration and acceleration of the second support member 630, and the vibration of the CC supplying system 12 as a whole can substantially be reduced.

Moreover, it is not essentially required to employ, as each of the drive sources 636, 642, a servomotor which is controllable with respect to its rotation angle. A different sort of electric motor may be employed. In the latter case, for example, the control device 530 can control those motors in such a manner that each time more than a predetermined amount of misalignment occurs between the first and second support members 632, 630, the second support member 630 is moved relative to the first support member 632 to reduce the amount of change of relative position between each tape feeding device 202 and the corresponding tape holding device 204.

Though the respective lengths of the first and second support members 632, 630 differ from each other as shown in FIG. 20, it is possible to employ a first and a second support member having the same length. To this end, for example, the tape feeding devices 202 are arranged at the same pitch as that at which the tape holding devices 204 are arranged. Generally, each tape feeding device 202 has a width smaller than that of each tape holding device 204. Accordingly, the tape holding devices 204 are arranged as close as possible to one other, and the tape feeding devices 202 are arranged at the same pitch as the smallest possible pitch of arrangement of the tape holding devices 204.

However, in the above case, the first support member 632 has a uselessly large length in a direction parallel to the direction of movement thereof. Therefore, in some cases, it is desired that the length of the second support member 630 be reduced to comply with that of the first support member 632.

To this end, for example, FIGS. 22 to 25 shows a fourth embodiment of the present invention wherein a second support member 720 includes an upper deck 722 and a lower deck 724 and an upper array of tape holding devices 718 are provided on the upper deck 722 and a lower array of tape holding devices 718 are provided on the lower deck 724 such that the upper devices 718 are alternate with the lower devices 718. Each tape holding device 718 has a width greater than that of each tape feeding device 716. One of each pair of adjacent tape feeding devices 716 corresponds to one tape holding device 718 on the upper deck 722 as indicated in solid lines in FIG. 23 and the other tape feeding device 716 corresponds to one tape holding device 718 on the lower deck 724 as indicated in two-dot chain lines. In this case, the second support member 720 has a small length, which contributes to reducing an operating space needed for placing and operating the CC supplying system 12. This advantage can be enjoyed to some extent in the case where the second support member 720 is not moved. However, the advantage is amplified in the case where the second support member 720 is moved, because the operating space must have a twice greater dimension than the length of the support member 720 to allow the member 720 to move over its full stroke, and still more amplified in the case where one or two siding spaces is or are provided on one or both sides of the operating space, because each siding space must have a dimension equal to the length of the support member 720. In each siding space, the operator may replace each pair of tape feeding and holding devices 716, 718 with a new pair of devices 716, 718.

Figure 22:
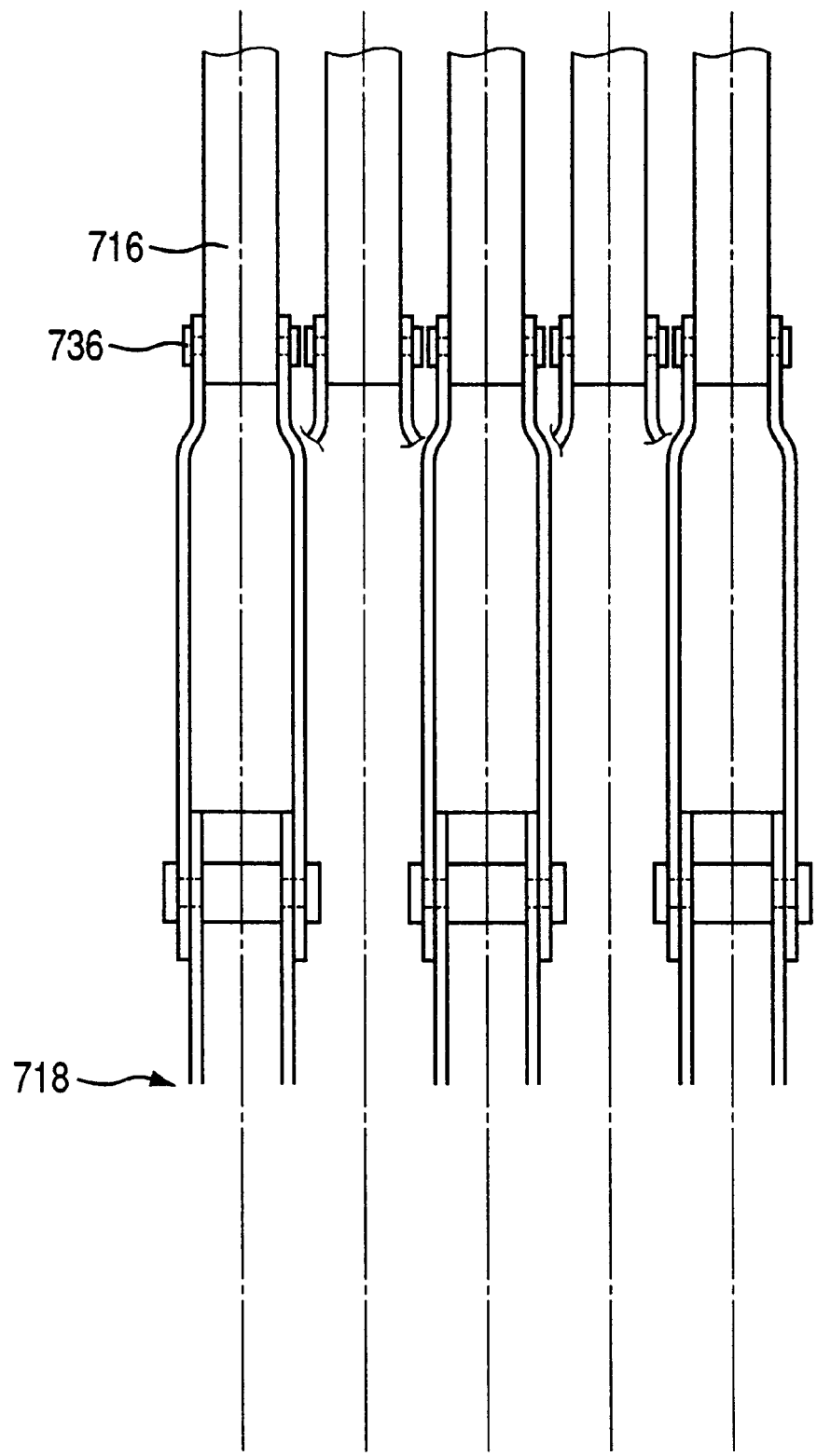
FIG. 22 is a schematic plan view of a CC supplying unit of another CC supplying system which embodies the CC supplying system of the present invention and carries out the CC supplying method of the present invention.
Figure 23:
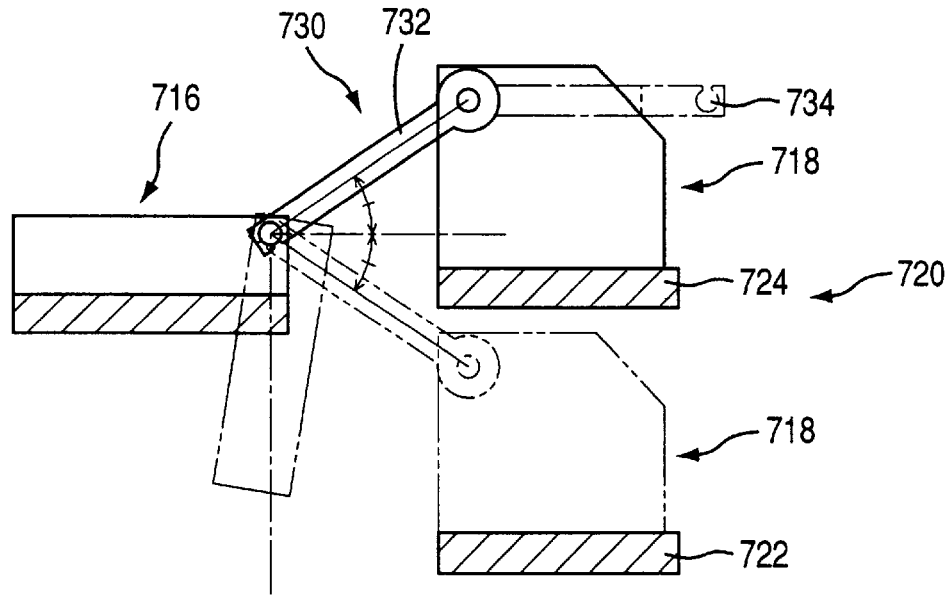
FIG. 23 is a cross-sectioned, side elevation view of the CC supplying system of FIG. 22.
Figure 24:
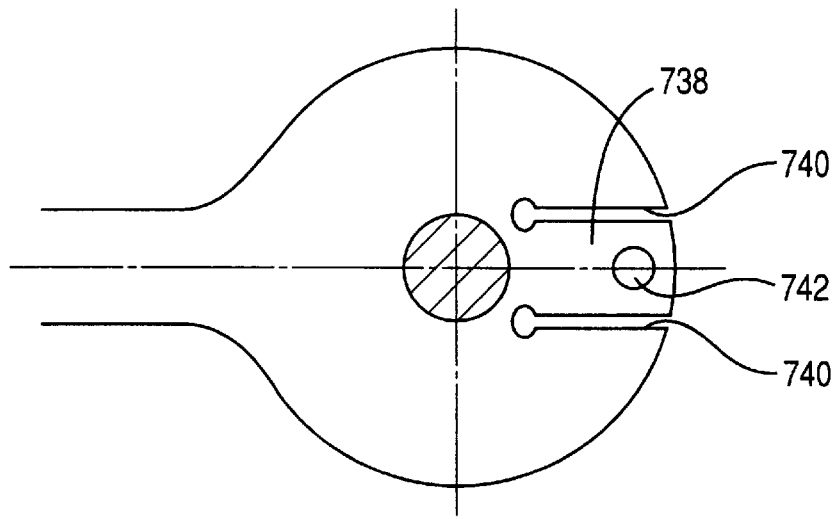
FIG. 24 is an enlarged view of a portion of a connecting arm of the CC supplying system of FIG. 22.
Figure 25:
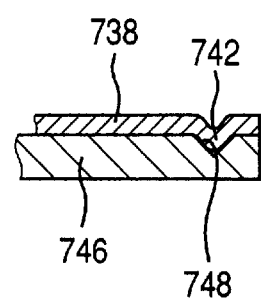
FIG. 25 is a cross-sectioned view of the connecting arm of FIG. 24.

In the fourth embodiment shown in FIGS. 22 and 23, each one of the tape feeding or holding devices 716 or 718 is independent of the other tape feeding or holding devices 716 or 718. However, each pair of tape feeding and holding devices 716, 718 are connected to each other by a connecting device 730, for facilitating the operation of the operator in the siding space or spaces. Each connecting device 730 includes a pair of connecting arms 732 which are pivotably attached to the corresponding tape holding device 718. Each connecting arm 732 has, as a first engageable portion, an engageable recess 734 formed in a free end portion thereof. Meanwhile, the main member 250 of each tape feeding device 716 are provided with a pair of headed pins 736 each as a second engageable portion, as shown in FIG. 22. When the recess 734 of each connecting arm 732 is pressed on the corresponding headed pin 736, a portion of the arm 732 that defines the recess 734 is elastically deformed such that the recess 734 is engaged, by snap action, with the pin 736. Thus, each tape feeding device 716 and the corresponding tape holding device 704 are connected to each other. The other end portion of each connecting arm 732 that is attached to the corresponding tape holding device 718 includes, as shown in FIG. 24, an elastic engageable portion 738 that is formed like a tongue, between two grooves 740. The engageable portion 738 has a semi-spherical engageable projection 742 in a free end portion thereof. The engageable projection 742 is engageable with each of three conical engageable recesses 748 formed in a side surface of a main member 746 of the tape holding device 718, so that the arm 732 is held at a corresponding one of three predetermined rotation positions relative to the main member 746. More specifically described, when the projection 742 of the arm 732 is engaged with a first one of the three engageable recesses 748, the arm 732 takes a first position indicated in solid lines in FIG. 23; when the projection 742 is engaged with a second one of the three recesses 748, the arm 732 takes a second position indicated in one-dot chain lines; and when the projection 742 is engaged with a third one of the three recesses 748, the arm 732 takes a third position indicated in two-dot chain lines. When one tape holding device 718 is attached to the upper deck 724, the corresponding connecting arm 732 takes the first position; and when the tape holding device 718 is attached to the lower deck 722, the arm 732 takes the second position. After the tape holding device 718 has been attached to the upper or lower deck 724 or 722, the engageable recess 734 is disengaged from the headed pin 736 of the corresponding tape feeding device 716, and is pivoted to the third position. Thus, the tape holding device 718 is disconnected from the corresponding tape feeding device 716, so that the tape feeding and holding devices 716, 718 can be moved independent of each other.

Though not shown in the drawings, it is possible to arrange the tape holding devices 718 in two arrays, i.e., a front array and a rear array. In this case, one tape feeding device 716 and one front tape holding device 718 may be connected to each other by a first connecting arm 732 and another tape feeding device 716 and one rear tape holding device 718 may be connected to each other by a second connecting arm 732 whose length is longer than that of the first connecting arm 732. Alternatively, each of the first and second connecting arms 732 may be provided by a stretchable member.

Figure 26:
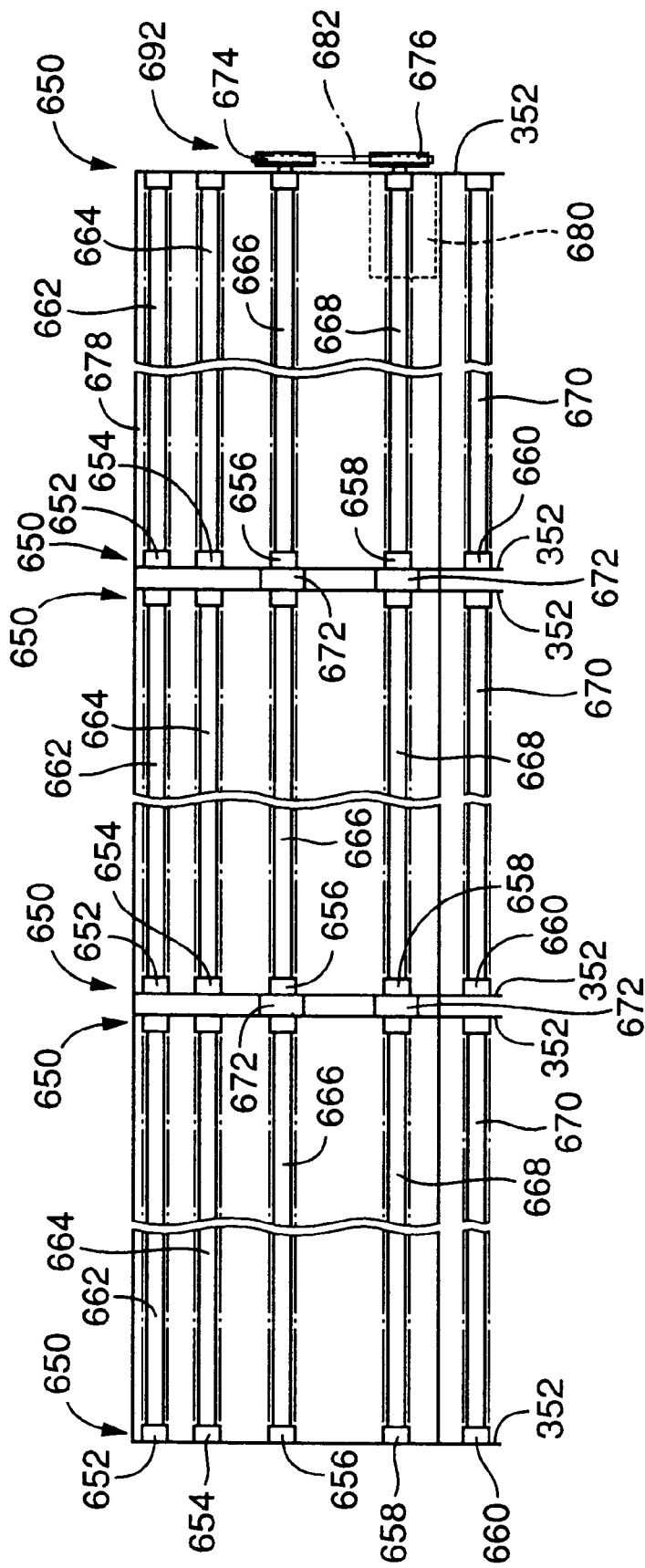
FIG. 26 is a schematic plan view of three groups of tape holding devices of another CC supplying system which embodies the CC supplying system of the present invention and carries out the CC supplying method of the present invention.

In each of the illustrated embodiments, it is employ a reel rewinding device which rewinds a length of each CC carrier tape 242 which has been drawn out of a corresponding tape reel 380. For example, FIG. 26 shows a fifth embodiment of the present invention wherein each of three groups of tape holding devices 650 includes five support rollers 652, 654, 656, 658, 660 and their axis members 662, 664, 666, 668, 670. At least one roller (in the present embodiment, two rollers 656, 658) of the plurality of rollers (five rollers 652–660) can support each of different sorts of tape reels 380 having different diameters. The respective axis members 666 of the three roller 656 for the three groups of devices 650 are connected to one another by two connecting members 672, such that the axis members 666 are not rotatable relative to one another. Similarly, the respective axis members 668 of the three rollers 658 are connected to one another by two additional connecting members 672, such that the axis members 668 are not rotatable relative to one another. Two timing pulleys 674, 676 are fixed to respective projecting end portions of the two axis members 666, 668 of one group of devices 650. An electric motor 680 as a sort of drive source is fixed to a second support member 678, and a timing (cog) belt 682 is wound on the timing pulleys 674, 676, and a drive pulley (not shown) fixed to an output shaft of the motor 680. Thus, the rotation of the motor 680 is transmitted to the three axis members 666 and the three axis members 668.

Figure 27:
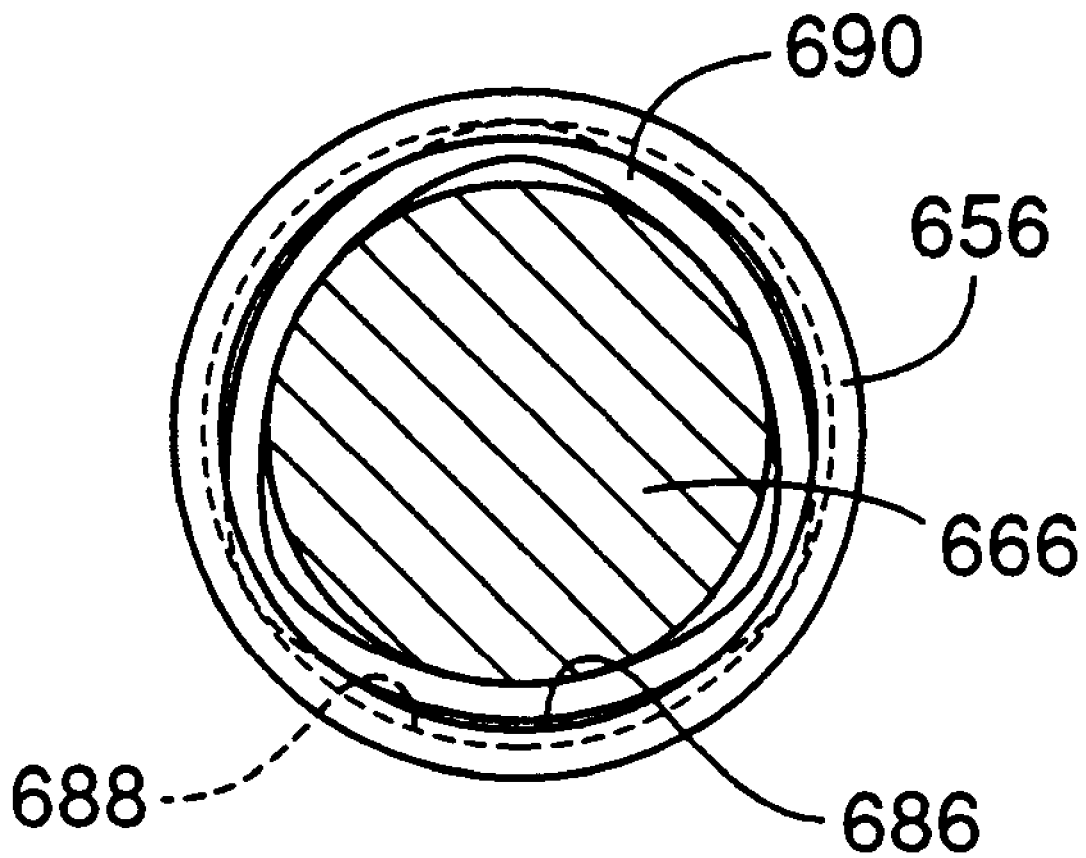
FIG. 27 is a side elevation view of a support roller and a support shaft as elements of each group of tape holding devices of FIG. 26.

The friction resistance between each support roller 656, 658 and a corresponding axis member 666, 668 is high enough to assure that the each support roller 656, 658 is rotatable with the corresponding axis member 666, 668. FIG. 27 shows one support roller 656 and one axis member 666 as respective representatives of the six rollers 656, 658 and the six axis members 666, 668. The roller 656 has, in one or each of axially opposite end surfaces thereof, a cylindrical recess 686 which is concentric therewith, and an annular groove 688 which is formed, near the bottom of the recess 686, in a cylindrical inner surface defining the recess 686, and which has a diameter greater than that of the recess 686. A spring member 690 as a friction-engagement member is fitted in the annular groove 688 such that some portions of the spring 690 contact the outer circumferential surface of the axis member 666 and other portions of the spring 690 fit in the groove 688 and contact the bottom of the groove 688. Thus, the spring 690 is prevented from coming off the roller 656. The spring 690 engages, by friction, the roller 656 and the axis 666, so that the roller 656 and the axis 666 are rotatable as an integral unit. The timing pulleys 674, 676, the electric motor 680, the springs 690, etc. cooperate with one another to provide the tape rewinding device. In FIG. 26, partition plates 376 as parts of the tape holding devices 650 are not shown.

When the rewinding of one CC carrier tape 242 around the tape reel 380 is needed, for example, when one tape feeding device 202 is detached from the first support member 208 and one tape reel 380 is detached from the corresponding tape holding device 650, in a state in which one CC carrier tape 242 remains set in the tape feeding device 202, the electric motor 680 is started to rotate the axis members 666, 668 in a direction to rewind the carrier tapes 242. Consequently, in all the tape holding devices 650, the support rollers 656, 658 are rotated in the tape rewinding direction so that all the carrier tapes 242 are rewound around the corresponding tape reels 380. Even if the respective lengths of the tapes 242 that are rewound around the reels 380 may differ from one another, an excessive rotation of one or more of the reels 380 is allowed by the sliding of the one or more reels 380 on the support rollers 656, 658.

In the fifth embodiment shown in FIGS. 26 and 27, the single tape rewinding device 674, 676, 680, 690 are shared by the three groups of tape holding devices 650. However, each group of devices 650 may be provided with an exclusive tape rewinding device. In the latter case, each group of devices 650 can rewind the CC carrier tapes 242, independent of the other groups of devices 650. For example, in the case where the curved transferring portions of the carrier tapes 242 of only one or two groups of devices 650 are made too long because of the relative movement between the first and second support members 208, 678, only the corresponding tape rewinding device or devices is or are operated to rewind those carrier tapes 242.

In each of the illustrated embodiments, the CC accommodating tape 244 of each CC carrier tape 242 has a constant thickness in the widthwise direction of the tape 242, and the entire lower surface of the tape 244 is supported on the main member 250 of each tape feeding device 202. However, the present invention may be applied to the supplying of an "embossed-type" CC carrier tape, or the supplying of a CC carrier tape of a type which includes a pair of elongate holding portions which cooperate with each other to hold the lead wires of each of circuit components each with lead wires. The embossed-type carrier tape includes a pair of thin elongate supported portions which are to be supported by each tape feeding device 202, and a single belt-like CC-accommodating portion, or a number of container-like CC-accommodating portions, which projects or project from the two supported portions. In the last case, when the first support member 208 is moved, respective portions of the embossed-type tapes which are wound on the non-flanged guide rollers 386 as the tape control members which are arranged close to one another move over the guide rollers 386 in the direction of movement of the first support member 208, while the directions of running thereof are changed. In this process, the respective supported portions of each pair of adjacent tapes may overlap each other but the CC-accommodating portions of the two tapes cannot overlap or pass each other. That is, like the CC carrier tapes 242 employed in the illustrated embodiments, the embossed-type CC carrier tapes are surely fed to the tape feeding devices 202 over the guide rollers 386.

In each of the illustrated embodiments, when the CCs 150 are supplied, the first support member 208 is moved, as a general rule, in a predetermined direction at a predetermined pitch. However, the first support member 208 may be moved while the pitch is appropriately changed. In addition, while the first support member 208 is moved in only one direction as a general rule, the member 208 may be moved back in the opposite direction so that one CC supplying unit 200 which has already supplied one or more CCs 150 can supply one or more CCs 150 again. Moreover, the CC supplying units 200 may supply the CCs 150 both when the first support member 208 is moved in one direction and when the member 208 is moved back in the opposite direction. In the last case, when the first support member 208 is moved in one direction, the CC supplying units 200 supply CCs 150 to one PCB 20 in a first order; and then, when the member 208 is moved in the opposite direction, the units 200 supply CCs 150 to another PCB 20 in a second order converse to the first order.

Furthermore, in each of the illustrated embodiments, the CC mounting device 14 includes the rotary plates 60 which are individually rotatable about a common axis line and each of which is stopped at each of the CC sucking position, the CC-image taking position, and the CC mounting position. However, the CC mounting device 14 may be replaced by a different CC mounting device, such as one which includes (a) an intermittently rotatable body which is intermittently rotatable about an axis line at a first angular pitch, (b) a plurality of CC holding heads which are mounted on the rotatable body such that the CC holding heads are spaced apart from each other about the axis line at a second angular pitch equal to the first angular pitch, and (c) an intermittently rotating device which intermittently rotates the rotatable body at the first angular pitch; another one which includes (d) a rotatable table which is rotatable about an axis line and which supports a plurality of CC holding heads, and (e) a rotating device which rotates the rotatable body by any desired angle so that the CC holding heads are sequentially moved to a CC sucking position and a CC mounting position; or yet another one which includes (f) a movable body which supports at least one CC holding head and (g) a moving device which linearly moves the movable body in a direction perpendicular to the direction of movement of the first support member 208 so that the CC holding head takes the CCs 150 from the tape feeding devices 202 and mounts the CCs 150 on the PCB 20 as the circuit substrate.

In each of the illustrated embodiments, the respective CC-supply portions of the tape feeding devices 202 are arranged along a straight line and the first support member 208 is moved in a direction parallel to the straight line. However, the CC-supply portions of the tape feeding devices 202 may be arranged along a circular (i.e., full-circular) line or an arcuate (i.e., part-circular) line, a curve other than the full- or part-circular line, or any combination of one or more straight lines and one or more of those curved lines. For example, as disclosed in U.S. patent application Ser. No. 09/061,177, filed on Apr. 17, 1998, and assigned to the Assignee of the present application, the CC-supply portions of the devices 202 may be arranged along a full-circular line. In this case, the first support member 208 is replaced by a full-circular table which is rotatable about an axis line, and the second support member 212 is replaced by an annular support member which is concentric with the circular table. The tape feeding devices 202 may be attached to the entirety, or only a portion, of the full-circular table, and the tape holding devices 204 may be attached to the entirety, or only a portion, of the annular support member. Alternatively, the tape feeding devices 202 may be attached to a sectorial table such that the CC-supply portions of the devices 202 are arranged along a part-circular line, and the tape holding devices 204 may be attached to a part-annular support member which is concentric with the sectorial table. While the full-circular or sectorial table is moved, the full- or part-annular support member may be moved, or kept still.

The present invention may be embodied by combining one or more elements of each one of the illustrated embodiments with one or more elements of the other embodiments.

It is to be understood that the present invention may be embodied with other changes, improvements, and modifications that may occur to those skilled in the art without departing from the scope and spirit of the invention.

What is claimed is:

1. A method of supplying a plurality of circuit components from a plurality of circuit-component supplying units each of which includes (A) a tape holding device which holds a carrier tape which carries a plurality of circuit components at a predetermined pitch in a lengthwise direction thereof and (B) a tape feeding device which is separate from the tape holding device and which draws the carrier tape from the tape holding device, feeds the tape at the same pitch as the predetermined pitch, and supplies each of the circuit components of the tape from a component-supply portion thereof, the supplying units being arranged such that the respective component-supply portions of the tape feeding devices thereof are located along a reference line, the method comprising the steps of:

moving and stopping a group of the tape feeding devices along the reference line, independent of a group of the tape holding devices, thereby positioning each of the respective component-supply portions of the tape feeding devices at a predetermined component supplying position where at least one circuit component is supplied from said each component-supply portion, and keeping the group of tape holding devices still while the group of tape feeding devices is moved and stopped along the reference line.

2. A method of supplying a plurality of circuit components from a plurality of circuit-component supplying units each of which includes (A) a tape holding device which holds a carrier tape which carries a plurality of circuit components at a predetermined pitch in a lengthwise direction thereof and (B) a tape feeding device which is separate from the tape holding device and which draws the carrier tape from the tape holding device, feeds the tape at the same pitch as the predetermined pitch, and supplies each of the circuit components of the tape from a component-supply portion thereof, the supplying units being arranged such that the respective component-supply portions of the tape feeding devices thereof are located along a reference line, the method comprising the steps of:

repetitively moving and stopping a group of the tape feeding devices along the reference line, independent of a group of the tape holding devices, thereby positioning each of the respective component-supply portions of the tape feeding devices at a predetermined component supplying position where at least one circuit component is supplied from said each component-supply portion, and continuously moving, without stopping, the group of tape holding devices while the group of tape feeding devices is repetitively moved and stopped along the reference line.

3. A method according to claim 2, wherein the step of continuously moving the group of tape holding devices comprises continuously moving the group of tape holding devices such that each of the tape holding devices follows a corresponding one of the tape feeding devices at lowest possible accelerations without running before, or after, the corresponding tape feeding device by more than a predetermined distance.

4. A method according to claim 2, wherein the stop of continuously moving the group of tape holding devices comprises continuously moving the group of tape holding devices at a constant velocity while the group of tape feeding devices is repetitively moved and stopped along the reference line.

5. A method according to claim 2, wherein the step of continuously moving the group of tape holding devices comprises continuously moving, without stopping, the group of tape holding devices according to a velocity pattern which is more moderate than a velocity pattern according to which the group of tape feeding devices is repetitively moved and stopped along the reference line.

6. A system for supplying a plurality of circuit components, comprising:

a plurality of tape holding devices which hold a plurality of carrier tapes, respectively, each of which carries a plurality of circuit components at a predetermined pitch in a lengthwise direction thereof;

a plurality of tape feeding devices each of which includes a component-supply portion and each of which draws a corresponding one of the carrier tapes from a corresponding one of the tape holding devices, feeds said one carrier tape at a same pitch as the predetermined pitch, and supplies each of the circuit components of said one carrier tape from the component-supply portion thereof;

a first support member which supports the tape feeding devices such that the respective component-supply portions thereof are located along a reference line;

a second support member which is separate from the first support member, which is immovable, and which supports the tape holding devices such that said each tape feeding device can draw said one carrier tape from said one tape holding device; and a first-support-member moving device which moves and stops the first support member along the reference line, independent of the second support member, thereby positioning each of the respective component-supply portions of the tape feeding devices supported by the first support member, at a predetermined component supplying position where at least one circuit component is supplied from said each component-supply portion.

7. A system according to claim 6, wherein the first and second support members support, in a state in which the first and second support members take a reference position relative to each other, the tape feeding devices and the tape holding devices, respectively, such that a widthwise center line of each of the tape feeding devices and a widthwise center line of a corresponding one of the tape holding devices are positioned on a single plane.

8. A system for supplying a plurality of circuit components, comprising:

a plurality of tape holding devices which hold a plurality of carrier tapes, respectively, each of which carries a plurality of circuit components at a predetermined pitch in a lengthwise direction thereof;

a plurality of tape feeding devices each of which includes a component-supply portion and each of which draws a corresponding one of the carrier tapes from a corresponding one of the tape holding devices, feeds said one carrier tape at a same pitch as the predetermined pitch, and supplies each of the circuit components of said one carrier tape from the component-supply portion thereof;

a first support member which supports the tape feeding devices such that the respective component-supply portions thereof are located along a reference line;

a second support member which is separate from the first support member, and which supports the tape holding devices such that said each tape feeding device can draw said one carrier tape from said one tape holding device;

a first-support-member moving device which repetitively moves and stops the first support member along the reference line, independent of the second support member, thereby positioning each of the respective component-supply portions of the tape feeding devices supported by the first support member, at a predetermined component supplying position where at least one circuit component is supplied from said each component-supply portion; and a second-support-member moving device which continuously moves, without stopping, the second support member in a direction parallel to the reference line, while the first-support-member moving device repetitively moves and stops the first support member along the reference line.

9. A system according to claim 8, further comprising a control device which has control data indicative of timings, velocities, and accelerations according to which the control device controls the first-support-member moving device to repetitively move and stop the first support member along the reference line, and calculates, based on the control data, velocities and accelerations according to which the control device controls the second-support-member moving device to continuously move the second support member such that each of the tape holding devices follows a corresponding one of the tape feeding devices at lowest possible accelerations without running before, or after, the corresponding tape feeding device by more than a predetermined distance.

10. A system according to claim 8, further comprising a control device which controls the second-support-member moving device to continuously move the second support member at a constant velocity, while the control device controls the first-support-member moving device to repetitively move and stop the first support member along the reference line.

11. A system according to claim 8, further comprising a control device which controls the second-support-member moving device to continuously move, without stopping, the second support member according to a velocity pattern which is more moderate than a velocity pattern according to which the control device controls the first-support-member moving device to repetitively move and stop the first support member along the reference line.

12. A system for supplying a plurality of circuit components, comprising:

a plurality of tape holding devices which hold a plurality of carrier tapes, respectively, each of which carries a plurality of circuit components at a predetermined pitch in a lengthwise direction thereof;

a plurality of tape feeding devices each of which includes a component-supply portion and each of which draws a corresponding one of the carrier tapes from a corresponding one of the tape holding devices, feeds said one carrier tape at a same pitch as the predetermined pitch, and supplies each of the circuit components of said one carrier tape from the component-supply portion thereof;

a first support member which supports the tape feeding devices such that the respective component-supply portions thereof are located along a reference line;

a second support member which is separate from the first support member and which supports the tape holding devices such that said each tape feeding device can draw said one carrier tape from said one tape holding device; and a first-support-member moving device which repetitively moves and stops the first support member along the reference line, independent, of the second support member, thereby positioning each of the respective component-supply portions of the tape feeding devices supported by the first support member, at a predetermined component supplying position where at least one circuit component is supplied from said each component-supply portion, wherein the carrier tapes include respective transferring portions which transfer from the corresponding tape holding devices supported by the second support member, to the corresponding tape feeding devices supported by the first support member, and wherein the system further comprises a tape-curve keeping device which keeps the transferring portions curved in a direction perpendicular to the reference line.

13. A system according to claim 12, wherein the tape-curve keeping device comprises at least one of (a) a tape hold-down member which holds down the transferring portions of the carrier tapes, thereby curving the transferring portions in a downward direction; and (b) a tape support member which supports the transferring portions curved in a downward direction, thereby preventing the transferring portions from being excessively slacked in the downward direction.

14. A system according to claim 13, wherein the tape-curve keeping device comprises the tape hold-down member and the tape support member, wherein the reference line comprises a straight line, and wherein each of the tape hold-down member and the tape support member comprises an elongate member which extends substantially horizontally along a vertical plane parallel to the straight line.

15. A system according to claim 14, wherein the tape support member comprises a member having a downwards convex, part-cylindrical upper surface, and the tape hold-down member comprises a member having a downwards convex, part-cylindrical lower surface.

16. A system according to claim 13, wherein the tape-curve keeping device comprises the tape hold-down member, wherein the tape holding devices have respective tape outlets and the tape feeding devices have respective tape inlets, and wherein the system further comprises an elevating and lowering device which elevates and lowers the tape hold-down member to an upper position thereof higher than respective straight lines which connect between the respective tape outlets and the respective tape inlets, and to a lower position thereof lower than the straight lines.

17. A system according to claim 16, wherein the elevating and lowering device comprises:

a pair of elevator members each of which supports a lower portion of a corresponding one of opposite end portions of the tape hold-down member and allows said one end portion to be moved upward relative thereto; and a synchronism elevating and lowering device which elevates and lowers the two elevator members in synchronism with each other.

18. A system according to claim 17, wherein the synchronism elevating and lowering device comprises:

a pair of strings which have respective one end portions which are connected to the two elevator members, respectively;

a pair of first directing rotatable members on which the two strings are wound such that the two strings which run in a vertical direction are directed to opposite horizontal directions, respectively;

a second directing rotatable member on which one of the two strings which runs in one of the opposite horizontal directions is wound such that said one string running in said one horizontal direction is directed to the other horizontal direction and accordingly the respective other end portions of the two strings run in said other horizontal direction; and a drive device which moves said other end portions of the two strings, together with each other, in each of the opposite horizontal directions.

19. A system according to claim 13, wherein the tape-curve keeping device comprises the tape hold-down member and the tape support member, and wherein the tape-curve keeping device further comprises a plurality of tape-hold-down-member support members which are provided on the tape support member and which support a plurality of portions of the tape hold-down member, respectively, thereby providing a space between the tape hold-down member and the tape support member.

20. A system according to claim 13, wherein the tape-curve keeping device comprises the tape support member, and wherein the system further comprises a tape-support-member moving device which moves, in a direction which is parallel to the reference line and is same as a direction of movement of the first support member relative to the second support member, the tape support member by a distance smaller than a distance of movement of the first support member relative to the second support member.

21. A system according to claim 20, wherein the tape-support-member moving device comprises a plurality of first hanging members which hang the tape support member from the first support member and allow the tape support member to be moved relative to the first support member in the direction parallel to the reference line, and a plurality of second hanging members which hang the tape support member from the second support member and allow the tape support member to be moved relative to the second support member in the direction parallel to the reference line.

22. A system according to claim 21, wherein the plurality of first hanging members comprise two first hanging members which hang the tape support member from the first support member such that in a state in which respective middle portions of the first and second support members in the direction parallel to the reference line are opposed to each other, the two first hanging members extend downward from the first support member in respective oblique directions away from the middle portions, and the plurality of second hanging members comprise two second hanging members which hang the tape support member from the second support member such that in said state the two second hanging members extend downward from the second support member in respective oblique directions toward the middle portions.

23. A system according to claim 12, wherein the tape holding devices have respective tape outlets and the tape feeding devices have respective tape inlets level with the tape outlets.

24. A system for supplying a plurality of circuit components, comprising:

a plurality of tape holding devices which hold a plurality of carrier tapes, respectively each of which carries a plurality of circuit components at a predetermined pitch in a lengthwise direction thereof;

a plurality of tape feeding devices each of which includes a component-supply portion and each of which draws a corresponding one of the carrier tapes from a corresponding one of the tape holding devices, feeds said one carrier tape at a same pitch as the predetermined pitch, and supplies each of the circuit components of said one carrier tape from the component-supply portion thereof;

a first support member which supports the tape feeding devices such that the respective component-supply portions thereof are located along a reference line;

a second support member which is separate from the first support member and which supports the tape holding devices such that said each tape feeding device can draw said one carrier tape from said one tape holding device;

a first-support-member moving device repetitively which moves and stops the first support member along the reference line, independent of the second support member, thereby positioning each of the respective component-supply portions of the tape feeding devices supported by the first support member, at a predetermined component supplying position where at least one circuit component is supplied from said each component-supply portion; and at least one tape control member which is provided in respective tape feeding paths from the tape holding devices to the corresponding tape feeding devices, which is immovable relative to the tape holding devices while the system supplies the circuit components, and which controls a movement of each of the carrier tapes in a direction parallel to the reference line when the first support member in moved relative to the second support member.

25. A system according to claim 24, wherein the tape holding devices include respective tape holding members which hold the carrier tapes, respectively, and wherein said at least one tape control member is located above the tape holding members and defines respective tape outlets of the tape holding devices.

26. A system according to claim 24, wherein said at least one tape control member comprises at least one guide roller which is rotatable about an axis line parallel to the reference line.

27. A system for supplying a plurality of circuit components, comprising:

a plurality of tape holding devices which hold a plurality of carrier tapes, respectively, each of which carries a plurality of circuit components at a predetermined pitch in a lengthwise direction thereof;

a plurality of tape feeding devices each of which includes a component-supply portion and each of which draws a corresponding one of the carrier tapes from a corresponding one of the tape holding devices, feeds said one carrier tape at a same pitch as the predetermined pitch, and supplies each of the circuit components of said one carrier tape from the component-supply portion thereof;

a first support member which supports the tape feeding devices such that the respective component-supply portions thereof are located along a reference line;

a second support member which is separate from the first support member, and which supports the tape holding devices such that said each tape feeding device can draw said one carrier tape from said one tape holding device; and a first-support-member moving device which repetitively moves and stops the first support member along the reference line, independent of the second support member, thereby positioning each of the respective component-supply portions of the tape feeding devices supported by the first support member, at a predetermined component supplying position where at least one circuit component is supplied from said each component-supply portion, wherein each of the tape holding devices comprises a first twisting device which twists the carrier tape by about 90 degrees so that a direction of width of the tape is substantially perpendicular to the reference line, and each of the tape feeding devices comprises a second twisting device which twists the twisted tape by about 90 degrees so that the direction of width of the tape is substantially parallel to the reference line.

28. A system for supplying a plurality of circuit components, comprising:

a plurality of tape holding devices which hold a plurality of carrier tapes, respectively, each of which carries a plurality of circuit components at a predetermined pitch in a lengthwise direction thereof;

a plurality of true feeding devices each of which includes a component-supply portion and each of which draws a corresponding one of the carrier tapes from a corresponding one of the tape holding devices, feeds said one carrier tape at a same pitch as the predetermined pitch, and supplies each of the circuit components of said one carrier te from the component-supply portion thereof;

a first support member which supports the tape feeding devices such that the respective component-supply portions thereof are located along a reference line;

a second support member which is separate from the first support member and which supports the tape holding devices such that said each tape feeding device can draw said one carrier tape from said one tape holding device; and a first-support-member moving device which repetitively moves and stops the first support member along the reference line, independent of the second support member, thereby positioning each of the respective component-supply portions of the taps feeding devices supported by the first support member, at a predetermined component supplying position where at least one circuit component is supplied from said each component-supply portion; and a plurality of connecting devices each of which connects, when the first support member is not moved, a corresponding one of the tape feeding devices and a corresponding one of the tape holding devices, to each other, and disconnects, when the first support member is moved, said one tape feeding device and said one tape holding device from each other.

* * * * *